US011056394B2

(12) United States Patent
Liaw

(10) Patent No.: US 11,056,394 B2
(45) Date of Patent: Jul. 6, 2021

(54) METHODS FOR FABRICATING FINFETS HAVING DIFFERENT FIN NUMBERS AND CORRESPONDING FINFETS THEREOF

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/395,552

(22) Filed: Apr. 26, 2019

(65) Prior Publication Data
US 2020/0006149 A1 Jan. 2, 2020

Related U.S. Application Data

(60) Provisional application No. 62/691,416, filed on Jun. 28, 2018.

(51) Int. Cl.
H01L 21/8234 (2006.01)
H01L 29/66 (2006.01)
H01L 21/306 (2006.01)
H01L 27/088 (2006.01)
H01L 21/311 (2006.01)
H01L 21/308 (2006.01)
H01L 27/092 (2006.01)
H01L 21/8238 (2006.01)

(52) U.S. Cl.
CPC .... *H01L 21/823431* (2013.01); *H01L 21/308* (2013.01); *H01L 21/30604* (2013.01); *H01L 21/31111* (2013.01); *H01L 21/823437* (2013.01); *H01L 21/823468* (2013.01); *H01L 21/823481* (2013.01); *H01L 27/0886* (2013.01); *H01L 29/66545* (2013.01); *H01L 21/823821* (2013.01); *H01L 21/823828* (2013.01); *H01L 21/823864* (2013.01); *H01L 21/823878* (2013.01); *H01L 27/0924* (2013.01)

(58) Field of Classification Search
None
See application file for complete search history.

(56) References Cited

U.S. PATENT DOCUMENTS 8,258,572 B2 9/2012 Liaw
8,809,963 B2 8/2014 Liaw
(Continued)

*Primary Examiner* — Long Pham
(74) *Attorney, Agent, or Firm* — Haynes and Boone, LLP

(57) ABSTRACT

Fin patterning methods disclosed herein achieve advantages of fin cut first techniques and fin cut last techniques while providing different numbers of fins in different IC regions. An exemplary method implements a spacer lithography technique that forms a fin pattern that includes a first fin line and a second fin line in a substrate. The first fin line and the second fin line have a first spacing in a first region corresponding with a single-fin FinFET and a second spacing in a second region corresponding with a multi-fin FinFET. The first spacing is greater than the second spacing, relaxing process margins during a fin cut last process, which partially removes a portion of the second line in the second region to form a dummy fin tip in the second region. Spacing between the dummy fin tip and the first fin in the second region is greater than the second spacing.

20 Claims, 36 Drawing Sheets

(56) References Cited

U.S. PATENT DOCUMENTS

| | | | |
|---|---|---|---|
| 8,847,361 | B2 | 9/2014 | Liaw et al. |
| 9,362,290 | B2 | 6/2016 | Liaw et al. |
| 9,607,985 | B1* | 3/2017 | Tseng .............. H01L 21/823431 |
| 9,613,953 | B2 | 4/2017 | Liaw |
| 2015/0206759 | A1* | 7/2015 | Tsao .................... H01L 29/0657 |
| | | | 257/506 |
| 2017/0330755 | A1* | 11/2017 | Bergendahl ....... H01L 29/66795 |
| 2019/0305112 | A1* | 10/2019 | Subramanian ........ H01L 21/762 |
| 2019/0378763 | A1* | 12/2019 | Wang ............. H01L 21/823431 |

* cited by examiner

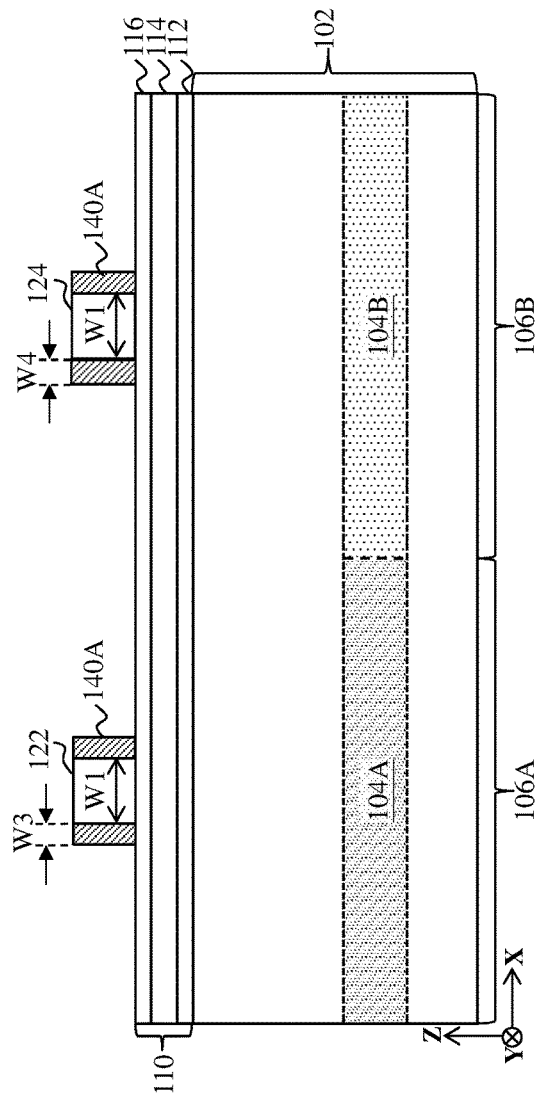
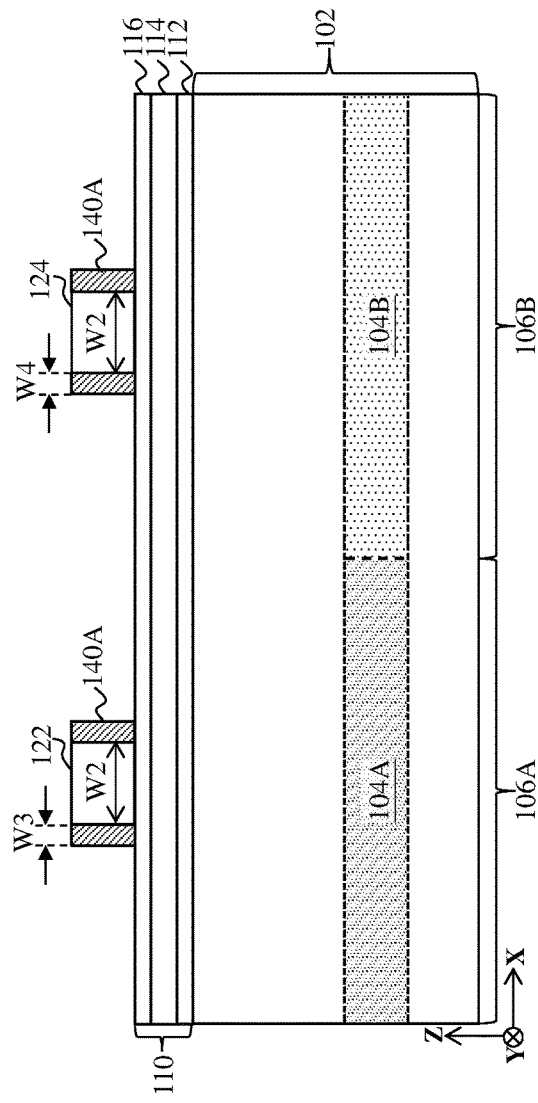
FIG. 5B
FIG. 5C

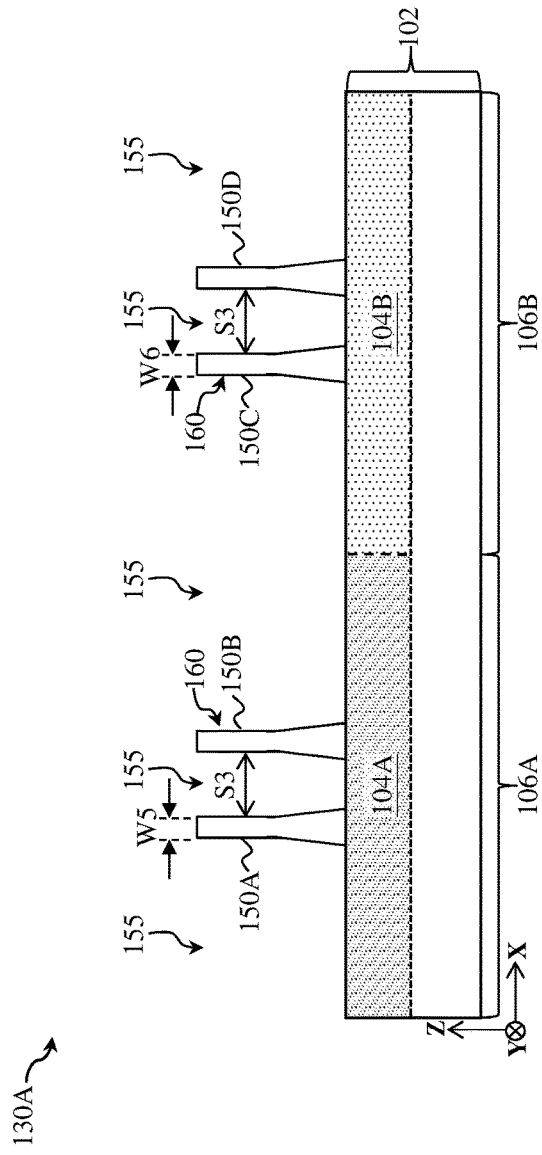
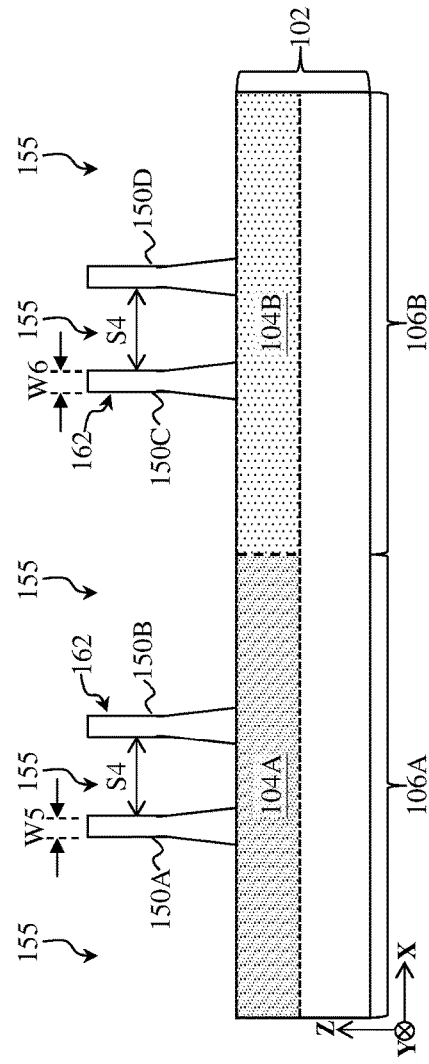
FIG. 8B
FIG. 8C

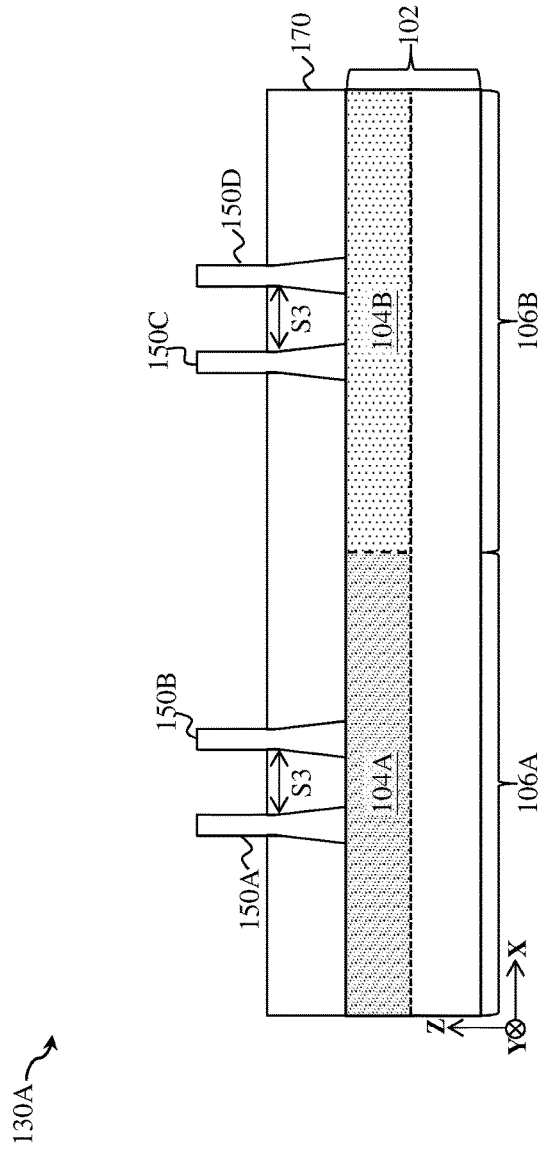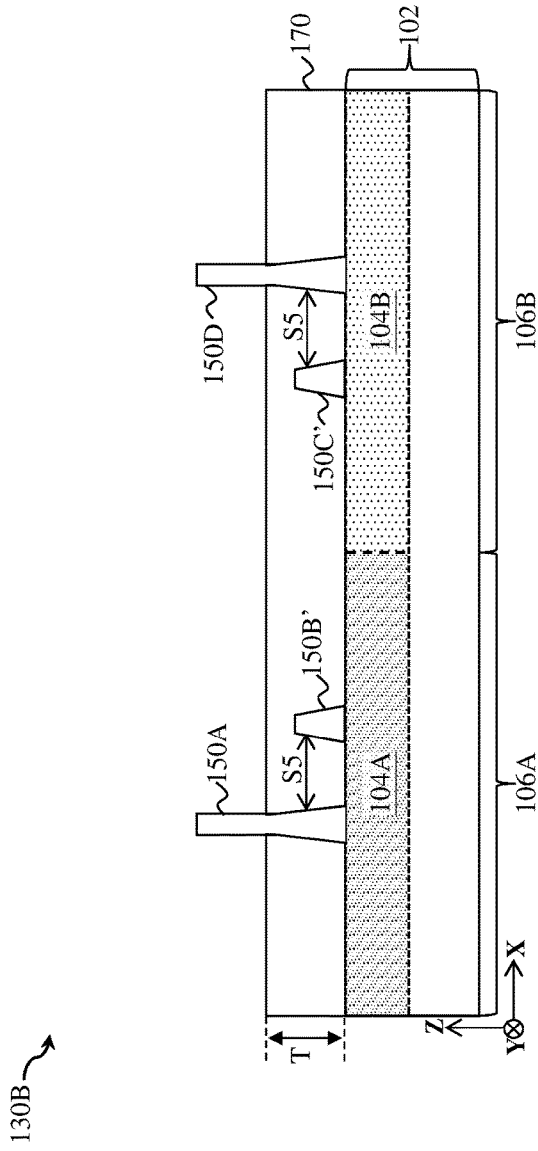

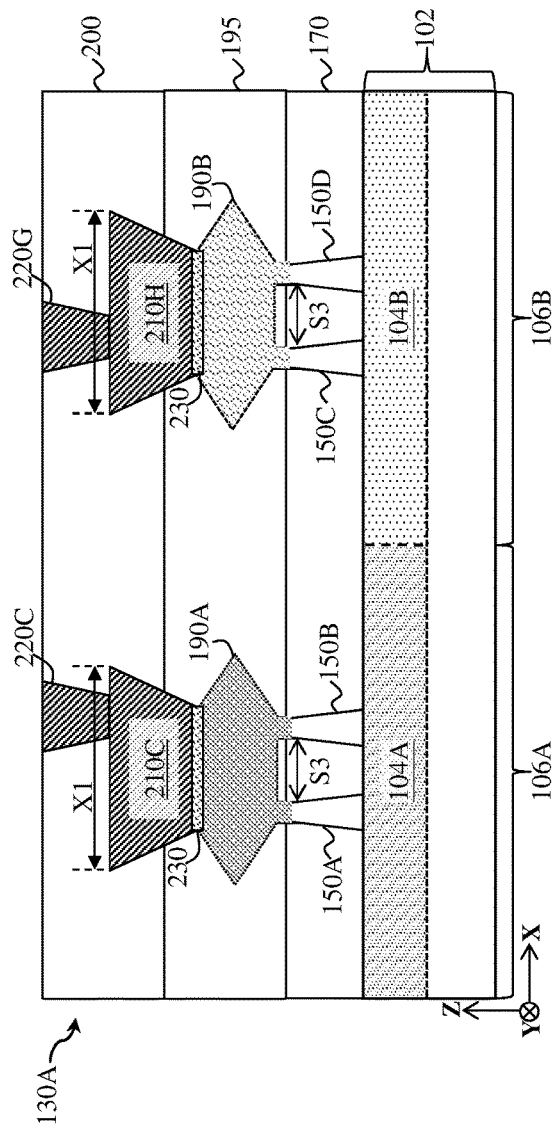
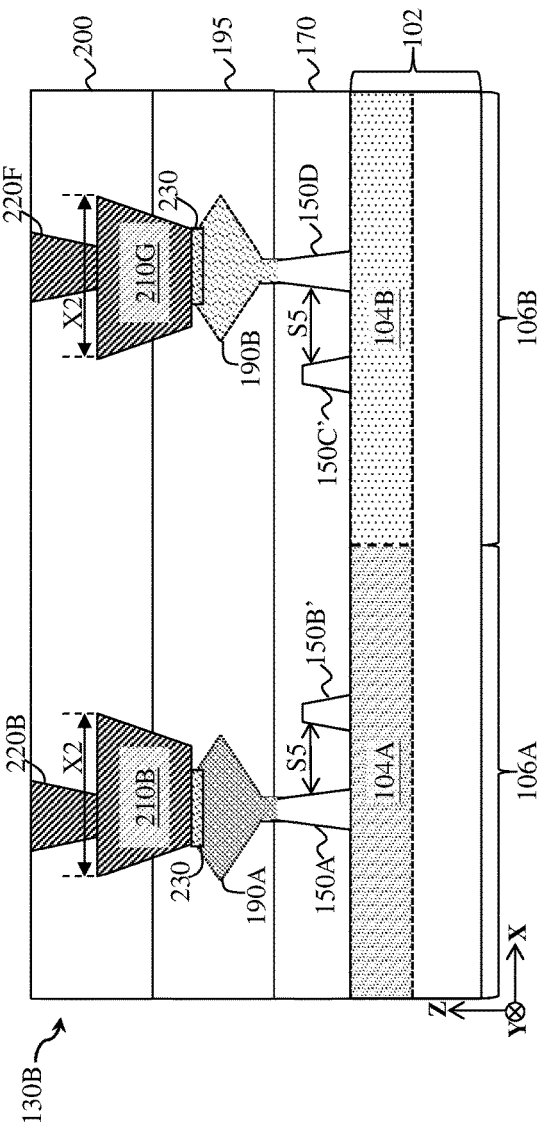
FIG. 12D
FIG. 12E

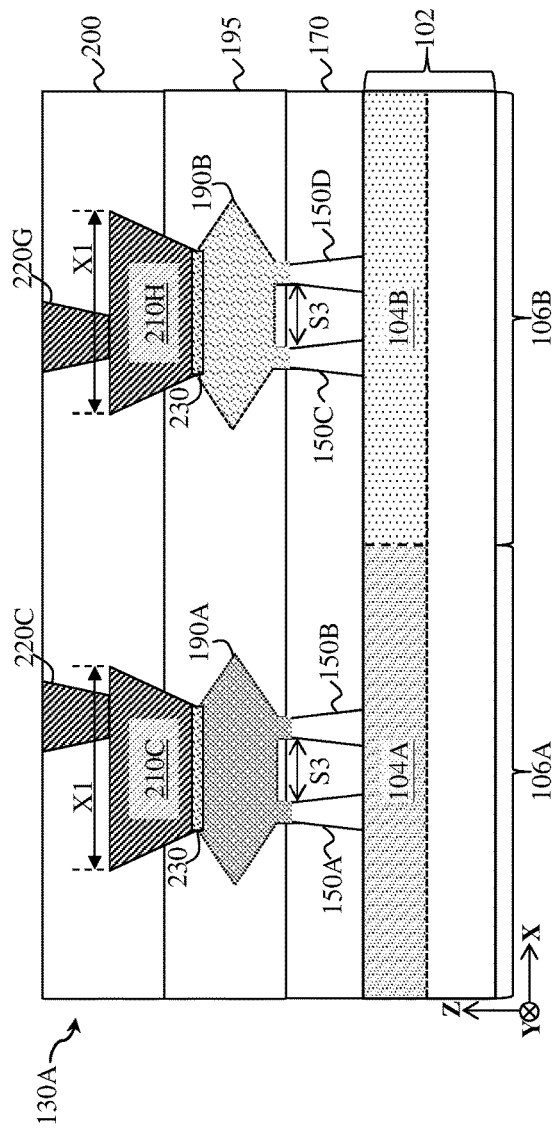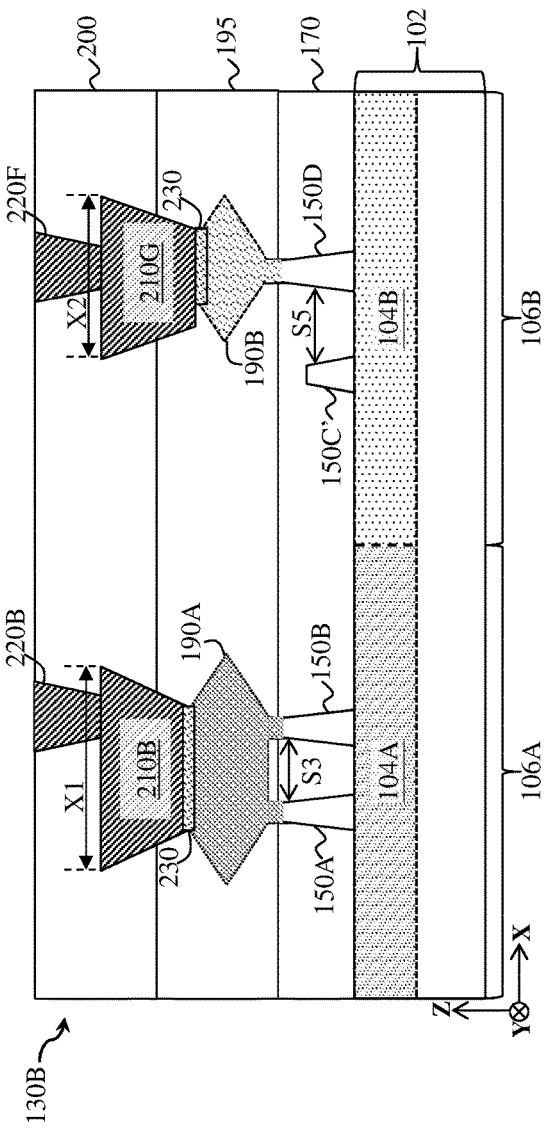
FIG. 15D
FIG. 15E

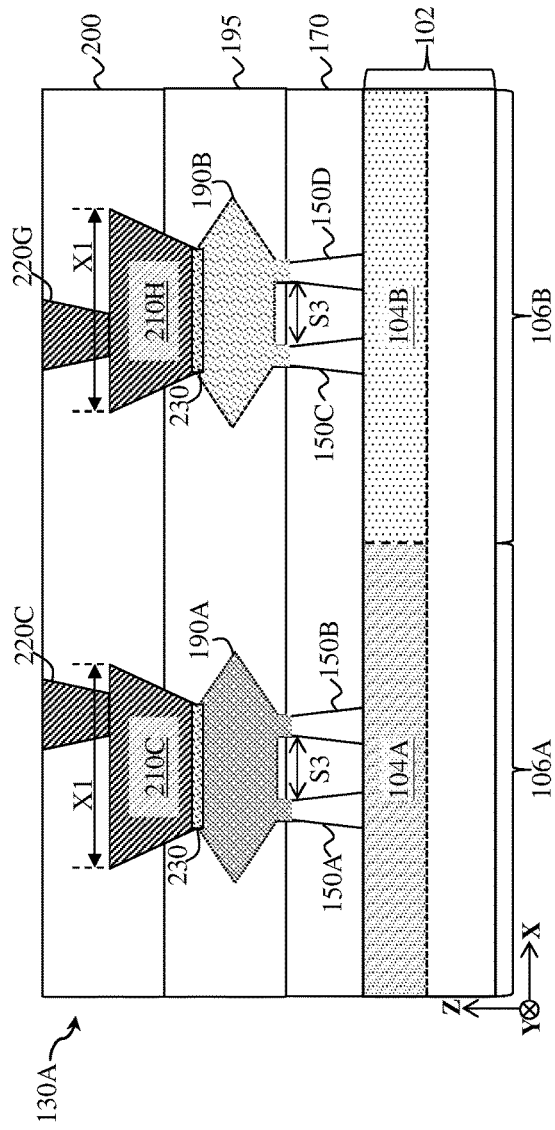
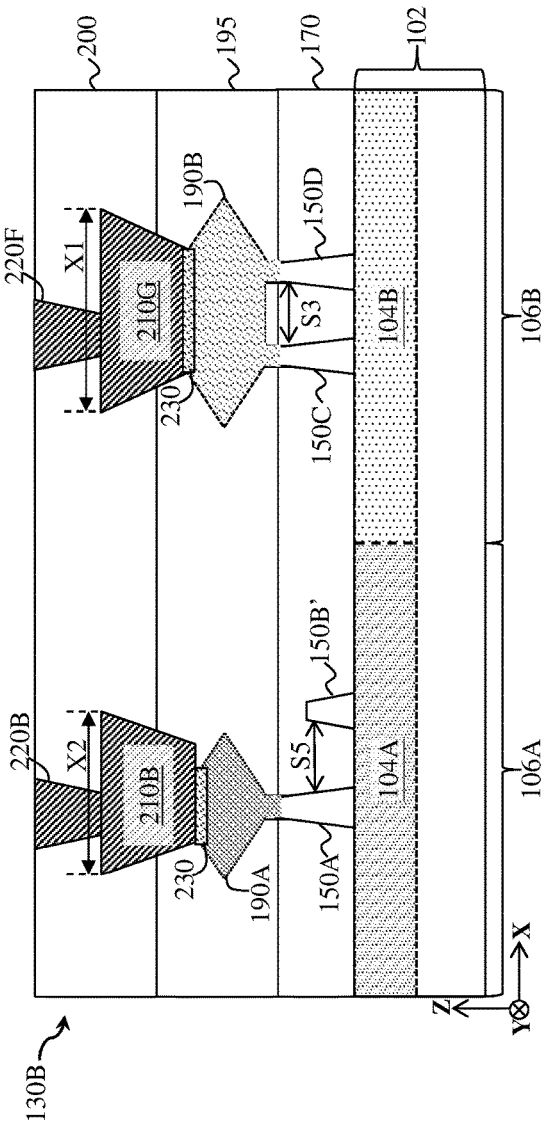
FIG. 16D
FIG. 16E

METHODS FOR FABRICATING FINFETS HAVING DIFFERENT FIN NUMBERS AND CORRESPONDING FINFETS THEREOF

This is a non-provisional application of and claims benefit of U.S. Provisional Patent Application Ser. No. 62/691,416, filed Jun. 28, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, ICs often implement fin-like field effect transistors (FinFETs) having different numbers of fins to optimize performance, such as a first FinFET device having an odd number of fins (for example, one) adjacent to a second FinFET device having an even number of fins (for example, two). Multiple patterning processes implemented to meet shrinking fin widths and/or fin pitches required for advanced IC technology nodes typically fabricate an even number of fin lines, such that a fin cutting process is needed to provide an odd number of fin lines in a region of the IC corresponding with the first FinFET. The shrinking fin widths and/or fin pitches has placed constraints on the fin cutting process and significantly limited fin patterning process margins. Although existing fin patterning techniques have been generally adequate for achieving different numbers of fins in different regions of an IC, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F are fragmentary diagrammatic views of an IC device at various fabrication stages of a method, such as the method of FIG. 1, according to various aspects of the present disclosure.

FIGS. 15A-15F are fragmentary diagrammatic views of yet another IC device fabricated using the method of FIG. 1 according to various aspects of the present disclosure.

FIGS. 16A-16F are fragmentary diagrammatic views of yet another IC device fabricated using the method of FIG. 1 according to various aspects of the present disclosure.

DETAILED DESCRIPTION

Figure 1:
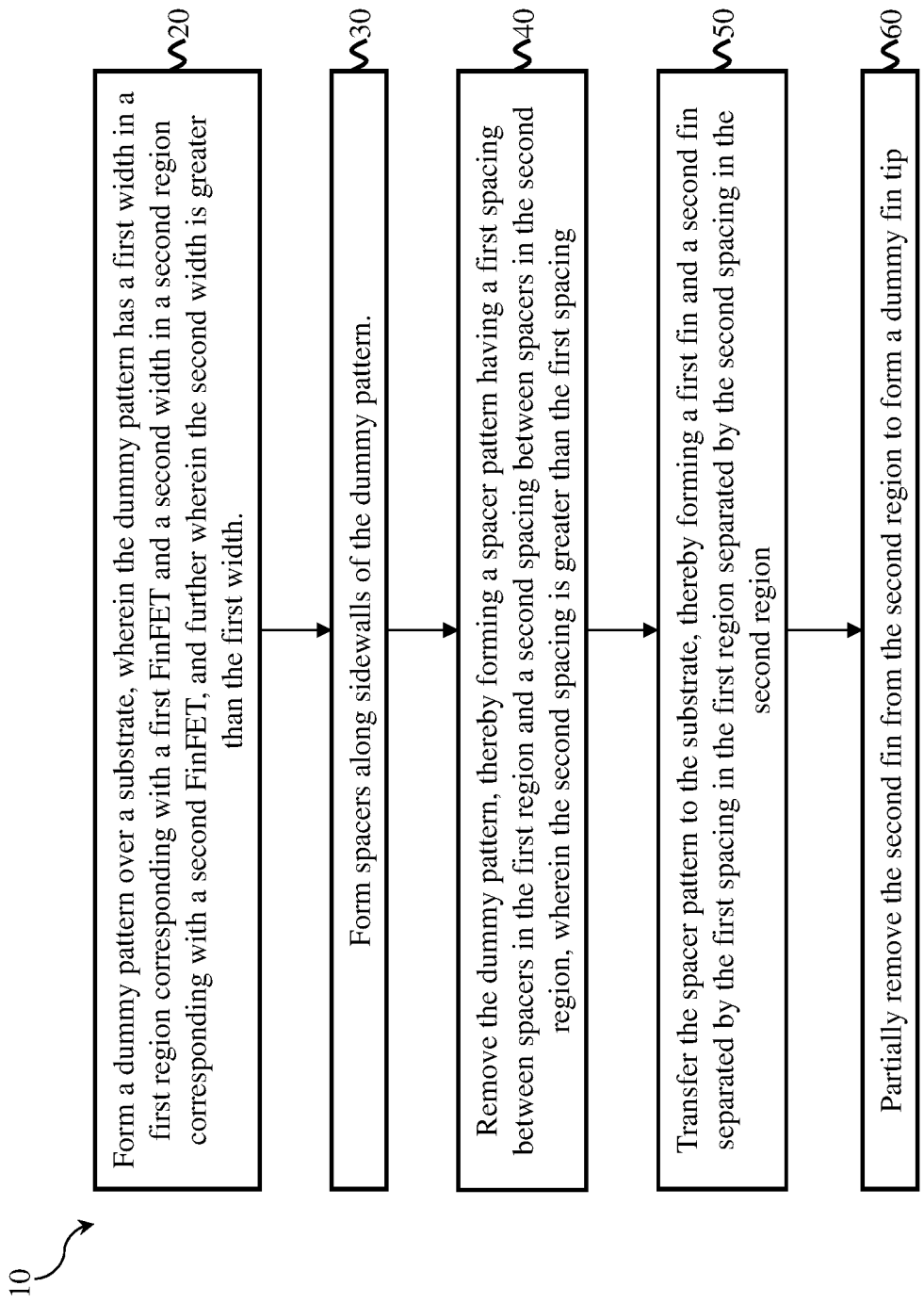
FIG. 1 is a flow chart of a method for fabricating an IC device according to various aspects of the present disclosure.

The present disclosure relates generally to integrated circuit (IC) devices, and more particularly, to fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, FinFETs (also referred to as non-planar transistors) have become a popular and promising candidate for high performance and low leakage applications. IC s often implement FinFETs having different numbers of fins to optimize performance for different applications. For example, single-fin FinFETs typically exhibit low leakage current and low power consumption, yet operate at lower speeds, whereas multi-fin FinFETs can operate at high speeds, yet often exhibit higher leakage current and higher power consumption than single-fin FinFETs. Accordingly, to optimize IC performance, ICs often implement multi-fin FinFETs in high speed circuits and/or applications and single-fin FinFETs for low speed and/or non-speed critical circuits and/or applications. Such configurations can allow a system-on-chip (SOC), which is a device that integrates various functions on a single chip, to provide high speed logic operations with overall lower power consumption As FinFET technologies progress towards smaller IC technology nodes (for example, 22 nm, 16 nm, 10 nm, 7 nm, and below), fins are formed by a multiple patterning process, which combines lithography processes and self-aligned processes to create fin patterns that have, for example, pitches or spacings smaller than what is otherwise obtainable using a single, direct lithography process. Spacer lithography (patterning) is a popular multiple patterning process that can achieve narrower fin widths and smaller fin pitches desired for advanced IC technology nodes. Spacer lithography forms a fin etching mask that is used for removing portions of a substrate (or patterning layer) to form fins in the substrate (or in the patterning layer, which is subsequently used to pattern the substrate). An example spacer lithography process for forming the fin etching mask includes forming a patterned sacrificial layer (which includes sacrificial features having widths that correspond with desired spacings between fins) over the substrate using a lithography process, forming a spacer layer over the patterned sacrificial layer and the substrate, etching the spacer layer to form spacers along sidewalls of each sacrificial feature (for example, the spacer layer is removed from top surfaces of the sacrificial features and a portion of a top surface of the substrate (or patterning layer)), and removing the patterned sacrificial layer, leaving spacers having spacings therebetween. The spacings may be substantially equal to the widths of the sacrificial features, such that the spacings between the spacers correspond with the desired spacings between fins. The spacers form the fin etching mask, which includes openings that expose a portion of the substrate (or patterning layer).

Since a pair of spacers is formed along sidewalls of each sacrificial feature, spacer lithography typically generates pairs of fin lines (or even numbers of fin lines), where each pair of fin lines corresponds with a respective pair of spacers. A fin cut process (including lithography processes and etching processes) is thus needed to provide single fin lines (or odd numbers of fin lines) in desired IC regions. The fin cut process removes unwanted fin lines or unwanted portions of the fin lines (often referred to as dummy fins or dummy portions of the fin lines) to achieve different numbers of fin lines in different IC regions. A fin cut first technique removes spacers that correspond with the unwanted fin lines from the fin etching mask before the fin etching mask is used for etching the substrate. In contrast, a fin cut last technique removes the unwanted fin lines after the fins have been formed in the substrate using the fin cut mask. Tighter fin pitches in advanced IC technology nodes have led to tighter cut lithography overlay margins to ensure that unwanted fin lines are completely removed without damaging wanted fin lines. Though the fin cut first technique provides larger cut lithography overlay margins, the fin cut last technique provides a uniform environment during the fin etch (for example, a uniform density) that minimizes etching loading effects, which minimizes bending of the wanted fin lines and achieves more vertical fin line profiles.

The present disclosure thus proposes fin patterning methods that achieve advantages of both the fin cut first technique, such as increased cut lithography overlay margins, and the fin cut last technique, such as fins that exhibit more vertical fin profiles and minimum bending. The proposed fin patterning methods achieve these advantages while providing different numbers of fins in different IC regions (more particularly, even numbers of fins and odd numbers of fins), such that standard cells for SoCs can be fabricated with FinFETs designed for both high speed and/or low power consumption applications. For example, an IC device may include a single-fin FinFET adjacent to a two-fin FinFET, where the single-fin FinFET is configured for low power consumption and the two-fin FinFET is configured for high speed operation. In some implementations, the single-fin FinFET has an operating frequency that is less than or equal to about 1 GHz, and the two-fin FinFET has an operating frequency that is greater than or equal to about 2 GHz. The fins for such IC device are formed by a spacer lithography technique configured to form a fin pattern that includes a first fin line and a second fin line in a substrate, where the first fin line and the second fin line have a first spacing in a first region corresponding with the single-fin FinFET and a second spacing in a second region corresponding with the two-fin FinFET. The first spacing is greater than the second spacing, enabling larger process margins (for example, larger cut lithography overlay windows and improved critical dimension uniformity control during etching) during a fin cut last process that is used to remove a portion of the second fin line in the second region. The fin cut last process partially removes the portion of the second in line in the second region, such that a dummy fin tip remains in the second region. A spacing between the dummy fin tip and the first fin in the second region is greater than the second spacing between the first fin and the second fin in the first region. The fin cut last process allows for a dummy portion of the second fin line to be formed adjacent to the first line in the first region, which creates a denser fin environment in the first region during formation of the fin pattern in the substrate. The denser fin environment minimizes etch loading effects, providing the first fin line in the first region with a more vertical fin profile than would be achieved with fin cut first techniques. Different embodiments may have different advantages, and no particular advantage is necessarily required of any embodiment.

FIG. 1 is a flow chart of a method 10 for fabricating an IC device according to various aspects of the present disclosure. At block 20, method 10 includes forming a dummy pattern over a substrate. The dummy pattern has a first width in a first region corresponding with a first FinFET device and a second width in a second region corresponding with a second FinFET device. The second width being greater than the first width. At block 30, method 10 proceeds with forming spacers along sidewalls of the dummy pattern. At block 40, method 10 proceeds with removing the dummy pattern, thereby forming a spacer pattern having a first spacing between spacers in the first region and a second spacing between spacers in the second region, wherein the second spacing is greater than the first spacing. Method 10 continues at block 50 with transferring the spacer pattern to the substrate, thereby forming a first fin and a second fin separated by the first spacing in the first region and separated by the second spacing in the second region. At block 60, method 10 proceeds with partially removing the second fin from the second region to form a dummy fin tip. Method 10 can continue to fabricate additional features of the IC device. Additional steps can be provided before, during, and after method 10, and some of the steps described can be moved, replaced, or eliminated for additional embodiments of method 10.

FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F are fragmentary diagrammatic views of an IC device 100, in portion or entirety, at various fabrication stages of a method, such as method 10 of FIG. 1, according to various aspects of the present disclosure. In particular, FIGS. 2A-12A are simplified schematic top views of IC device 100 (for example, in an x-y plane); FIGS. 2B-12B are diagrammatic cross-sectional views of IC device 100 along line B-B respectively of FIGS. 2A-12A (for example, in an x-z plane); FIGS. 2C-12C are diagrammatic cross-sectional views of IC device 100 along line C-C respectively of FIGS. 2A-12A (for example, in the x-z plane); FIGS. 11D-12D are diagrammatic cross-sectional views of IC device 100 along line D-D respectively of FIGS. 11A-12A (for example, in the x-z plane); FIGS. 11E-12E are diagrammatic cross-sectional views of IC device 100 along line E-E respectively of FIGS. 11A-12A (for example, in the x-z plane); and FIGS. 11F-12F are diagrammatic cross-sectional views of IC device 100 along line F-F respectively of FIGS. 11A-12A (for example, in the x-z plane). IC device 100 can be included in a microprocessor, a memory cell, and/or other IC device. In some implementations, IC device 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, IC device 100 is a portion of a standard cell that includes FinFETs configured for both high speed and/or low power consumption applications. FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F have been simplified for the sake of clarity to better understand the inventive concepts of the present disclosure. Additional features can be added in IC device 100, and some of the features described below can be replaced, modified, or eliminated in other embodiments of IC device 100.

Figure 2A:
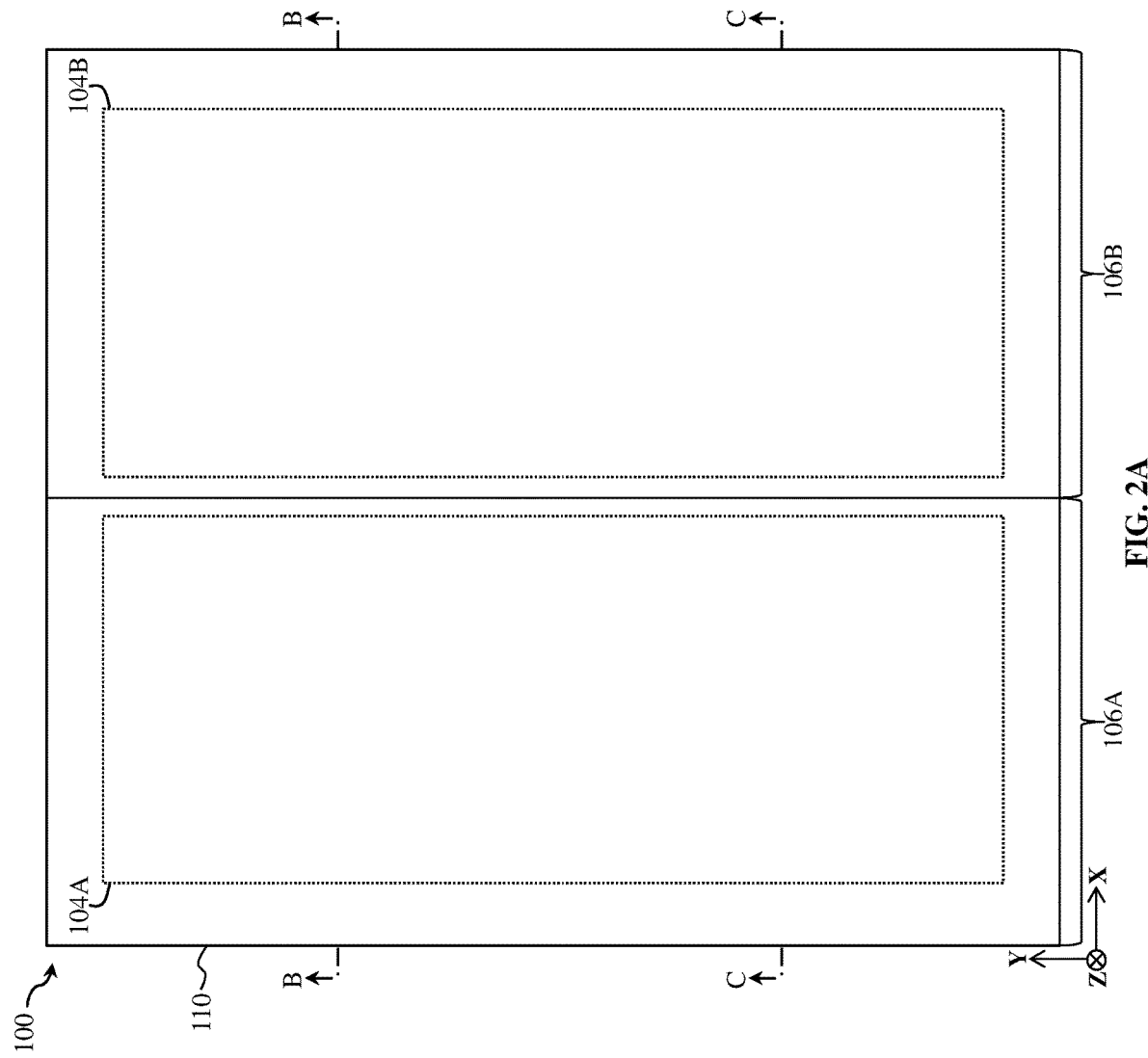
Figure 2B:
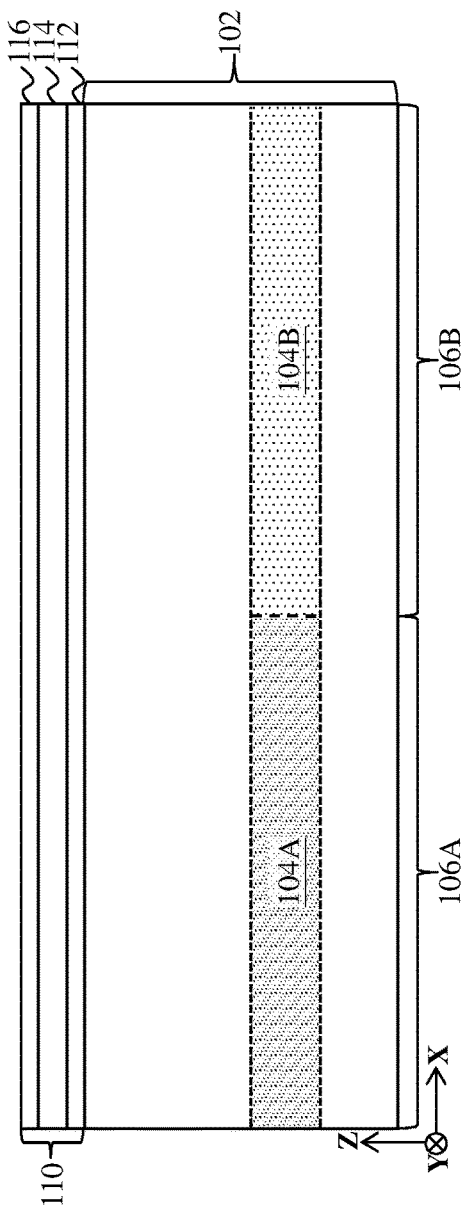
Figure 2C:
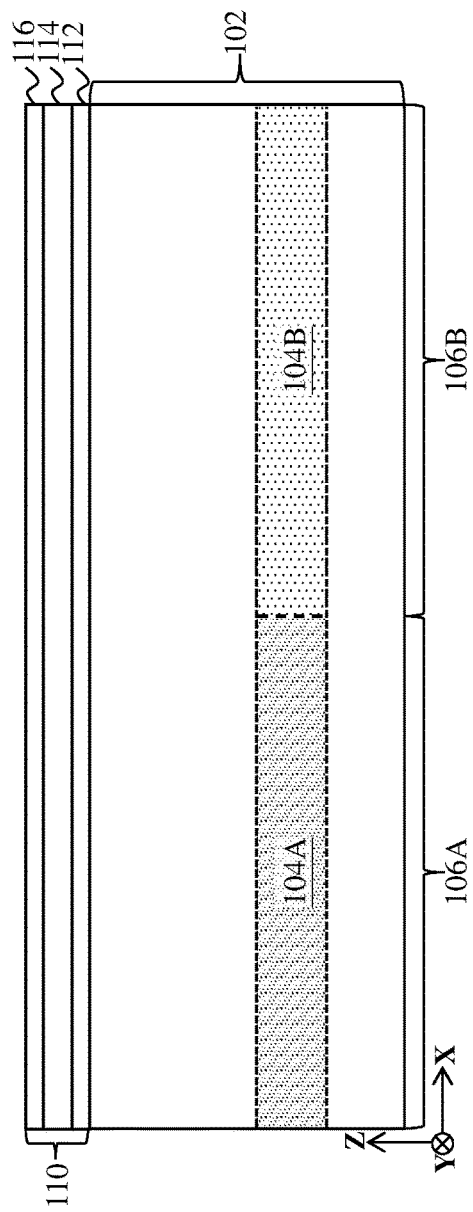

Turning to FIGS. 2A-2C, IC device 100 includes a substrate (wafer) 102. In the depicted embodiment, substrate 102 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 102 includes various doped regions, such as a doped region 104A and a doped region 104B, configured according to design requirements of IC device 100. In some implementations, substrate 102 includes p-type doped regions (for example, p-type wells) doped with p-type dopants, such as boron (for example, $BF_2$), indium, other p-type dopant, or combinations thereof. In some implementations, substrate 102 includes n-type doped regions (for example, n-type wells) doped with n-type dopants, such as phosphorus, arsenic, other n-type dopant, or combinations thereof. In some implementations, substrate 102 includes doped regions formed with a combination of p-type dopants and n-type dopants. In the depicted embodiment, doped region 104A is configured for at least one p-type FinFET to be formed in a p-type FinFET region 106A and doped region 104B of IC device 100 is configured for at least one n-type FinFET to be formed in an n-type FinFET region 106B of IC device 100. For example, in the depicted embodiment, doped region 104A is an n-type well and doped region 104B is a p-type well. The various doped regions can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions.

A patterning layer 110 is formed over substrate 102. Patterning layer 110 includes a material that is different than a material of substrate 102 to achieve etching selectivity during a fin etching process, such that substrate 102 can be selectively etched with minimal (or no) etching of patterning layer 110. In the depicted embodiment, patterning layer 110 includes multiple layers to achieve processing flexibility, such as a pad layer 112, a first mask layer 114, and a second mask layer 116, where pad layer 112 is disposed on substrate 102, first mask layer 114 is disposed on pad layer 112, and second mask layer 116 is disposed on first mask layer 114. In some implementations, pad layer 112 includes silicon and oxygen (for example, silicon oxide), first mask layer 114 includes silicon and nitrogen (for example, silicon nitride and/or silicon oxynitride), and second mask layer 116 includes silicon and oxygen (for example, silicon oxide). In some implementations, pad layer 112 and/or second mask layer 116 are silicon oxide layers formed by thermal oxidation and/or other suitable process, and first mask layer 114 is a silicon nitride layer formed by chemical vapor deposition (CVD), low pressure CVD (LPCVD), plasma enhanced CVD (PECVD), thermal nitridation (for example, of silicon), other suitable process, or combinations thereof. In some implementations, pad layer 112 includes a material that promotes adhesion between substrate 102 and first mask layer 114 and/or functions as an etch stop layer when etching first mask layer 114. The present disclosure contemplates other materials for and/or methods for forming pad layer 112, first mask layer 114, and/or second mask layer 116, along with other configurations of patterning layer 110.

Figure 3A:
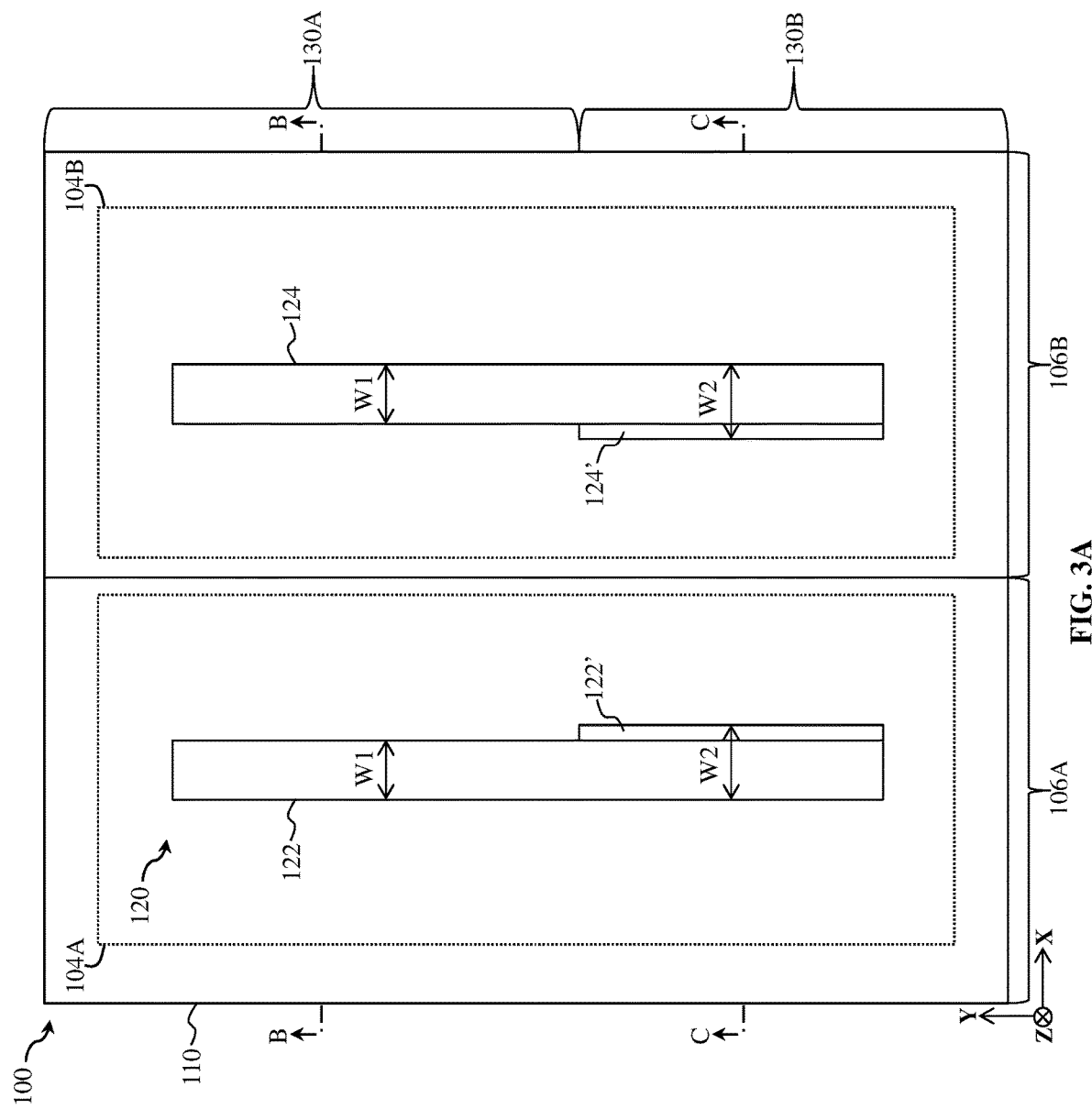
Figure 3B:
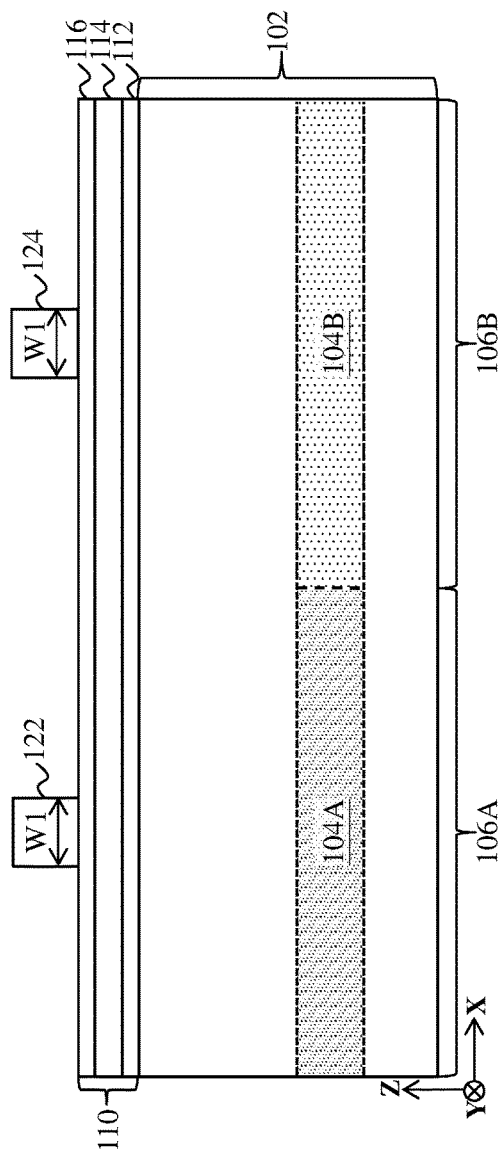
Figure 3C:
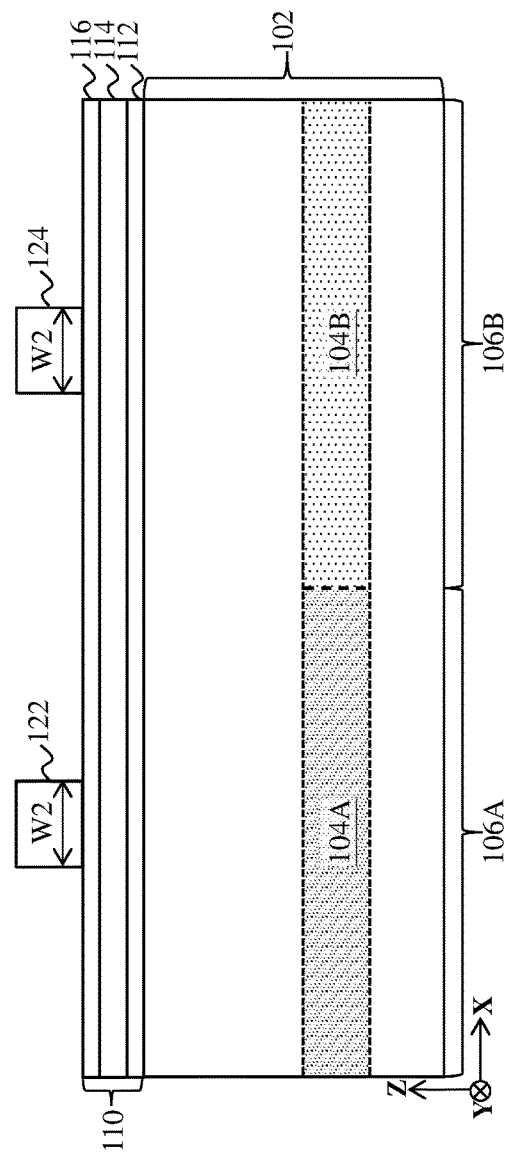

Turning to FIGS. 3A-3C, a patterned dummy layer 120 (also referred to as a sacrificial layer) is formed over patterning layer 110 and substrate 102. Patterned dummy layer 120 includes dummy patterns (also referred to as sacrificial patterns), such as a dummy pattern 122 disposed over patterning layer 110 in p-type FinFET region 106A and a dummy pattern 124 disposed over patterning layer 110 in n-type FinFET region 106B. In some implementations, patterned dummy layer 120 can be referred to as a mandrel layer and dummy patterns 122, 124 can be referred to as mandrels, which serve as temporary support structures for subsequently formed spacers. Patterned dummy layer 120 includes a material that is different than a material of patterning layer 110 (or substrate 102, for example, in implementations where patterning layer 110 is omitted) to achieve etching selectivity during an etching process, such that patterned dummy layer 120 can be selectively removed using a corresponding etchant with minimal (or no) etching of patterning layer 110. The materials of patterned dummy layer 120 and patterning layer 110 thus have different etch sensitivity. For example, where a first material and a second material have a 10:1 sensitivity ratio to a given etchant, the first material may be etched by the given etchant to a selected depth and/or amount while removing only about 10% as much of the second material. Accordingly, dummy patterned layer 120 includes a semiconductor material and/or a dielectric material that is different than a material of second mask layer 116 of patterning layer 110. For example, patterned dummy layer 120 includes silicon, oxygen, carbon, nitrogen, other suitable material, or combinations thereof. In the depicted embodiment, patterned dummy layer 120 includes amorphous silicon or polysilicon and second mask layer 116 includes silicon oxide, as these materials exhibit different etch sensitivity. In another example, patterned dummy layer 120 includes a dielectric material, such as silicon oxide, silicon nitride, silicon oxynitride, silicon carbide, or combinations thereof.

Dummy pattern 122 and dummy pattern 124 each have a width along the x-direction, where the width corresponds with a spacing (or pitch) between active fins to be formed in a portion of substrate 102. IC device 100 includes IC regions configured with FinFETs having different numbers of fins, such as an IC region 130A configured for FinFETs having an even number of fins and an IC region 130B configured for FinFETs having an odd number of fins. In the present embodiment, FinFETs having two fins (referred to as multi-fin FinFETs) will be formed in IC region 130A, while FinFETs having one fin (referred to as single-fin FinFETs) will be formed in IC region 130B. As described further herein, to increase process margins during subsequent processing, including during a fin cut last process where portions of active fins formed in the portion of substrate 102 are removed to achieve different numbers of fins for IC regions 130A, 130B, dummy patterns 122, 124 each have a width that varies as it spans IC regions 130A, 130B. For example, dummy patterns 122, 124 have a width W1 in IC region 130A, which is configured for two-fin FinFETs, and a width W2 in IC region 130B, which is configured for single-fin FinFETs, where width W2 is greater than width W1. Width W1 is substantially equal to a desired spacing between active fins to be formed in IC region 130A. In some implementations, width W1 is greater than a desired spacing between active fins to compensate for consumption of patterning layers (for example, spacers and/or patterning layer 110) and/or substrate used to form the fins during subsequent processing (for example, to compensate for etch loading effects), such that the active fins have the desired spacing upon completion of fabrication of IC device 100. Width W2 is configured to increase a process margin during a fin cut last process, where portions of active fins formed in the portion of substrate 102 are removed to achieve odd numbers of fins, and in the present example, single fins in IC region 130B. In the depicted embodiment, a ratio of width W2 to width W1 is configured to relax lithography overlay margins during the fin cut last process, improve critical dimension uniformity (CDU) control of the active fins, and/or relax etching process parameters used during subsequent processing. For example, a ratio of width W2 to width W1 is about 1.05 to about 2.

Patterned dummy layer 120 is formed over patterning layer 110 using any suitable process. In some implementations, a combination of deposition, lithography, and/or etching processes are performed to define dummy pattern 122 and dummy pattern 124 of patterned dummy layer 120 as illustrated in FIGS. 3A-3C. For example, forming dummy patterns 122, 124 includes depositing a dummy layer (for example, a polysilicon layer) over patterning layer 110, forming a patterned resist layer over the dummy layer using a lithography process, etching the dummy layer using the patterned resist layer as an etch mask, and removing the patterned resist layer (for example, by a resist stripping process), leaving patterned dummy layer 120 that includes dummy patterns 122, 124. The lithography processes can include forming a resist layer (for example, by spin-on coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The patterned resist layer can then be used as an etch mask during an etching process to remove portions of an underlying layer, such as the dummy layer. The etching process can include a dry etching process (for example, a reactive ion etching (RIE) process), a wet etching process, other suitable etching process, or combinations thereof. The patterned resist layer can be removed before or after the etching process. In some implementations, the exposure process can implement maskless lithography, electron-beam writing, ion-beam writing and/or nanoprint technology.

The present disclosure proposes modifying a mask pattern of a mask used during the lithography process for forming patterned dummy layer 220, such that dummy pattern 122 includes a portion 122' that corresponds with a first jog inserted into a mask layout and dummy pattern 124 includes a portion 124' that corresponds with a second jog inserted into a mask layout. In some implementations, an IC design layout (also referred to as an IC design pattern) is generated for fabricating fins of the two-fin FinFETs and single-fin FinFETs of IC device 100. In some implementations, the IC design layout includes six geometrical shapes (for example, lines (rectangles)) that correspond with the fins to be formed in a substrate. For example, the IC design layout includes a first region (corresponding with p-type FinFET region 106A) directly adjacent to a second region (corresponding with n-type FinFET region 106B), where the first region and the second region each include a first sub-region (corresponding with IC region 130A) that is directly adjacent to a second sub-region (corresponding with IC region 130B). The first region includes a first line and a second line separated by a first spacing in the first sub-region of the first region, where the first line and the second line correspond with two fins to be formed in the substrate. The first region further includes a third line in the second sub-region of the first region, where the third line corresponds with a single fin to be formed in the substrate. The second region includes a fourth line and a fifth line separated by the first spacing in the first sub-region of the second region, where the fourth line and the fifth line correspond with two fins to be formed in the substrate. The second region further includes a sixth line in the second sub-region of the second region that corresponds with a single fin to be formed in the substrate. The first, second, third, fourth, fifth, and sixth lines are arranged to have lengths that extend in a first direction, such as the y-direction, and widths that extend in a second direction that is substantially perpendicular to the first direction, such as the x-direction. The first, second, fourth, and fifth lines are arranged substantially parallel to one another, and the third and sixth lines are arranged substantially parallel to one another. The third line is aligned with the first line along the y-direction, and the sixth line is aligned with the fifth line along the y-direction. The IC design layout is presented in one or more data files having information of the circuit patterns (geometrical patterns). For example, the IC design layout is expressed in a Graphic Database System file format (such as GDS or GDSII) or another suitable file format, such as Open Artwork System Interchange Standard file format (such as OASIS or OAS).

A mask pattern (mask layout) is then generated for forming patterned dummy layer 120 based on a target pattern (here, six lines) defined by the IC design layout. The mask layout can therefore be referred to as a dummy pattern layout. The mask layout includes a first mask region (corresponding with p-type FinFET region 106A) directly adjacent to a second mask region (corresponding with n-type FinFET region 106B), where the first mask region and the second mask region each include a first mask sub-region (corresponding with IC region 130A) that is directly adjacent to a second mask sub-region (corresponding with IC region 130B). In some implementations, the mask layout includes dummy pattern that includes a first dummy line and a second dummy line. The first dummy line spans continuously from the first mask sub-region of the first mask region to the second mask sub-region of the first mask region, and the second dummy line that spans continuously from the first mask sub-region of the second mask region to the second mask sub-region of the second mask region. The first dummy line has a width that is substantially the same as the spacing between the first line and the second line in the IC design layout, and the second dummy line has a width that is substantially the same as the spacing between the fourth line and the fifth line in the IC design layout. The widths of the first dummy line and the second dummy line thus correspond with a desired spacing (or pitch) between fins of two-fin FinFETs. The first dummy line corresponds with dummy pattern 122, and the second dummy line corresponds with dummy pattern 124.

To increase lithography process margins during a fin cut, the mask layout is modified in the second mask sub-regions, which correspond with IC region 130B, of the first mask region and the second mask region. For example, a jog pattern is inserted into the dummy pattern to increase a final spacing between fins in regions of IC device 100 where single or odd numbers of fins will be formed in the substrate (and thus regions of IC device 100 where a fin cut process will remove fins). In some implementations, the jog pattern includes a first jog line disposed adjacent to the first dummy line in the second mask sub-region of the first mask region and a second jog line disposed adjacent to the second dummy line in the second mask sub-region of the second mask. The first jog line and the second jog line extend substantially parallel respectively to the first dummy line and the second dummy line. In some implementations, the first jog line and the second jog line extend an entire length respectively of the first jog line and the second jog line in the second mask sub-regions. A width of the first jog line is configured such that a sum of the width of the first dummy line and the width of the first jog line in the second mask sub-region is greater than the width of the first dummy line in the first mask sub-region. A width of the second jog line is configured such that a sum of the width of the second dummy line and the width of the second jog line in the second mask sub-region is greater than the width of the second dummy line in the first mask sub-region. Jogs are therefore inserted next to any dummy line or portion of a dummy line corresponding with a region of an IC device where FinFETs will include an odd number of fins (here, single fins). A mask fabricated using the modified mask layout (including the mask pattern and the jog pattern) will have a final mask pattern that corresponds with the modified mask layout, such that the mask includes a first mask feature and a second mask feature. The first mask feature and the second mask feature have a first width in a first region and a second width in a second region, where the second width is less than the first width. Accordingly, when the mask is used for forming patterned dummy layer 120, dummy pattern 122 includes portion 122' corresponding with the first jog line and dummy pattern 124 includes a portion 124' corresponding with the second jog line, and dummy patterns 122, 124 have widths that vary along the y-direction. In particular, widths of dummy patterns 122, 124 increase from IC region 130A to IC region 130B.

A fin cut pattern layout is also generated for removing unwanted fins and/or unwanted portions of the fins, such that IC device 100 includes fins that correspond with the target pattern (here, six lines) defined by the IC design layout. The cut pattern layout is generated based on the modified mask layout, which includes the mask pattern and the jog pattern. The cut pattern layout includes a cut pattern that defines one or more openings. In some implementations, the cut pattern defines an opening have a width greater than a sum of a width of the first jog line, a width of the second jog line, and a spacing between the first jog line and the second jog line. In such implementations, the opening completely overlaps and exposes the first jog line and the second jog line and partially overlaps the first dummy line and the second dummy line in the second mask sub-regions of the first mask region and the second mask region. In some implementations, the cut pattern defines a first opening having a first width that is greater than a sum of a width of the first jog line, and a second opening having a second width that is greater than a width of the second jog line. In such implementations, the first opening completely overlaps and exposes the first jog line and partially overlaps the first dummy line in the second mask sub-region of the first mask region, and the second opening completely overlaps and exposes the second jog line and partially overlaps the second dummy line in the second mask sub-region of the second mask region. Other configurations of the openings defined by the cut pattern are contemplated by the present disclosure. A fin cut mask fabricated using the fin cut pattern layout (including the cut pattern) will have a final cut pattern that corresponds with the fin cut pattern layout. Accordingly, the fin cut mask includes at least one fin cut feature that corresponds with an opening to be formed in a patterning layer during a fin cut process. Since the first jog line and the second jog line increase widths of the a spacing between spacers (and eventually fins) formed during the fin patterning process, lithography overlay requirements are relaxed during the fin cut process using the fin cut mask. For example, as described further below, the disclosed fin patterning process can tolerate greater shifts of the at least one cut feature along the x-direction relative to the fins.

Figure 4A:
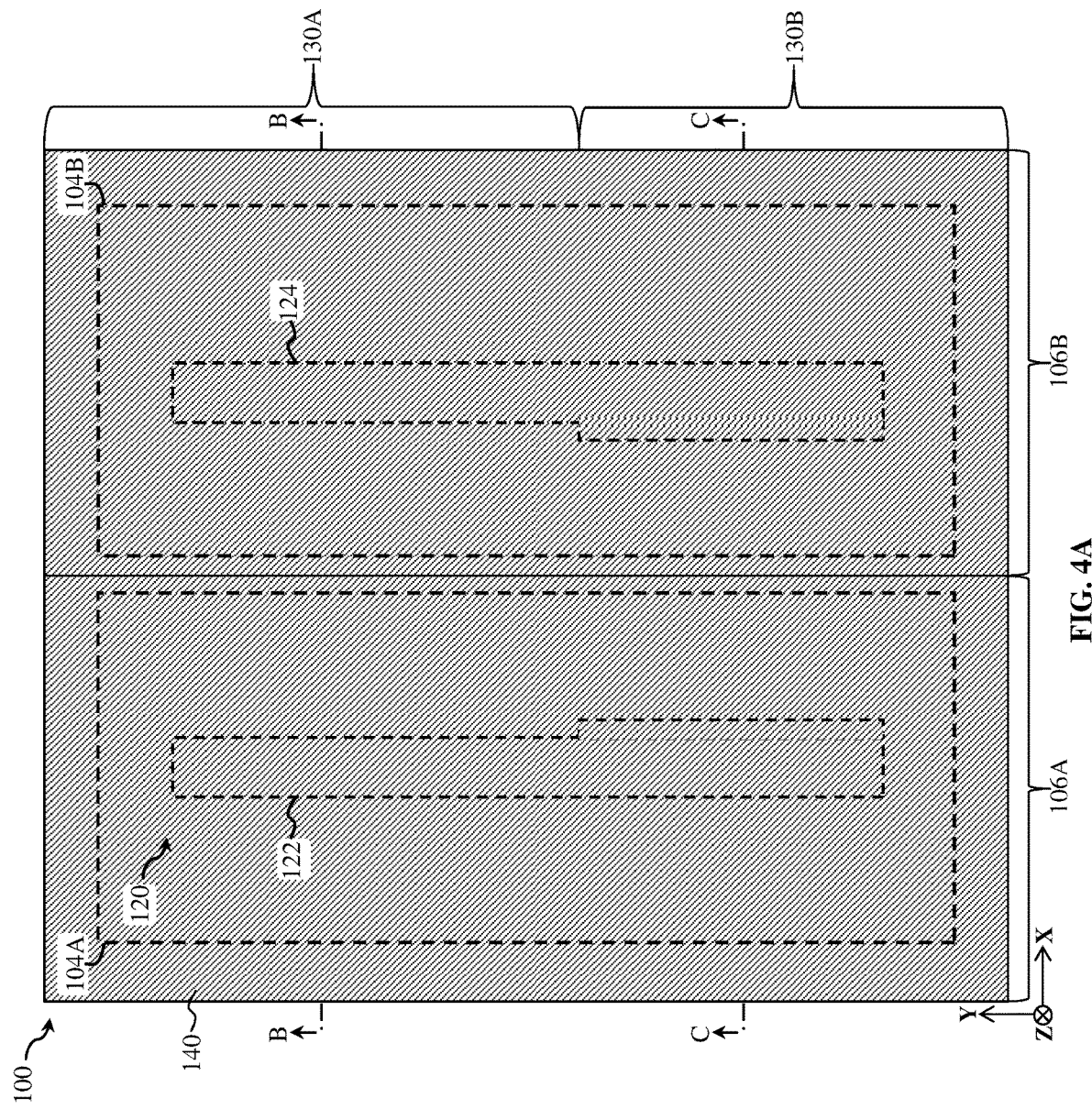
Figure 4B:
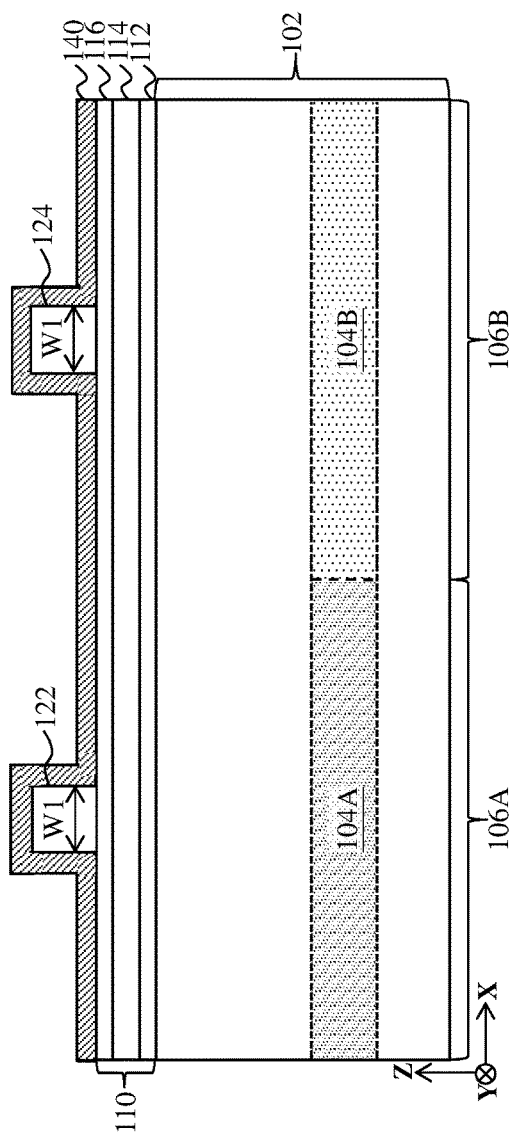
Figure 4C:
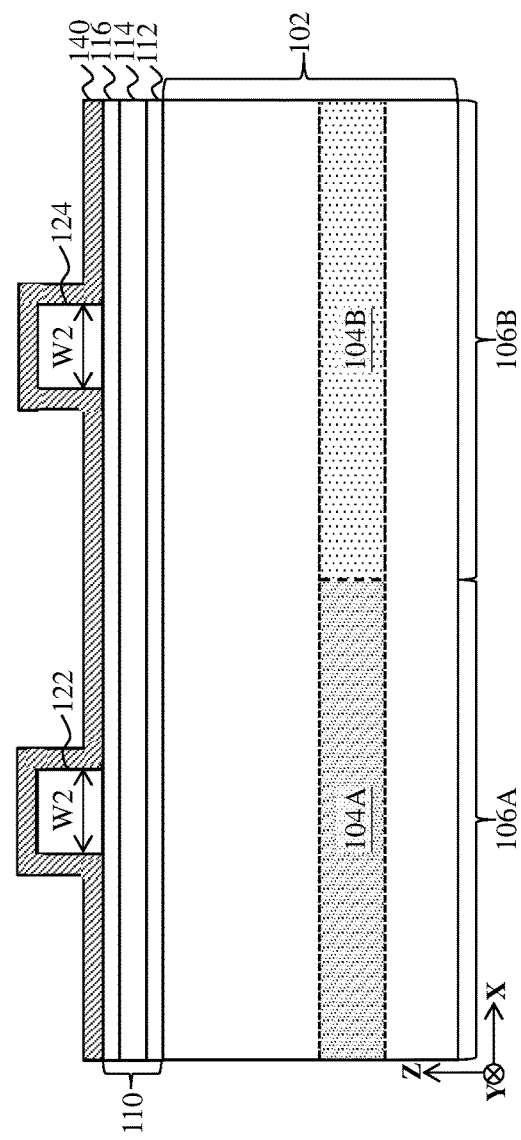

Turning to FIGS. 4A-4C, a deposition process is performed to form a spacer layer 140 over patterning layer 110 and patterned dummy layer 120. Spacer layer 140 includes a material that is different than a material of patterned dummy layer 120 and a material of patterning layer 110 to achieve etching selectivity during an etching process, such that spacer layer 140 can be selectively removed using a corresponding etchant with minimal (or no) etching of patterned dummy layer 120 and patterning layer 110. Spacer layer 140 thus includes a semiconductor material and/or a dielectric material that is different than a material of patterned dummy layer 120 and a material of second mask layer 116 to achieve different etch sensitivity. For example, spacer layer 140 includes silicon, oxygen, carbon, nitrogen, other suitable material, or combinations thereof (for example, silicon oxide, silicon nitride, silicon oxynitride, silicon carbide, titanium oxide, titanium nitride, or combinations thereof). In the depicted embodiment, where patterned dummy layer 120 includes amorphous silicon or polysilicon and second mask layer 116 includes silicon oxide, spacer layer 140 includes silicon nitride. In some implementations, spacer layer 140 includes a high-k dielectric material. Spacer layer 140 is deposited over patterning layer 110 and dummy patterned layer 120 using atomic layer deposition (ALD), CVD, PECVD, other suitable deposition process, or combinations thereof. For example, in the depicted embodiment, an ALD process conformally deposits spacer layer 140 over patterning layer 110 and dummy patterned layer 120, such that spacer layer 140 has a substantially uniform thickness over top surfaces of patterning layer 110, top surfaces of dummy patterns 122, 124, and sidewalls of dummy patterns 122, 124.

Figure 5A:
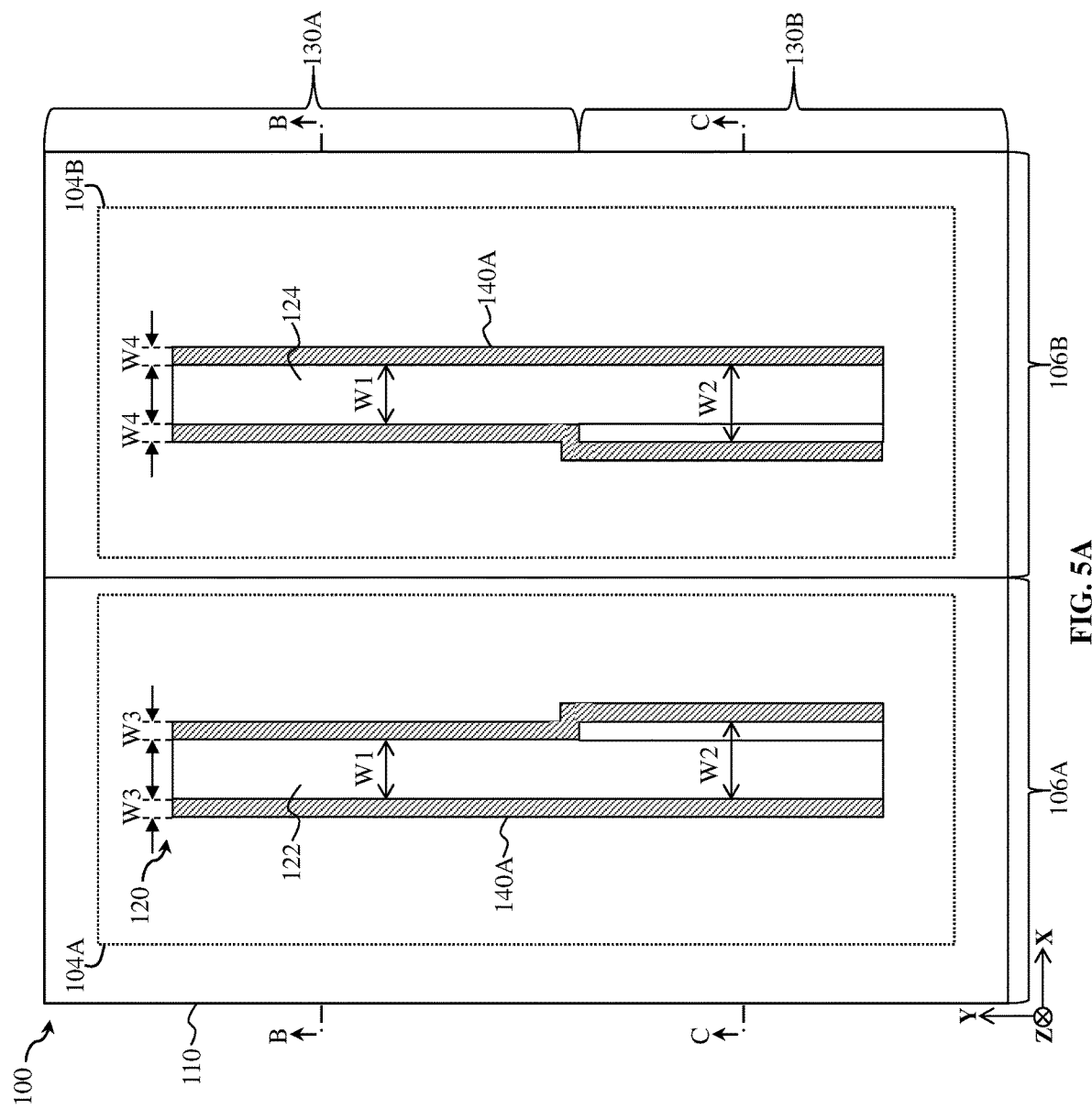

Turning to FIGS. 5A-5C, an etching process is performed on spacer layer 140 to form spacers 140A along sidewalls of dummy patterns 122, 124. The etching process is configured to remove spacer layer 140 from the top (and/or horizontal) surfaces of patterning layer 110 and top (and/or horizontal) surfaces of dummy patterns 122, 124. In some implementations, the etching process is an anisotropic etch process (for example, a plasma etch process) configured to selectively remove the spacer layer 140 with minimal (to no) removal of second mask layer 116 and dummy patterns 122, 124, such that only portions of spacer layer 140 disposed on sidewalls of dummy patterns 122, 124 remain. Spacers 140A have widths along the x-direction that correspond with widths of active fins to be formed in a portion of substrate 102. For example, spacers 140A have a width W3 in p-type FinFET region 106A and spacers 140A have a width W4 in n-type FinFET region 106B, where width W3 corresponds with a desired width for fins of p-type FinFETs of IC device 100 and width W4 corresponds with a desired width for fins of n-type FinFETs of IC device 100. In the depicted embodiment, width W3 is substantially the same as width W4. In some implementations, width W3 is different than width W4 depending on design requirements of IC device 100. In some implementations, width W3 and/or width W4 are equivalent to a minimum fin width. In some implementations, the minimum fin width generally refers to a smallest fin width achievable by a lithography process and/or a fin fabrication process (including deposition, lithography, and/or etching processes) of a given IC technology node. In some implementations, the minimum fin width generally refers to a smallest fin width specified by design requirements for IC device 100. In some implementations, deposition and etching of spacer layer 140 can be configured for more precise control of the widths of spacers 140A than that achieved by lithography alone. For example, a thickness of spacer layer 140 as deposited and etching parameters of the etching process can be tuned to precisely control widths W3, W4 of spacers 140A. In some implementations, spacers 140A are trimmed before or after removing dummy patterns 122, 124 to further achieve desired widths W3, W4 of spacers 140A.

Figure 6A:
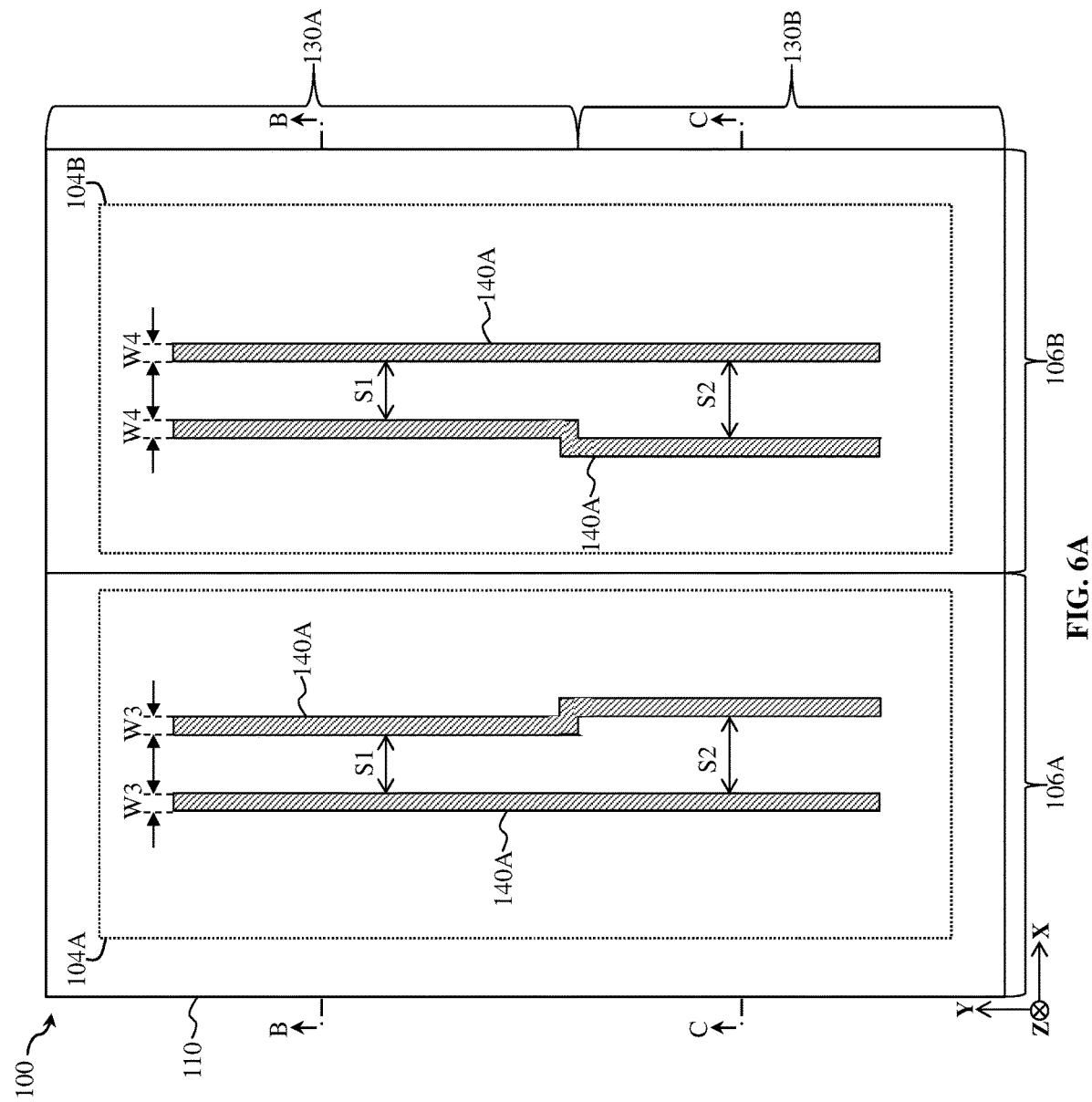
Figure 6B:
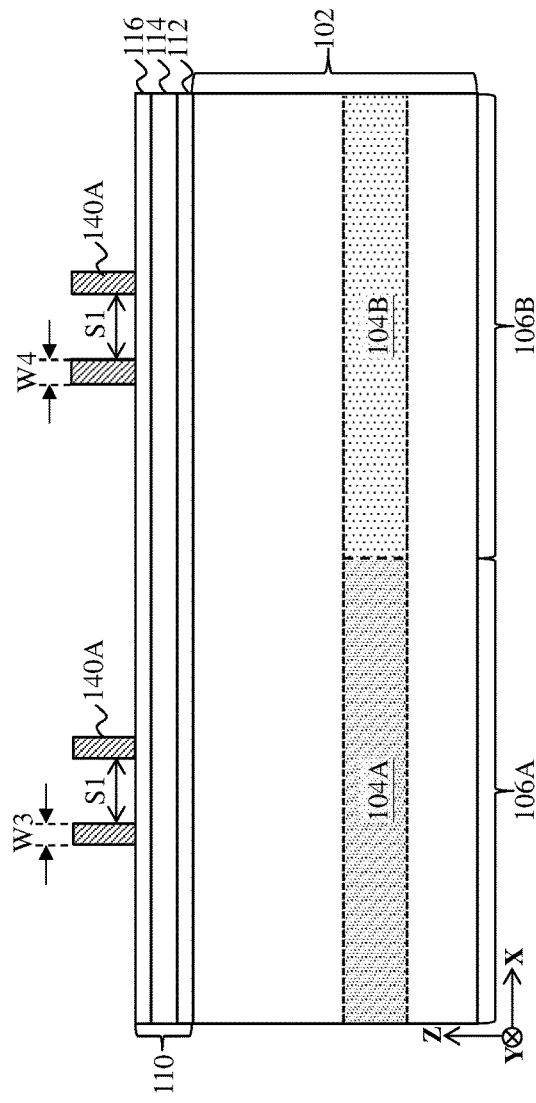
Figure 6C:
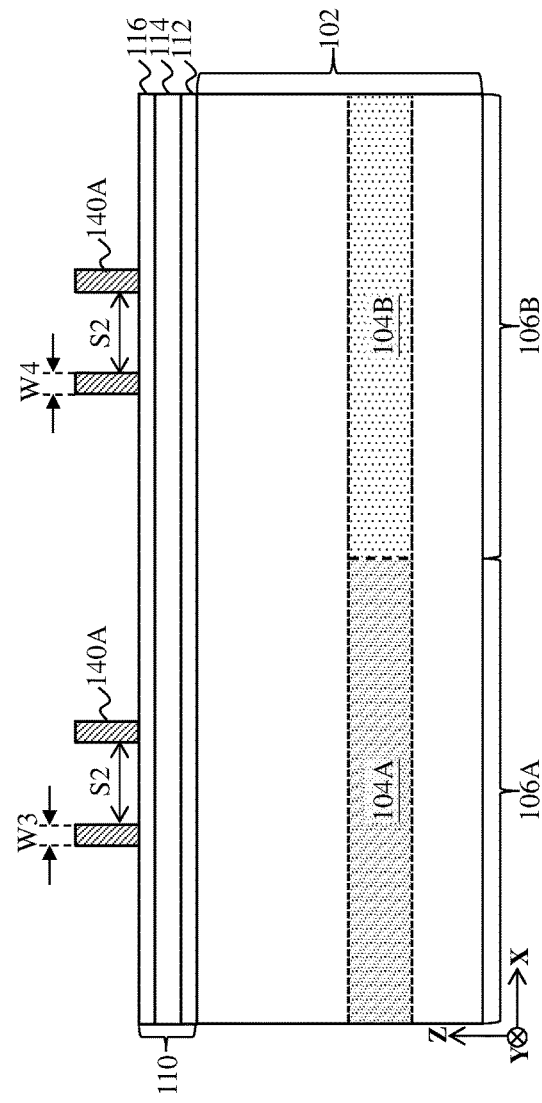

Turing to FIGS. 6A-6C, an etching process is performed to remove dummy pattern 122 and dummy pattern 124, leaving spacers 140A disposed over patterning layer 110. The etching process selectively etches patterned dummy layer 120 with minimal (to no) etching of spacers 140A and patterning layer 110 (particularly, second mask layer 116), such that dummy patterns 122, 124 are removed and spacers 140A remain over patterning layer 110. The etching process is a dry etching process, a wet etching process, or combinations thereof. Spacers 140A are separated by a spacing S1 in IC region 130A and a spacing S2 in IC region 130B. Spacing S1 corresponds with width W1 of dummy patterns 122, 124, and spacing S2 corresponds with width W2 of dummy patterns 122, 124. For example, spacing S1 is equal to width W1 (S1≈W1), spacing S2 is equal to width W2 (S2≈W2), and a ratio of spacing S2 to spacing S1 is about 1.05 to about 2 (1.05≤S2:S1≤2). Spacing S1 thus defines a desired spacing between active fins to be formed in a portion of substrate 102, and spacing S2 defines a spacing that relaxes subsequent processing requirement and/or margins, including during a fin cut last process used to remove portions of the active fins.

Figure 7A:
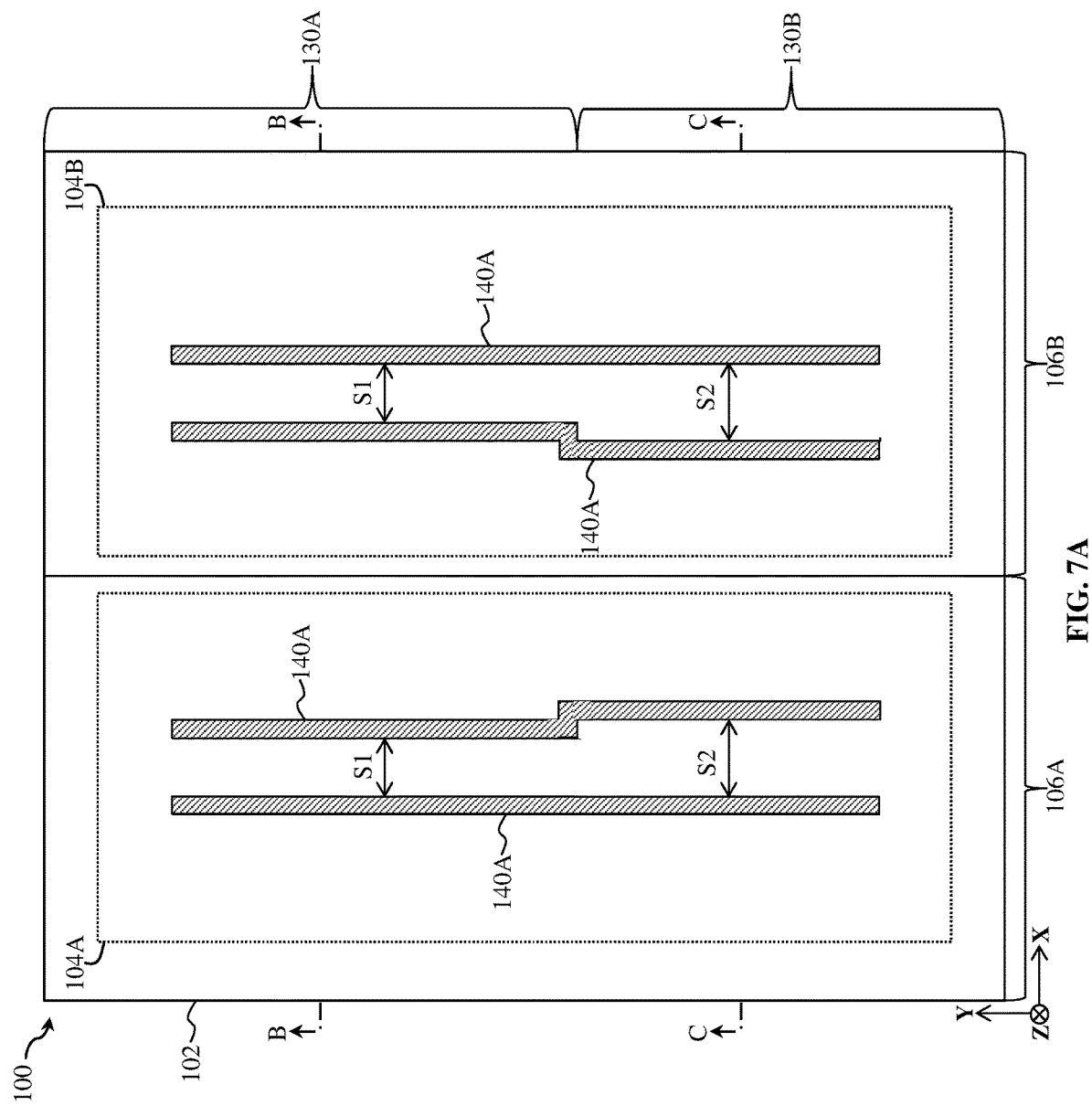
Figure 7B:
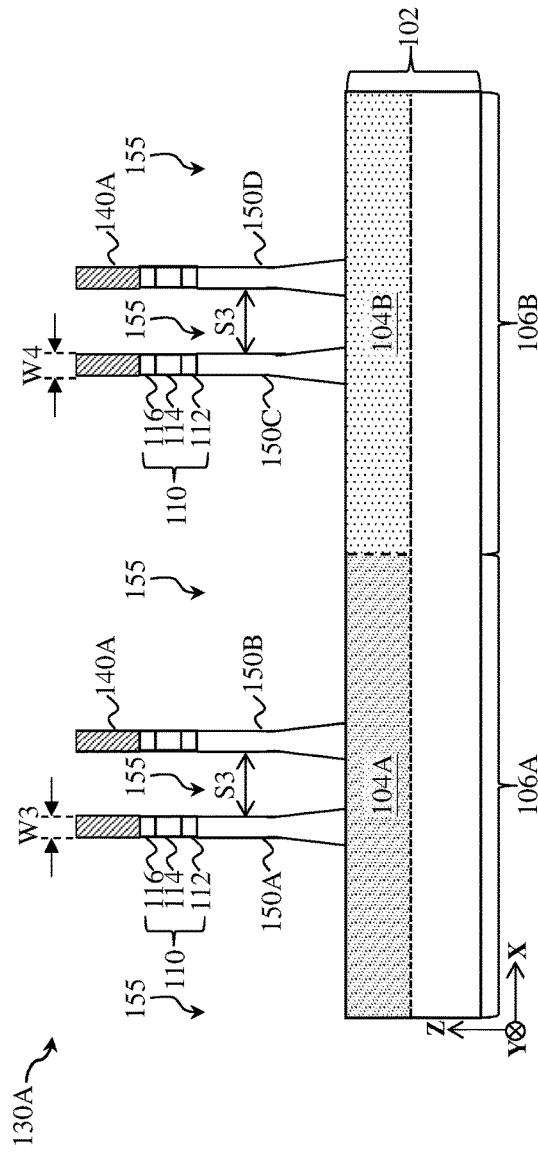
Figure 7C:
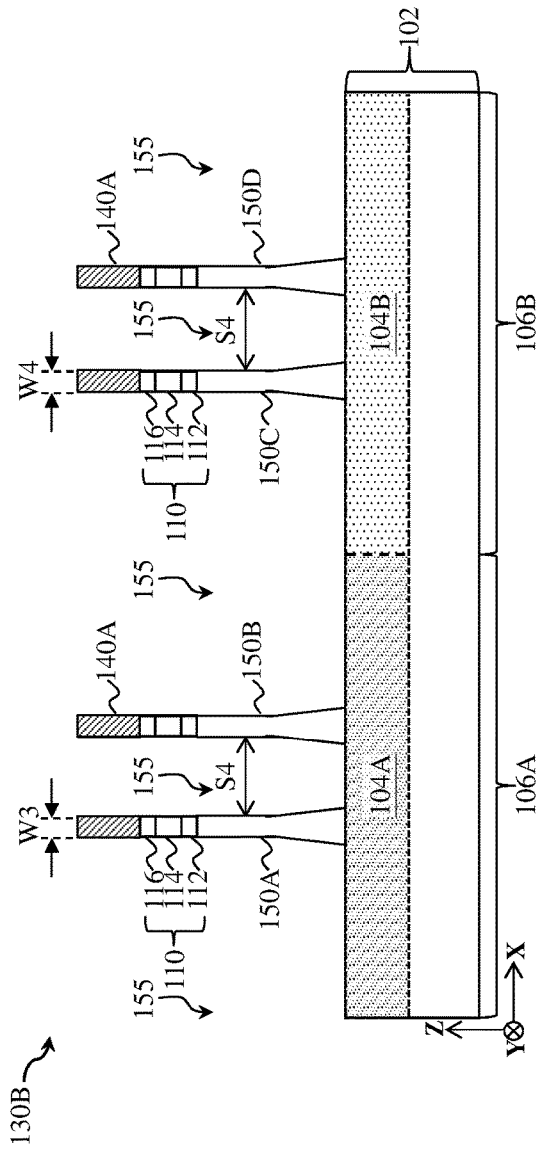

Turning to FIGS. 7A-7C, a fin etching process is performed to define a fin 150A, a fin 150B, a fin 150C, and a fin 150D (collectively referred to as a fin layer) in a portion of substrate 102 using spacers 140 and/or patterning layer 110 as an etch mask. Fins 150A, 150B are disposed in p-type FinFET region 106A and span IC regions 130A, 130B, and fins 150C, 150D are disposed in n-type FinFET region 106B and span IC regions 130A, 130B. Fins 150A-150D are oriented substantially parallel to one another, each having a width defined in the x-direction, a length defined in the y-direction, and a height defined in the z-direction. Because dummy patterns 122, 124 had varying widths, spacing between fin 150A and fin 150B varies along the lengths of fins 150A, 150B, and spacing between fin 150C and fin 150D varies along the lengths of fins 150C, 150D. In the depicted embodiment, fin 150A is separated from fin 150B by spacing S3 in IC region 130A and spacing S4 in IC region 130B, fin 150C is separated from fin 150D by spacing S3 in IC region 130A and spacing S4 in IC region 130B, and spacing S4 is greater than spacing S3. Spacing of spacers 140A is transferred to the fin layer. For example, spacing S3 is substantially equal to spacing S1 (S3≈S1), spacing S4 is substantially equal to spacing S2 (S4≈S2), and a ratio of spacing S4 to spacing S3 is about 1.05 to about 2 (1.05≤S4:S3≤2). Spacing S3 is thus substantially equal to desired spacing between active fins of IC device 100, and spacing S4 sufficiently relaxes subsequent processing requirements and/or margins. In the depicted embodiment, where substrate 102 is a bulk substrate that includes silicon, fins 150A-150D include silicon. In some implementations, where substrate 102 includes a semiconductor layer stack disposed over a bulk substrate, fins 150A-150D are defined in the semiconductor layer stack, such that fins 150A-150D include one or more semiconductor material layers. In furtherance of the depicted embodiment, after the fin etching process, trenches 155 are defined between fins 150A-150D, where trenches 155 have sidewalls defined by sidewalls of fins 150A-150D and bottoms defined by top surfaces of substrate 102.

The fin etching process selectively etches portions of patterning layer 110 and substrate 102 that are not covered (or protected) by spacers 140A with minimal (to no) etching of spacers 140A, such that spacers 140A serve as an etch mask for removing portions of patterning layer 110 and/or substrate 102. The etching process is a dry etching process, a wet etching process, or combinations thereof. In some implementations, the fin etching process is an anisotropic dry etching process (for example, a RIE process) configured to substantially remove patterning layer 110 and a portion of substrate 102 along the z-direction with minimal (to no) removal of patterning layer 110 and the portion of substrate 102 along the x-direction and the y-direction. In some implementations, a dry etching process uses a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. In some implementations, a wet etching process implements an etching solution that includes TMAH, $NH_4OH$, $H_2O_2$, $H_2SO_4$, HF, HCl, other suitable wet etching constituent, or combinations thereof. Various etching parameters can be tuned to selectively etch patterning layer 110 and substrate 102, such as etchant composition, etching temperature, etching solution concentration, etching time, etching pressure, source power, RF bias voltage, RF bias power, etchant flow rate, other suitable etching parameters, or combinations thereof. The present disclosure contemplates any combination of etching processes and/or other processes for defining fins 150A-150D. For example, spacers 140A are removed after (or during) etching of patterning layer 110, such that spacers 140A serve as an etching mask for etching patterning layer 110 and patterning layer 110 serves as an etching mask for etching substrate 102. In another example, spacers 140A are removed after (or during) etching of substrate 102, such that spacers 140A serve as an etching mask for etching patterning layer 110 and substrate 102. In some implementations, spacers 140A and/or patterning layer 110 may be partially removed during the fin etching process. In some implementations, patterning layer 110 is omitted. In such implementations, spacers 140A include a material that is different than substrate 102 to achieve etching selectivity during an etching process, such that portions of substrate 102 can be selectively etched with minimal (or no) etching of spacers 140A, and vice versa.

Figure 8A:
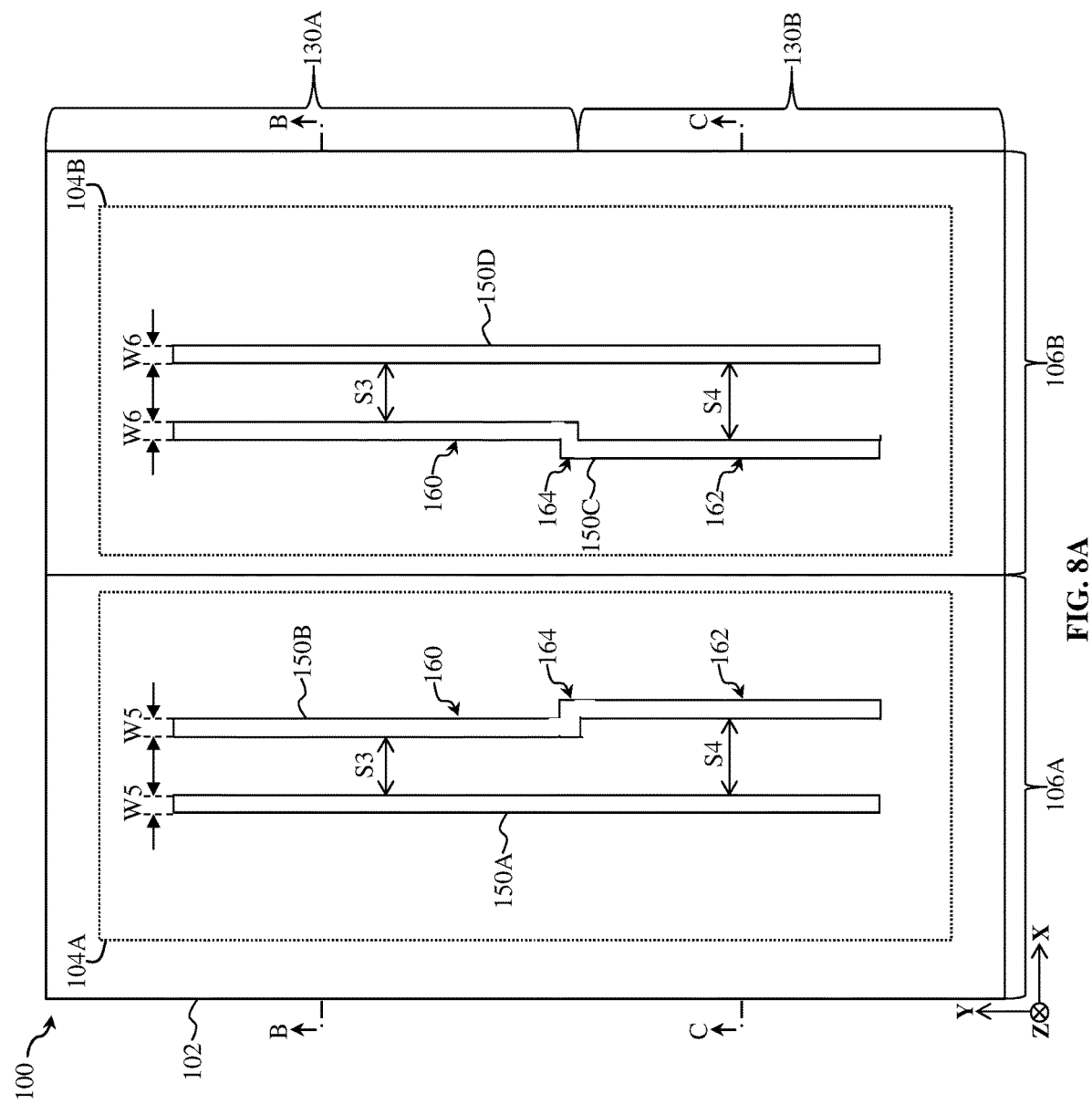

Turning to FIGS. 8A-8C, IC device 100 is depicted after removing spacers 140A and patterning layer 110. As noted above, spacers 140A and/or patterning layer 110 can be removed during or after the fin etching process. Fins 150A, 150B have a width W5, and fins 150C, 150D have a width W6. Widths of spacers 140A is transferred to the fin layer. For example, width W5 is substantially equal to width W3 (W5≈W3), and width W6 is substantially equal to width W4 (W6≈W4). Because spacing between fins 150A, 150B and fins 150C, 150D varies along their lengths, each pair of fins has a fin (here, fin 150B and fin 150C) that includes an active fin region 160, a dummy fin region 162, and a fin connecting region 164 that connects the active fin region 160 and the dummy fin region 160. Active fin region 160 corresponds with an active fin of a FinFET, and dummy fin region 162 corresponds with a dummy fin, which is an extra fin feature that is included within the fin layer to maintain fin feature density (and thus minimize patterning effects, such as fin etch loading effects, that can affect CDU of active fins, such as active fins 150A, 150D in IC region 130B) and/or correspond with a dummy tip fin feature (also referred to as a residual fin feature) to be formed in a portion of substrate 102, where the dummy fin and/or the dummy tip fin feature are electrically non-functional features of IC device 100.

Figure 9A:
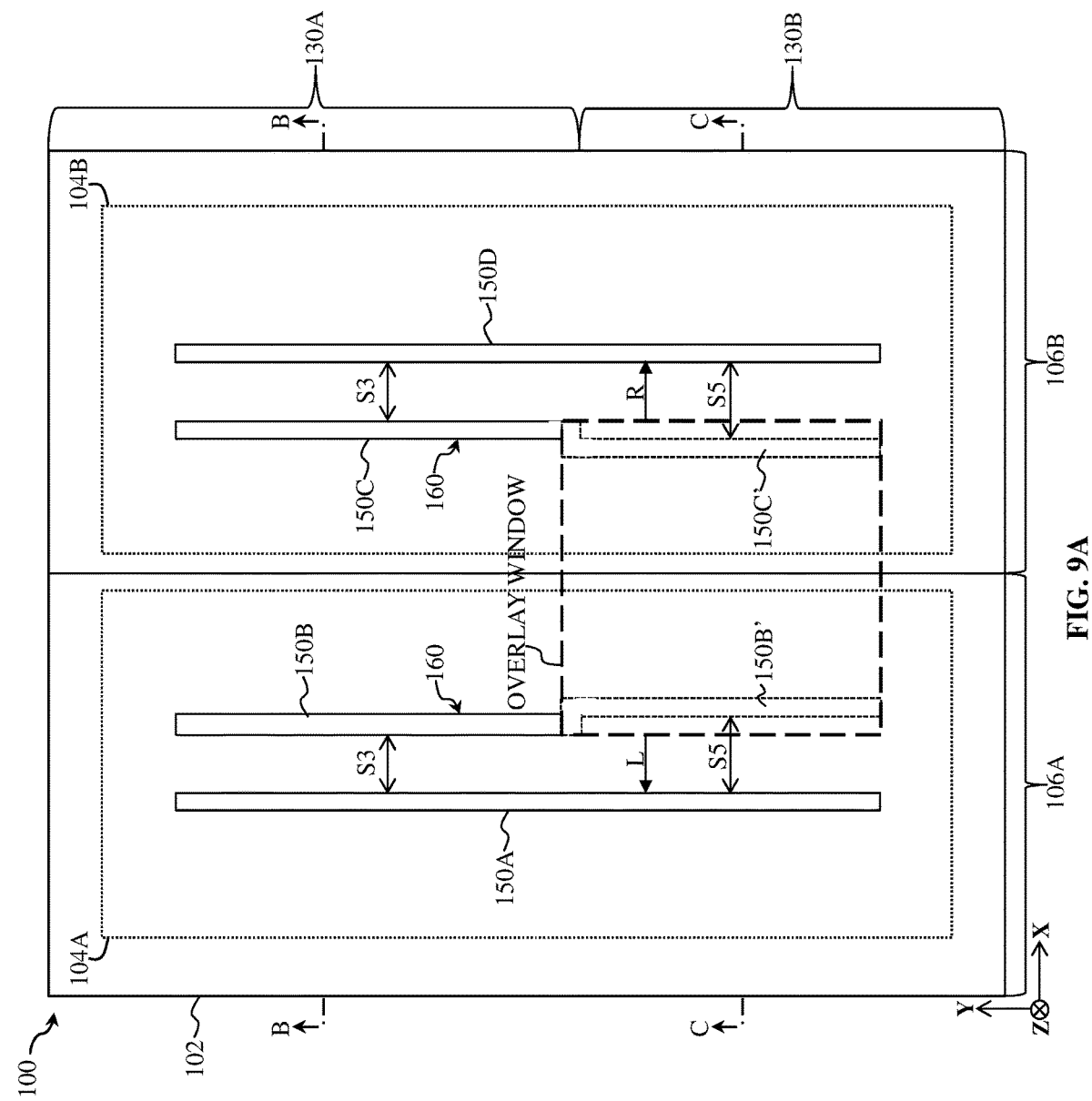
Figure 9B:
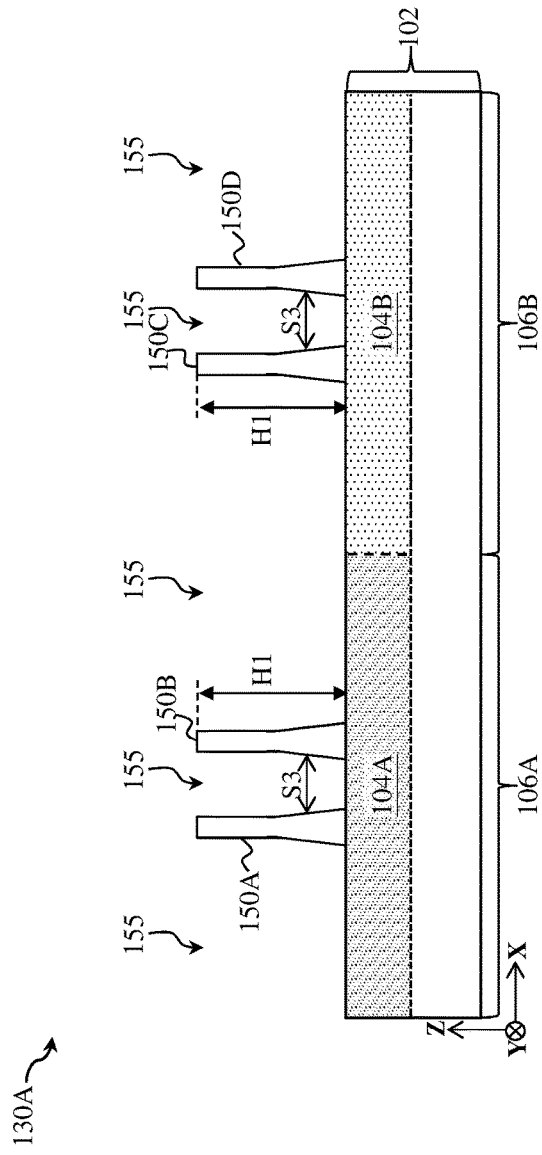
Figure 9C:
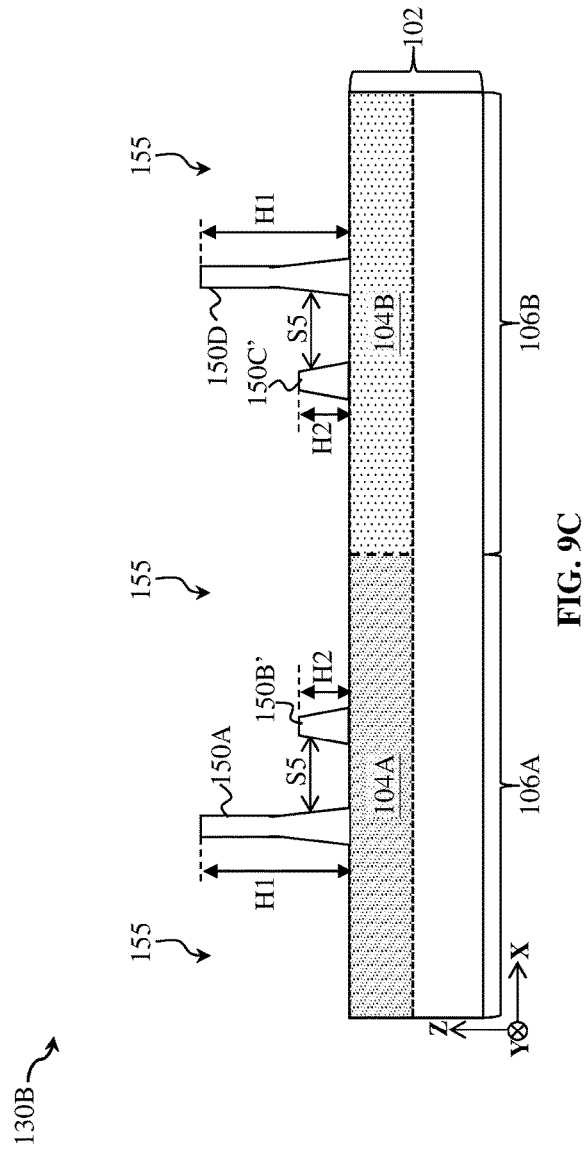

Turning to FIGS. 9A-9C, a fin cut last process is performed to remove portions of fins 150A-150D from regions of IC device 100 configured for FinFETs having odd numbers of fins. In the depicted embodiment, where IC region 130A is configured for two-fin FinFETs and IC region 130B is configured for single-fin FinFETs, the fin cut last process removes dummy fin regions 162 of fins 150B, 150C in IC region 130B. The fin cut last process partially removes dummy fin regions 162, such that a dummy fin tip 150B' remains in p-type FinFET region 106A and a dummy fin tip 150C' remains in n-type FinFET region 106B. Dummy fin tips 150B', 150C' can be referred to as residual fin features. Fins 150A-150D have a height H1 and dummy fin tips 150B', 150C' have a height H2 that is less than height H1. In some implementations, height H1 is about 90 nm to about 300 nm, and height H2 is less than about 30 nm. In some implementations, height H2 is at least 70 nm less than H1 (in other words, H1-H2≥70 nm). In IC region 130B, fin 150A is separated from dummy tip fin 150B' by spacing S5, and dummy tip fin 150C' is separated from fin 150D by spacing S5. The fin cut process is configured to ensure that spacing S5 is greater than spacing S3 between fins 150A, 150B in IC region 130A and between fins 150C, 150D in IC region 130A. In the depicted embodiment, a ratio of spacing S5 to spacing S3 is about 1.05 to about 2 (1.05≤S5:S3≤2). In some implementations, the fin cut last process also partially removes fin connecting regions 164 of fins 150B, 150C. The fin cut last process may completely or partially remove fin connecting regions 164 along the x-direction. For example, where partially removed along the x-direction, a first portion of fin connecting regions 164 that is not removed has height H1 and a second portion of fin connecting regions 164 that is removed has height H2. The present disclosure contemplates variations in the portions of fins 150A-150D removed during the fin cut last process.

The fin cut last process includes forming a patterned masking layer over fins 150A-150D and isolation layer 170, where the patterned masking layer includes a cut pattern defining protected portions of fins 150A-150D (here, fin 150A, active fin region 160 of fin 150B, active fin region 160 of fin 150C, and fin 150D) and unprotected (unwanted) portions of fins 150A-150D (here, dummy fin regions 162 and fin connecting regions 164 of fins 150B, 150C). In the depicted embodiment, the cut pattern defines an opening in the patterned masking layer that exposes dummy fin regions 162 and fin connecting regions 164 of fins 150B, 150C in IC region 130B. In some implementations, the cut pattern defines an opening in the patterned masking layer that exposes only dummy fin regions 162 of fins 150B, 150C in IC region 130B. In some implementations, the patterned masking layer is a patterned resist layer formed by a lithography process, such as those described herein. In some implementations, the patterned masking layer is a patterned hard mask layer, which is formed by depositing a hard mask layer over fins 150A-150D, forming a patterned resist layer having the cut pattern using a lithography process, such as those described herein, and etching the hard mask layer using the patterned resist layer as an etch mask, such that the patterned hard mask layer includes the cut pattern exposing the unprotected portions of fins 150A-150D. In some implementations, the patterned masking layer has a multi-layer structure. The fin cut last process further includes etching the unprotected portions of fins 150A-150D using the patterned masking layer as an etch mask. In some implementations, a selective etching process removes dummy fin regions 162 and fin connecting regions 164 of fins 150B, 150C with minimal (to no) removing of the patterned masking layer. The etching process is a dry etching process, a wet etching process, or combinations thereof. Various etching parameters can be tuned to selectively remove dummy fin regions 162 and fin connecting regions 164 of fins 150B, 150C, such as etchant composition, etching temperature, etching solution concentration, etching time, etching pressure, source power, RF bias voltage, RF bias power, etchant flow rate, other suitable etching parameters, or combinations thereof. In some implementations, a wet etching process uses an etching solution that includes tetramethylammonium hydroxide (TMAH), hydrofluoric acid (HF), sulfuric acid ($H_2SO_4$), hydrogen chloride (HCl), ammonium hydroxide ($NH_4OH$), hydrogen peroxide ($H_2O_2$), other suitable wet etching constituent, or combinations thereof. Thereafter, the patterned masking layer is removed (for example, by a resist stripping process and/or a selective etching process), leaving dummy fin tips 150B', 150C' as depicted in FIGS. 9A-9C.

Increasing the spacing between the fins in IC regions where FinFETs having odd numbers of fins will be formed (here, spacing S4 between fins 150A, fin 150B and between fins 150C, 150D in IC region 130B is greater than spacing S3 between fins 150A, 150B and between fins 150C, 150D in IC region 130A) relaxes lithography overlay margins during the fin cut last process. For example, referring to FIG. 9A, the opening in the patterned masking layer defined by the cut pattern fully exposes unprotected portions of fins 150A-150D in IC region 130B (here, dummy fin regions 162 and fin connecting regions 164), where an overlay window constrains alignment of the opening with underlying fins 150A-150D. The overlay window defines boundaries for cut edges in the patterned masking layer that define the opening, ensuring that fins 150A, 150D in IC region 130B remain covered by the patterned masking layer, while fins 150B, 150C are exposed by the opening in the patterned masking layer. These boundaries are constrained by spacing between fins 150A, 150B and spacing between fins 150C, 150D. For example, conventional fin cut processes often specify an overlay (cut) budget that is a fraction of the spacing between fins 150A, 150B and spacing between fins 150C, 150D. For example, to ensure that fins 150A, 150D remain covered and protected during the fin cut process, the overlay budget may be set to spacing/2, such that the cut edges can shift left (L) no more than a distance equal to spacing/2 from the sidewall of fin 150B that is directly adjacent to fin 150A and shift (R) no more than a distance equal to spacing/2 from the sidewall of fin 150C that is directly adjacent to fin 150D. As IC technologies continually progress towards smaller feature sizes (such as 32 nanometers, 28 nanometers, 20 nanometers, and below), scaling down of pitch is shrinking spacing between fins, drastically decreasing the overlay budget. The present disclosure overcomes these challenges because spacing between fins 150A-150D in IC region 130B is greater than spacing between fins 150A-150D in IC region 130A (in particular, spacing S4 is greater than spacing S3, where a ratio of spacing S4 to spacing S3 is about 1.05 to about 2). The increased spacing in IC region 130B relaxes the overlay budgets by allowing greater left/right shift and/or greater widths of the opening in the patterned masking layer.

Figure 10A:
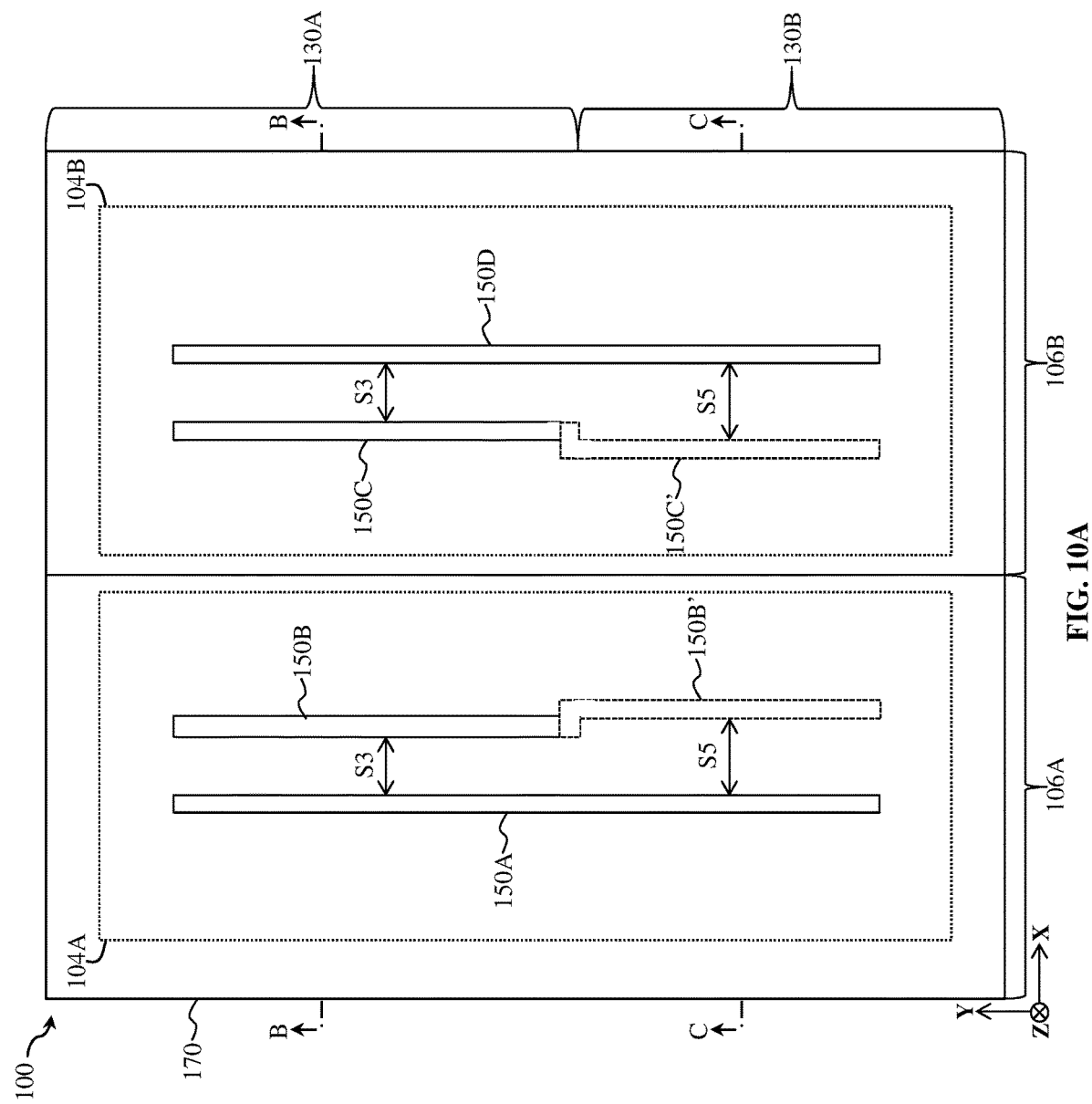

Turning to FIGS. 10A-10C, an isolation layer 170 is formed over substrate 102 to isolate various regions, such as various device regions, of IC device 100. For example, isolation layer 170 separates and isolates active device regions and/or passive device regions from each other, such as a p-type FinFET that includes fins 150A, 150B in IC region 130A from an n-type FinFET that includes fins 150C, 150D in IC region 130B, a p-type FinFET that includes fin 150A in IC region 130B from an n-type FinFET that includes fin 150D in IC region 130B, the p-type FinFET that includes fin 150A from dummy fin tip 150B' in IC region 130B, and the n-type FinFET that includes fin 150D from dummy fin tip 150C' in IC region 130B. Isolation layer 170 further separates and isolates fins 150A-150D from one another. In the depicted embodiment, isolation layer 170 surrounds a bottom portion of fins 150A-150D, thereby defining upper fin active regions of fins 150A-150D (generally referring to a portion of fins 150A-150D that extend from a top surface of isolation layer 170). In furtherance of the depicted embodiment, isolation layer 170 completely covers dummy fin tips 150B', 150C'. For example, isolation layer 170 has a thickness T that is less than height H1 of fins 150A-150D and greater than height H2 of dummy fin tips 150B', 150C' (H1>T>H2). In some implementations, thickness T is about 40 nm to about 250 nm. Isolation layer 170 includes silicon oxide, silicon nitride, silicon oxynitride, other suitable isolation material (for example, including silicon, oxygen, nitrogen, carbon, or other suitable isolation constituent), or combinations thereof. Isolation layer 170 can be configured to form shallow trench isolation (STI) structures, deep trench isolation (DTI) structures, and/or local oxidation of silicon (LOCOS) structures to define active regions of IC device 100 and/or between fins 150A-150D. In the depicted embodiment, STI features are formed by depositing an insulator material over substrate 102 after the fin cut last process (for example, by using a CVD process or a spin-on glass process), such that the insulator material fills trenches 155 between fins 150A-150D and covers dummy tip fins 150B', 150C'), and performing a chemical mechanical polishing (CMP) process to remove excessive insulator material. The CMP process may be performed until exposing top surfaces of fins 150A-150D (or, in some implementations, until masking layer disposed over the tops surfaces of fins 150A-150D), where the fins 150A-150D (or the masking layer) act as a CMP stop layer. An etching back of the insulator material layer can then be performed on the isolation layer 170 to form the isolation features. Dummy fin tips 150B', 150C' can improve isolation feature formation. For example, dummy fin tips 150B', 150C' maintain a uniform feature density in IC regions 130A, 130B, which can improve gap filling characteristics, such as filling of trenches 155. Without dummy fin tips 150B', 150C', active fin-fin spacing creates a fully isolated environment (for example, spacing between fin 150A and fin 150D in IC region 130B) and a dense environment (for example, spacing between fins 150A-150D in IC region 130A), where isolation layer 170 needs to fill both the fully isolated environment and the dense environment without gaps. Dummy fins tips 150B', 150C' create a semi-isolated environment in IC region 130B, facilitating more uniform coverage and filling of isolation layer 170 in IC regions 130A, 130B. In some implementations, isolation layer 170 includes a multi-layer structure that partially fills trenches 155, such as a bulk dielectric layer disposed over a liner dielectric layer, where the bulk dielectric layer and the liner dielectric layer include materials depending on design requirements of IC device 100 (for example, a bulk dielectric layer that includes silicon nitride disposed over a liner dielectric layer that includes thermal oxide). In some implementations, isolation layer 170 includes a dielectric layer disposed over a doped liner layer (including, for example, boron silicate glass (BSG) or phosphosilicate glass (PSG)).

Turning to FIGS. 11A-11F, various gate structures are formed over fins 150A-150D, such as a gate structure 180A, a gate structure 180B, a gate structure 180C, a gate structure 180D, a gate structure 180E, and a gate structure 180F. Gate structures 180A-180F extend along the x-direction (for example, substantially perpendicular to fins 150A-150D) and traverse fins 150A-150D, such that gate structures 180A-180F wrap upper fin active regions of respective fins 150A-150D. In the depicted embodiment, gate structure 180A, gate structure 180B, and gate structure 180C are disposed over channel regions of fins 150A-150D. Gate structures 180A-180C wrap respective channel regions of fins 150A-150D, thereby interposing respective source/drain regions of fins 150A-150D. Gate structures 180A-180C each engage the respective channel regions of fins 150A-150D, such that current can flow between the respective source/drain regions of fins 150A-150D during operation. Gate structure 180D wraps portions of fins 150A-150D, positioned such that a source/drain region of fins 150A-150D is disposed between gate structure 180D and gate structure 180A; gate structure 180E wraps portions of fins 150A-150D, positioned such that a source/drain region of fins 150A-150D is disposed between gate structure 180E and gate structure 180C; and gate structure 180F wraps portions of fins 150A, 150D, positioned such that a source/drain region of fins 150A, 150D is disposed between gate structure 180F and gate structure 180C and a source/drain region of fins 150A, 150D is disposed between gate structure 180F and gate structure 180B. Gate structures 180C, 180E, 180F also span over dummy tip fins 150B', 150C', such that isolation layer 170 is disposed between gate structures 180C, 180E, 180F and dummy tip fins 150B', 150C'.

In some implementations, gate structures 180A-180C are active gate structures, whereas gate structures 180D-180F are dummy gate structures. "Active gate structure" generally refers to an electrically functional gate structure of IC device 100, whereas "dummy gate structure" generally refers to an electrically non-functional gate structure of IC device 100. In some implementations, a dummy gate structure mimics physical properties of an active gate structure, such as physical dimensions of the active gate structure, yet is inoperable (in other words, does not enable current to flow). In some implementations, gate structures 180D-180F enable a substantially uniform processing environment, for example, enabling uniform epitaxial material growth in source/drain regions of fins 150A-150D (for example, when forming epitaxial source/drain features), uniform etch rates in source/drain regions of fins 150A-150D (for example, when forming source/drain recesses), and/or uniform, substantially planar surfaces (for example, by reducing (or preventing) CMP-induced dishing effects). In some implementations, gate structures 180D-180F are configured to electrically and/or physically isolate FinFETs of IC device 100. For example, gate structure 180F electrically isolates multi-fin FinFETs in IC region 130A from single-fin FinFETs in IC region 130B. In the depicted embodiment, gate structure 180F electrically isolates a source/drain region of a two-fin p-type FinFET (which includes gate structure 180B) in IC region 130A from a single-fin p-type FinFET (which includes gate structure 180C) in IC region 130B. In furtherance of the depicted embodiment, gate structure 180F also electrically isolates a source/drain region of a two-fin n-type FinFET (which includes gate structure 180B) in IC region 130A from a single-fin n-type FinFET (which includes gate structure 180C) in IC region 130B.

Gate structures 180A-180F include gate stacks configured to achieve desired functionality according to design requirements of IC device 100, such that gate structures 180A-180F include the same or different layers and/or materials. In the depicted embodiment, gate structures 180D, 180E (dummy gate structures) are configured the same as gate structures 180A-180C (active gate structures). Since gate structures 180A-180E span p-type FinFET region 106A and n-type FinFET region 106B, gate structures 180A-180E may have different layers in regions corresponding with p-type FinFET region 106A and n-type FinFET region 106B. For example, gate structures 180A-180E have gate stacks 182A in p-type FinFET region 106A and gate stacks 182B in n-type FinFET region 106B, where gate stacks 182A are different than gate stacks 182B to achieve different threshold voltages for the p-type FinFETs in p-type FinFET region 106A and the n-type FinFETs in n-type region 106B. A number, configuration, and/or materials of layers of gate stacks 182A corresponding with p-type FinFET region 106A may be different than a number, configuration, and/or materials of layers of gate stacks 182B corresponding with n-type FinFET region 106B. In the depicted embodiment, gate stacks 182A include a gate dielectric 184A and a gate electrode 186A, gate stacks 182B include a gate dielectric 184B and a gate electrode 186B. A number, configuration, and/or materials of layers of gate dielectric 184A and/or gate electrode 186A may be the same or different than a number, configuration, and/or materials of layers of gate dielectric 184B and gate electrode 186B. In some implementations, gate stacks 182A, 182B can share one or more layers, such that the one or more layers extend continuously from gate stacks 182A to gate stacks 182B (for example, a gate dielectric). In some implementations, one or more layers shared by gate stacks 182A, 182B may be configured to achieve different characteristics.

Gate dielectric 184A wraps upper fin active regions of fins 150A, 150B, and gate dielectric 184B wraps upper fin active regions of fins 150C, 150D. Gate dielectric 184A is conformally disposed over fins 150A, 150B and isolation layer 170 and gate dielectric 184B is conformally disposed over fins 150C, 150D and isolation layer 170, such that gate dielectric 184A and gate dielectric 184B have substantially uniform thicknesses. A thickness of gate dielectric 184A can be substantially the same as or different than a thickness of gate dielectric 184B. Gate dielectrics 184A, 184B include a dielectric material, such as silicon oxide, high-k dielectric material, other suitable dielectric material, or combinations thereof. In the depicted embodiment, gate dielectrics 184A, 184B include one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. In some implementations, the high-k dielectric material has a dielectric constant greater than or equal to about five ($k \geq 5$). In some implementations, gate dielectrics 184A, 184B further include an interfacial layer (including a dielectric material, such as silicon oxide) disposed between the high-k dielectric layer and fins 150A-150D and/or isolation layer 170. In some implementations, gate dielectrics 184A, 184B include a nitrogen-doped oxygen-containing dielectric layer and a high-k dielectric layer disposed over the nitrogen-doped oxygen-containing dielectric layer. In some implementations, gate dielectrics 184A, 184B are configured to tune work functions of the p-type FinFETs in p-type FinFET region 106A and the n-type FinFETs in n-type FinFET region 106B according to design requirements of IC device 100. Gate dielectrics 184A, 184B are formed by various processes, such as ALD, CVD, PVD, and/or other suitable process, such as described herein.

Gate electrodes 186A, 186B are respectively disposed over gate dielectrics 184A, 184B. Gate electrodes 186A, 186B include an electrically conductive material. In some implementations, gate electrodes 186A, 186B includes multiple layers, such as one or more capping layers, work function layers, glue/barrier layers, and/or metal fill (or bulk) layers. In the depicted embodiment, gate electrodes 186A have layers configured to achieve a p-type work function, while gate electrodes 186B have layers configured to achieve an n-type work function. A capping layer can include a material that prevents or eliminates diffusion and/or reaction of constituents between gate dielectrics 184A, 184B and other layers of gate structures 180A-180E (in particular, gate layers including metal). In some implementation, the capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over at least a portion of gate electrodes 186A, 186B. Gate electrodes 186A, 186B are formed by various deposition processes, such as ALD, CVD, PVD, and/or other suitable process, such as those described herein. A CMP process can be performed to remove any excess material of gate dielectrics 184A, 184B and/or gate electrodes 186A, 186B, planarizing gate structures 180A-180E.

Figure 11A:
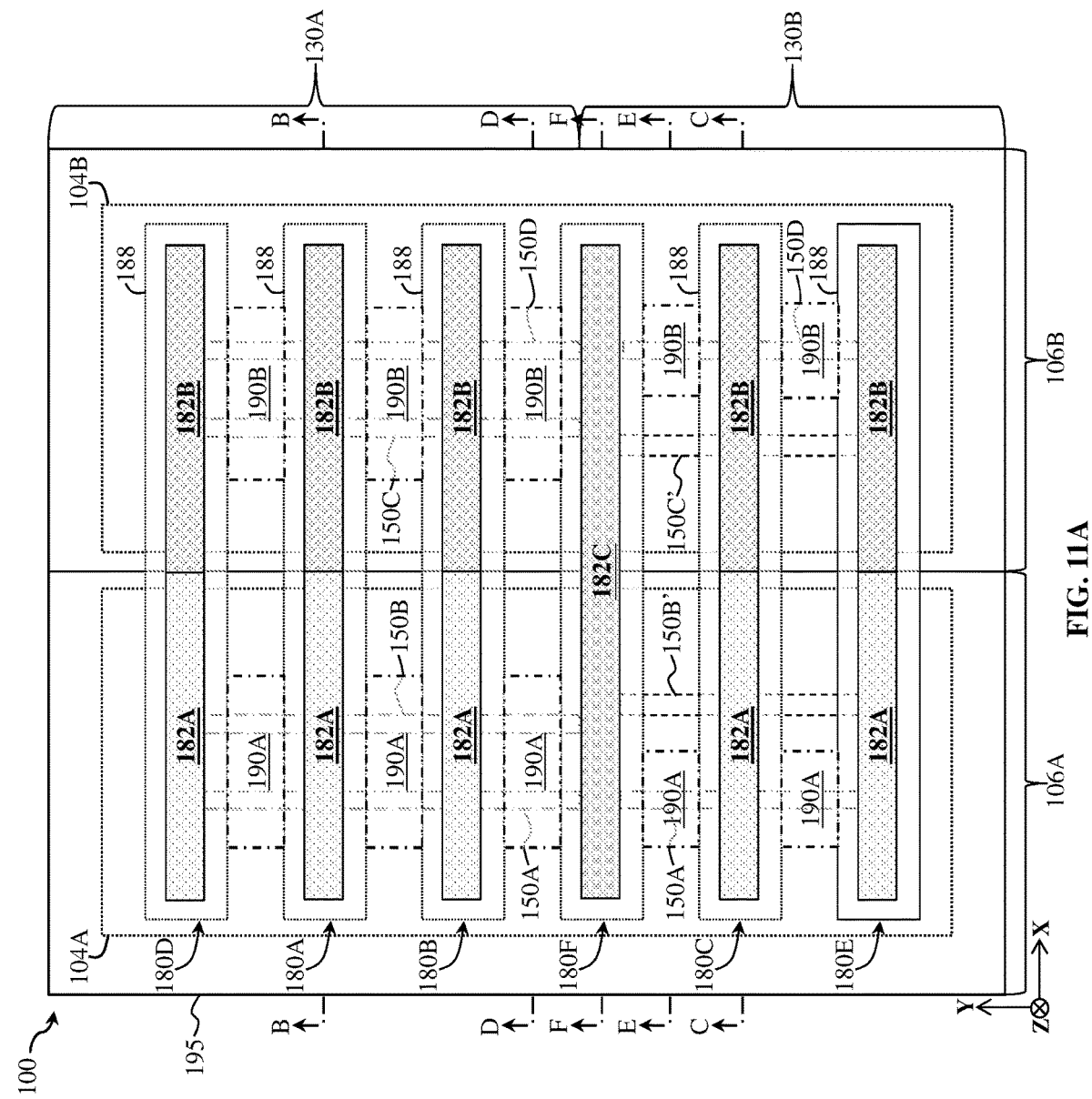
Figure 11B:
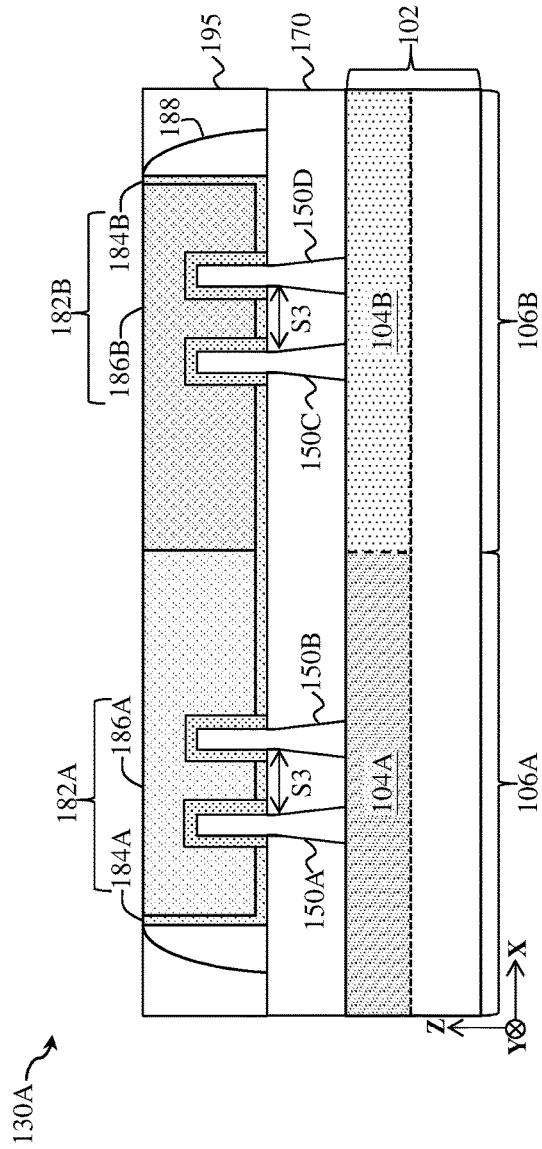
Figure 11C:
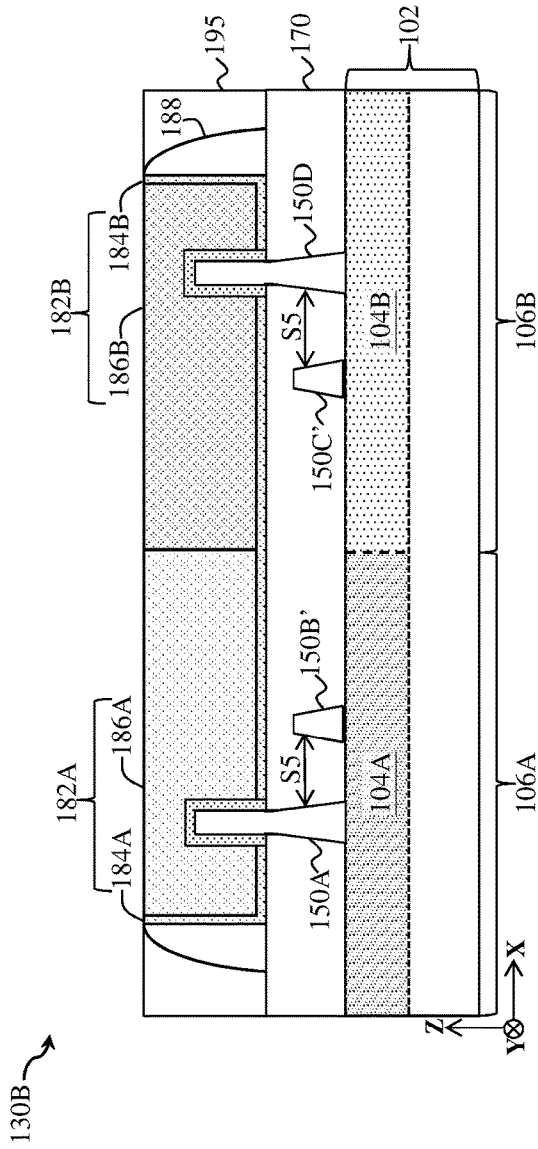
Figure 11D:
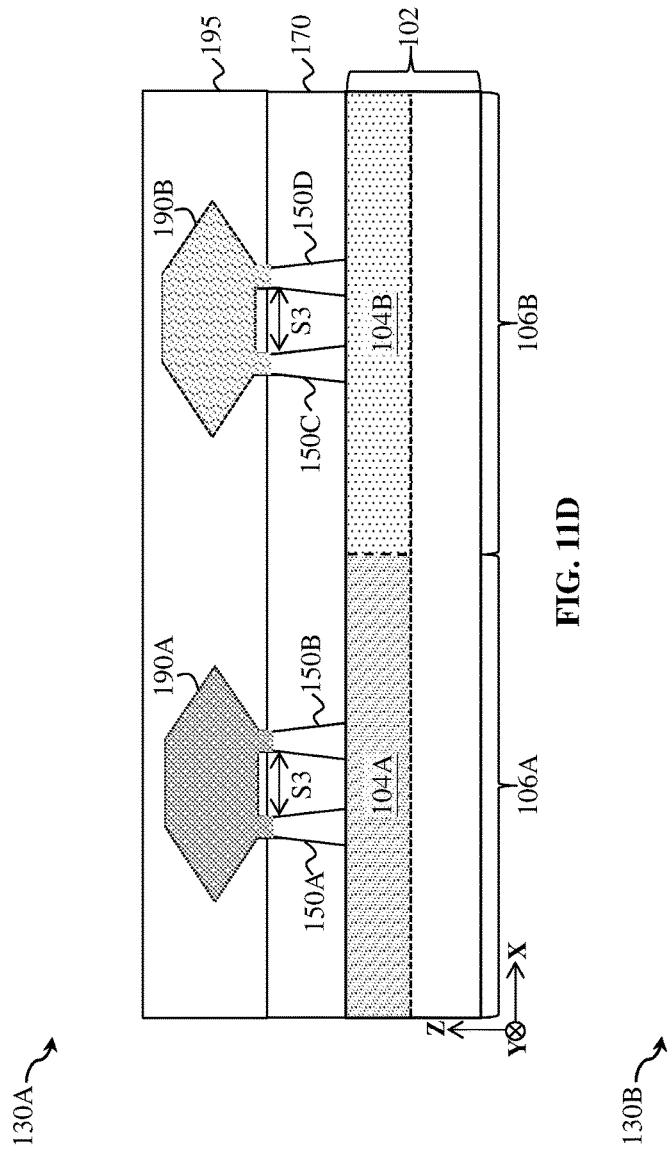
Figure 11E:
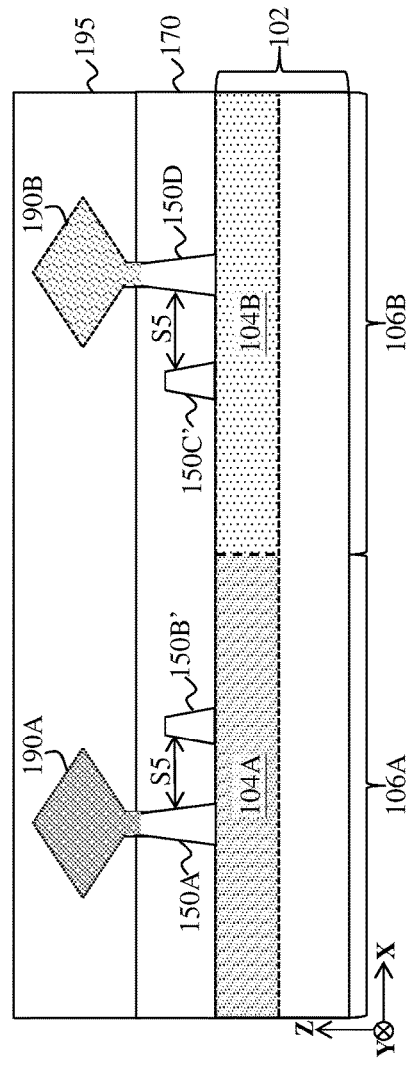
Figure 11F:
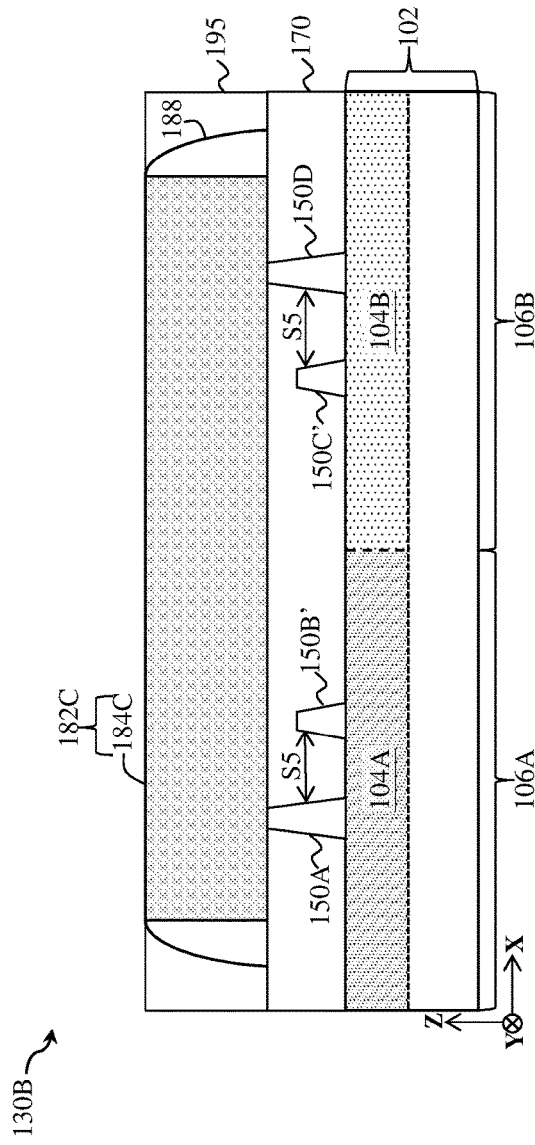
Figure 12F:
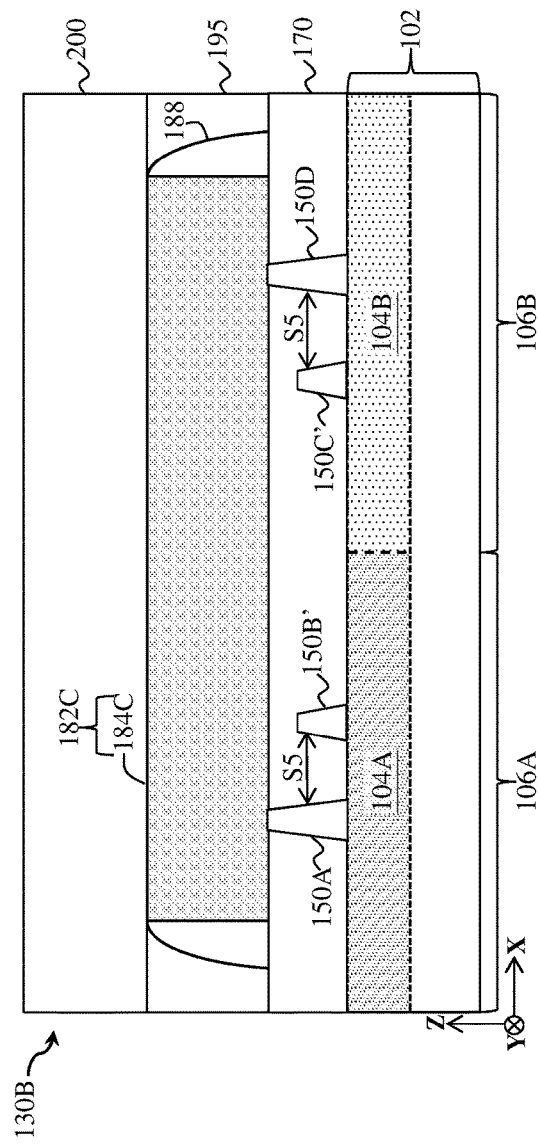
Figure 12A:
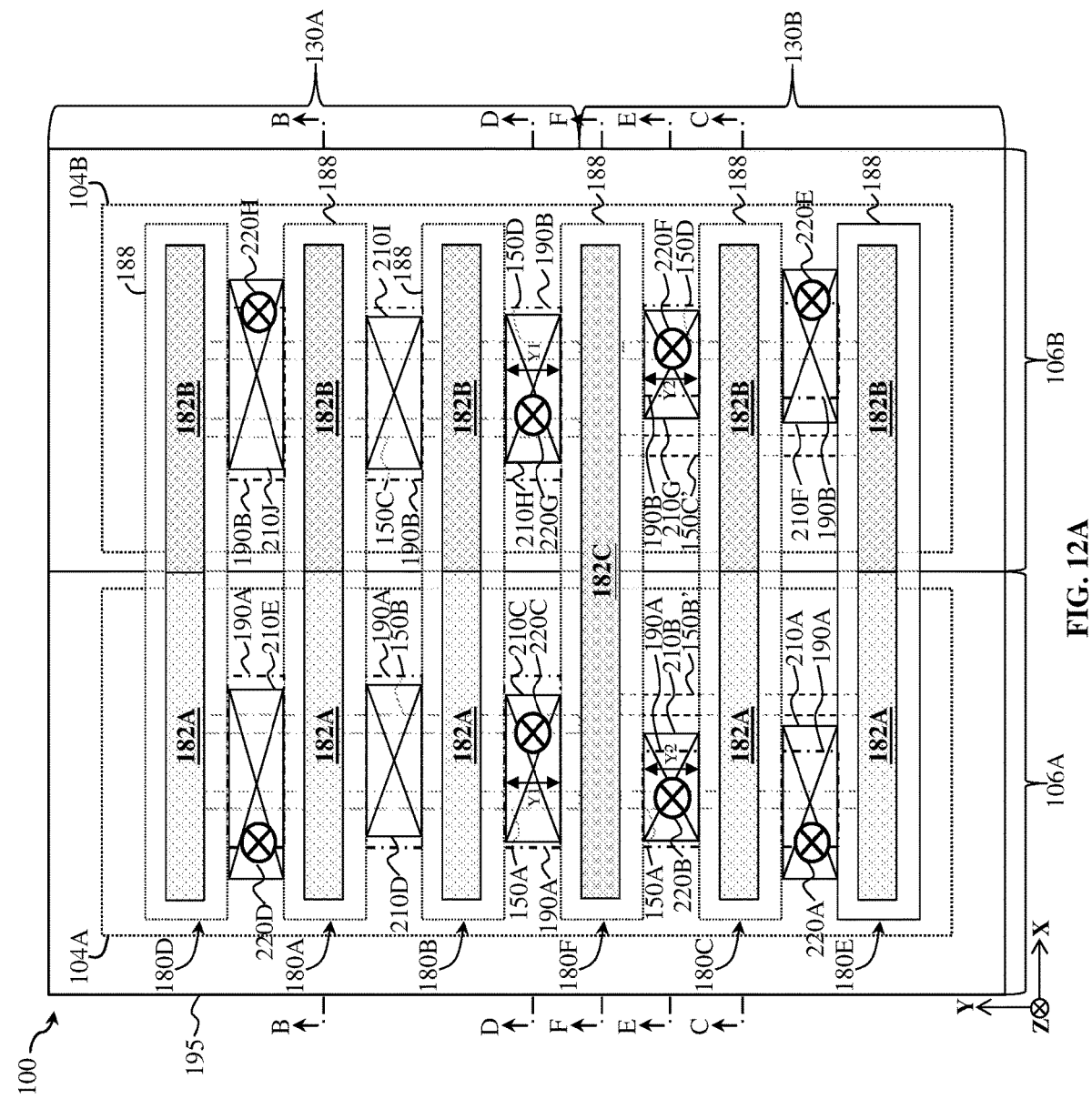
Figure 12B:
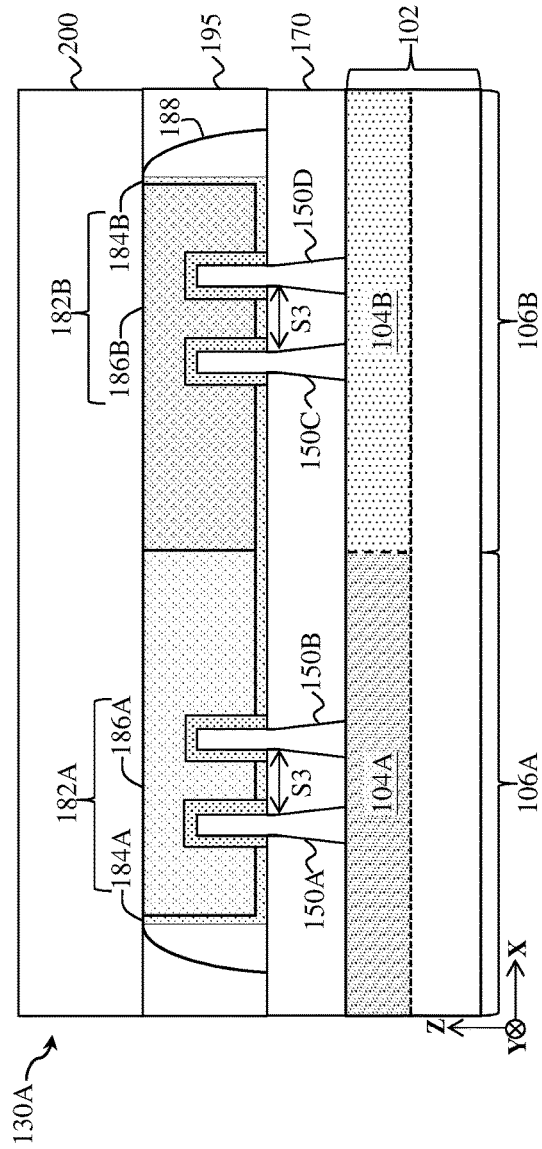
Figure 12C:
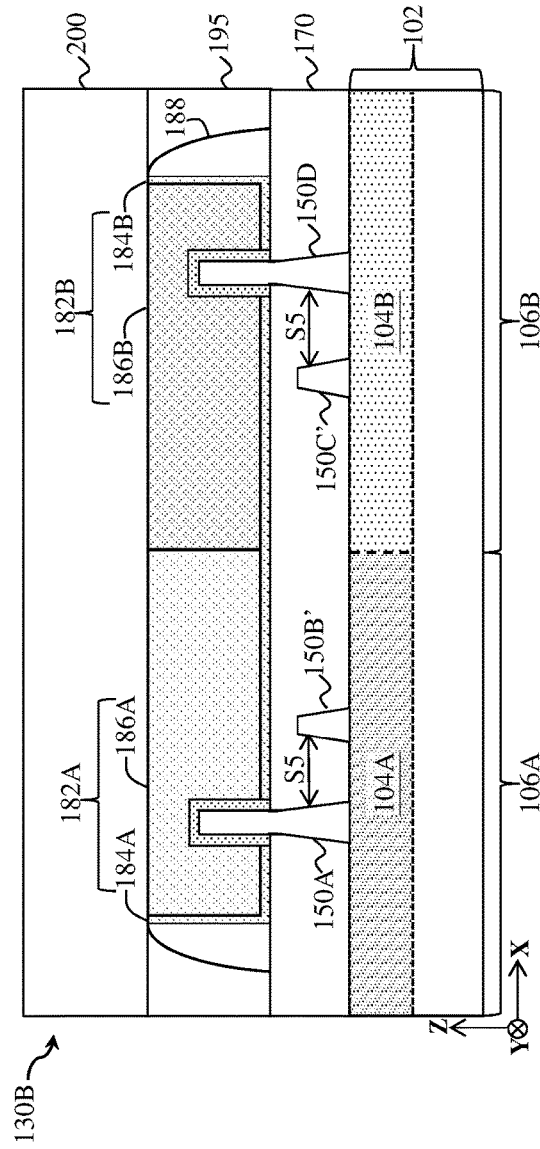

In furtherance of the depicted embodiment, since gate structure 180F is configured to achieve isolation between FinFETs of IC region 130A, 130B, gate structure 180F (dummy gate structure) is configured differently than gate structures 180D, 180E (dummy gate structures) and gate structures 180A-180C (active gate structures). For example, gate structure 180F has a gate stack 182C that includes a gate dielectric 184C. Gate dielectric 184C includes a dielectric material, such as silicon oxide, silicon nitride, silicon carbide, silicon oxynitride, silicon oxycarbonitride, other suitable dielectric material for isolation (for example, including silicon, oxygen, nitrogen, carbon, or other suitable isolation constituent), or combinations thereof. Gate dielectric 184C can include a single dielectric layer or multiple dielectric layers depending on design requirements of IC device 100. In some implementations, gate dielectric 184C includes a low-k dielectric material and/or a high-k dielectric material, such as those described herein (including, but not limited to, $SiO_2$, SiOC, SiON, SiOCN, a carbon-comprising oxide, a nitrogen-comprising oxide, a metal-comprising oxide, hafnium oxide (for example, $HfO_2$), tantalum oxide (for example, $Ta_2O_5$), titanium oxide (for example, $TiO_2$), zirconium oxide (for example, $ZrO_2$), aluminum oxide ($Al_2O_3$), yttrium oxide (for example, $Y_2O_3$), other suitable dielectric material, or combinations thereof). In some implementations, gate dielectric 184C is free of metal material, such as that found in gate electrodes 186A, 186B. Gate dielectric 184C is formed by various processes, such as ALD, CVD, PVD, and/or other suitable process, such as described herein. In the depicted embodiment, FinFETs in IC region 130A are also physically isolated from FinFETs in IC region 130B. For example, upper fin active regions of fins 150A-150D are removed underlying gate stack 182C, such that upper fin active regions of fins 150A-150D do not extend uninterrupted between IC regions 130A, 130B. In some implementations, fins 150A-150D are etched back to remove upper fin active regions of fins 150A-150D during a gate replacement process. For example, upper fin active regions of fins 150A-150D are removed when the dummy gate is removed from gate structure 180F (for example, while removing a dummy gate dielectric). Referring to FIG. 11A and FIG. 11F, upper fin active regions of fins 150A, 150D of the two-fin p-type FinFET and two-fin n-type FinFET of IC region 130A are not physically connected respectively to upper fin active regions of fins 150A, 150D of the single-fin p-type FinFET and the single-fin n-type FinFET of IC region 130B. Accordingly, in contrast to gate dielectrics 184A, 184B that wrap upper fin active regions of respective fins 150A, 150D, gate dielectric 184C is conformally disposed over isolation layer 170 and top surfaces of portions of fins 150A, 150D that are surrounded by isolation layer 170, such that gate dielectric 184C has a substantially uniform thickness. In some implementations, a portion of upper fin active regions of fins 150A, 150D may remain underlying gate stack 182C, where a top surface of the remaining portion is lower than a top surface of the upper fin active regions of fins 150A, 150D of the two-fin FinFETs in IC region 130A and the single-fin FinFETs in IC region 130B. In such implementations, gate stack 182C can wrap the remaining portion of upper fin active regions of fins 150A, 150D (for example, top surfaces and sidewall surfaces).

Gate structures 180A-180F are fabricated according to a gate last process, a gate first process, or a hybrid gate last/gate first process. In gate last process implementations, gate structures 180A-180F include dummy gate stacks that are subsequently replaced with gate stacks 182A, gate stacks 182B, and/or gate stacks 182C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which gate stacks 182A-182C are formed. In some implementations, the dummy gate stacks are formed before forming an interlayer dielectric layer, and the dummy gate stacks are replaced with gate stacks 182A-182C after forming the interlayer dielectric layer. In some implementations, dummy gate stacks remain in one or more of gate structures 180A-180F, such that one or more of gate structures 180A-180F include a polysilicon gate. Gate last processes and/or gate first processes can implement deposition processes, lithography processes, etching processes, other suitable processes, or combinations thereof. The deposition processes include CVD, PVD, ALD, high density plasma CVD (HDPCVD), metal organic CVD (MOCVD), remote plasma CVD (RPCVD), PECVD, LPCVD, atomic layer CVD (ALCVD), atmospheric pressure CVD (APCVD), plating, other suitable methods, or combinations thereof. The lithography processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof.

Gate structures 180A-180F further include respective gate spacers 188 disposed adjacent to (for example, along sidewalls of) gate stacks 182A-182C. Gate spacers 188 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and gate stacks 182A-182C and subsequently anisotropically etched to form gate spacers 188. In some implementations, gate spacers 188 include a multi-layer structure, such as a first dielectric layer that includes silicon nitride and a second dielectric layer that includes silicon oxide. In some implementations, gate spacers 188 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 102 and gate stacks 182A-182C and subsequently anisotropically etched to form a first spacer set adjacent to the gate stacks, and a second dielectric layer including silicon and nitrogen can be deposited over substrate 102 and gate stacks 182A-182C and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown) in source/drain (S/D) regions of fins 150A-150D before and/or after forming gate spacers 188.

Source features and drain features (referred to as source/drain features) are formed in source/drain regions of fins 150A-150D. For example, semiconductor material is epitaxially grown on fins 150A-150D, forming epitaxial source/drain features 190A on fins 150A-150D in p-type FinFET region 106A and epitaxial source/drain features 190B on fins 150A-150D in n-type FinFET region 106B. In the depicted embodiment, a fin recess process (for example, an etch back process) is performed on source/drain regions of fins 150A-150D, such that epitaxial source/drain features 190A and epitaxial source/drain features 190B are grown from bottom portions of fins 150A-150D. In some implementations, source/drain regions of fins 150A-150D are not subjected to a fin recess process, such that epitaxial source/drain features 190A, 190B are grown from and wrap at least a portion of upper fin active regions of fins 150A-150D. In furtherance of the depicted embodiment, epitaxial source/drain features 190A, 190B extend (grow) laterally along the x-direction (in some implementations, substantially perpendicular to fins 150A-150D), such that epitaxial source/drain features 190A, 190B are merged epitaxial source/drain features that span more than one fin (for example, epitaxial source/drain features 190A span fin 150A and fin 150B in IC region 130A and epitaxial source/drain features 190B span fin 150C and fin 150D in IC region 130B). In some implementations, epitaxial source/drain features 190A and/or epitaxial source/drain features 190B include partially merged portions (with interruption (or gaps) between epitaxial material grown from adjacent fins 150A-150D) and/or fully merged portions (without interruption (or gaps) between epitaxial material grown from adjacent fins 150A-150D).

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 150A-150D. Epitaxial source/drain features 190A, 190B are doped with n-type dopants and/or p-type dopants. In the depicted embodiment, epitaxial source/drain features 190A, 190B are configured depending on a type of FinFET fabricated in their respective FinFET device region. For example, in p-type FinFET region 106A, epitaxial source/drain features 190A can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in n-type FinFET region 106B, epitaxial source/drain features 190B can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, an Si:As epitaxial layer, or an Si:C:P epitaxial layer). In some implementations, epitaxial source/drain features 190A, 190B include materials and/or dopants that achieve desired tensile stress and/or compressive stress in the channel regions. In some implementations, epitaxial source/drain features 190A, 190B are doped during deposition by adding impurities to a source material of the epitaxy process. In some implementations, epitaxial source/drain features 190A, 190B are doped by an ion implantation process subsequent to a deposition process. In some implementations, annealing processes are performed to activate dopants in epitaxial source/drain features 190A, epitaxial source/drain features 190B, and/or other source/drain features of IC device 100, such as HDD regions and/or LDD regions.

An interlevel dielectric (ILD) layer 195 is formed over substrate 102, particularly over epitaxial source/drain features 190A, 190B, gate structures 180A-180F, and fins 150A-150D. In some implementations, ILD layer 195 is a portion of a multilayer interconnect (MLI) feature that electrically couples various devices (for example, transistors, resistors, capacitors, and/or inductors) and/or components (for example, gate structures and/or source/drain features) of IC device 100, such that the various devices and/or components can operate as specified by design requirements of IC device 100. ILD layer 195 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 195 has a multilayer structure having multiple dielectric materials. In some implementations, a contact etch stop layer (CESL) is disposed between ILD layer 195 and epitaxial source/drain features 190A, 190B, fins 150A-150D, and/or gate structures 180A-180F. The CESL includes a material different than ILD layer 195, such as a dielectric material that is different than the dielectric material of ILD layer 195. In the depicted embodiment, where ILD layer 195 includes a low-k dielectric material, the CESL includes silicon and nitrogen (for example, silicon nitride or silicon oxynitride). ILD layer 195 and/or the CESL are formed over substrate 102, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 195 is formed by a flowable CVD (FCVD) process that includes, for example, depositing a flowable material (such as a liquid compound) over substrate 102 and converting the flowable material to a solid material by a suitable technique, such as thermal annealing and/or ultraviolet radiation treating. Subsequent to the deposition of ILD layer 195 and/or the CESL, a CMP process and/or other planarization process is performed until reaching (exposing) top surfaces of gate stacks 182A-182F.

Turning to FIGS. 12A-12F, IC device 100 can undergo further processing. In some implementations, various contacts of the MLI feature are formed to source/drain regions and/or gate structures of IC device 100 to facilitate operation of IC device 100. The MLI feature includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation of IC device 100, the interconnect features are configured to route signals between the devices (here, the p-type FinFETs of p-type FinFET region 106A and the n-type FinFETs of n-type FinFET region 106B) and/or the components of IC device 100 and/or distribute signals (for example, clock signals, voltage signals, and/or ground signals) to the devices and/or the components of IC device 100. The present disclosure contemplates the MLI feature including any number and/or configuration of dielectric layers and/or conductive layers depending on design requirements of IC device 100.

The MLI feature can include additional ILD layers formed over substrate 102. In the depicted embodiment, an ILD layer 200, which is a portion of the MLI feature, is disposed over ILD layer 195 and gate structures 180A-180F. ILD layer 200 is similar to ILD layer 195. In some implementations, ILD layer 200 is a first level ILD of the MLI feature (for example, ILD-1). In some implementations, a CESL is disposed between ILD layer 200 and ILD layer 195, which is similar to the CESLs described herein. In furtherance of the depicted embodiment, device-level contacts 210A-210J, vias 220A-220H, and conductive lines (not shown) (collectively referred to as a metal layer, such as a metal one (M1) layer, of the MLI feature) are disposed in the ILD layers of the MLI feature to form interconnect structures. Device-level contacts 210A-210J, vias 220A-220H, and conductive lines include any suitable electrically conductive material, such as Ta, Ti, Al, Cu, Co, Ru, W, TiN, TaN, other suitable conductive materials, or combinations thereof. Various conductive materials can be combined to provide device-level contacts 210A-210J, vias 220A-220H, and/or conductive lines with various layers, such as one or more barrier layers, adhesion layers, liner layers, bulk layers, other suitable layers, or combinations thereof. In some implementations, device-level-contacts 210A-210J include Ti, TiN, and/or Co; vias 220A-220H include Ti, TiN, and/or W; and conductive lines include Cu, Co, and/or Ru. Device-level contacts 210A-210J, vias 220A-220H, and conductive lines are formed by patterning ILD layer 195, ILD layer 200, and/or other ILD layers of the MLI feature. Patterning the ILD layers can include lithography processes and/or etching processes to form openings (trenches), such as contact openings, via openings, and/or line openings in respective ILD layers. In some implementations, the lithography processes include forming a resist layer over respective ILD layers, exposing the resist layer to patterned radiation, and developing the exposed resist layer, thereby forming a patterned resist layer that can be used as a masking element for etching opening(s) in respective ILD layers. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the ILD layers (for example, ILD layer 200), device-level contacts 210A-210J, vias 220A-220H, and/or conductive lines.

Device-level contacts 210A-210J (also referred to as local interconnects or local contacts) electrically couple and/or physically couple IC device features, such as features of the p-type FinFETs of p-type FinFET region 106A and the n-type FinFETs of n-type FinFET region 106B to the MLI feature. For example, device-level contacts 210A-210J are metal-to-device (MD) contacts, which generally refer to contacts to a conductive region, such as source/drain regions, of IC device 100. Device-level contacts 210A-210E are disposed on respective epitaxial source/drain features 190A, such that device-level contacts 210A-210E physically (or directly) connect the source/drain regions of the p-type FinFETs of p-type FinFET region 106A to the MLI feature (for example, to respective vias 220A-220D); and device-level contacts 210F-210J are disposed on respective epitaxial source/drain features 190B, such that device-level contacts 210F-210J physically (or directly) connect the source/drain regions of the n-type FinFETs of n-type FinFET region 106B to the MLI feature (for example, to respective vias 220E-220H). Vias 220A-220D are disposed respectively on device-level contacts 210A-210C and device-level contact 210E, such that vias 220A-220D physically (or directly) respectively connect device-level contacts 210A-210C and device-level contact 210E to a conductive line of the MLI feature; and vias 220E-220H are disposed respectively on device-level contacts 210F-210H and device-level contact 210J, such that vias 220E-220H physically (or directly) respectively connect device-level contacts 210F-210H and device-level contact 210J to a conductive line of the MLI feature. Device-level contacts 210A-210J and vias 220A-220H extend through ILD layer 200 and/or ILD layer 195, though the present disclosure contemplates embodiments where device-level contacts 210A-210J and vias 220A-220H extend through more or less ILD layers and/or CESLs of the MLI feature. The present disclosure contemplates any configuration of device-level contacts, vias, and/or conductive lines.

In some implementations, the MLI feature includes a device-level contact that is a gate contact (CG) or metal-to-poly (MP) contact, which generally refers to a contact to a gate structure, such as a poly gate structure or a metal gate structure of IC device 100. Such device-level contacts electrically couple and/or physically couple one or more of gate structures 180A-180F to the MLI feature. In some implementations, one or more of gate structures 180A-180F have a device-level contact disposed thereon, such that the device-level contact physically (or directly) respectively connects the respective one of gate structures 180A-180F to the MLI feature (for example, to respective vias). In some implementations, the MLI feature includes vias that electrically couple and/or physically couple one or more of gate structures 180A-180F to the MLI feature. In such implementations, the vias are disposed on gate structures 180A-180F or the device-level contacts connected to the one or more of gate structures 180A-180F, such that the vias physically (or directly) and/or electrically connect respective gate structures 180A-180F to the MLI feature (for example, to respective conductive lines). Device-level contacts and vias to gate structures 180A-180F extend through ILD layer 200 and/or ILD layer 195, though the present disclosure contemplates embodiments where such device-level contacts and vias extend through more or less ILD layers and/or CESLs of the MLI feature.

In some implementations, silicide layers are disposed between epitaxial source/drain features 190A, 190B and device-level contacts 215A-215D. In some implementations, silicide layers 230 are formed by depositing a metal layer over epitaxial source/drain features 190A, 190B before or after forming ILD layer 195 and/or ILD layer 200. The metal layer includes any material suitable for promoting silicide formation, such as nickel, platinum, palladium, vanadium, titanium, cobalt, tantalum, ytterbium, zirconium, other suitable metal, or combinations thereof. IC device 100 is then heated (for example, subjected to an annealing process) to cause constituents of epitaxial source/drain features 190A, 190B (for example, silicon and/or germanium) to react with the metal. Silicide layers 230 thus include metal and a constituent of epitaxial source/drain features 190A, 190B (for example, silicon and/or germanium). In some implementations, silicide layers 230 include nickel silicide, titanium silicide, or cobalt silicide. Any un-reacted metal, such as remaining portions of the metal layer, is selectively removed by any suitable process, such as an etching process. In some implementations, silicide layers 230 and epitaxial source/drain features 190A, 190B are collectively referred to as the epitaxial source/drain features. In some implementations, silicide layers 230 are considered a portion of device-level contacts 215A-215D.

In FIGS. 12A-12F, IC region 130A is a first circuit that includes a CMOS FET that includes a two-fin p-type FinFET in p-type FinFET region 106A and a two-fin n-type FinFET in n-type FinFET region 106B, and IC region 130B is a second circuit that includes a CMOS FET that includes a single-fin p-type FinFET in p-type FinFET region 106A and a single-fin n-type FinFET in n-type FinFET region 106B. The two-fin p-type FinFET includes gate structure 180B disposed over a channel region of fins 150A, 150B, such that gate structure 180B is disposed between source/drain regions of fins 150A, 150B; and the two-fin n-type FinFET includes gate structure 180B disposed over a channel region of fins 150C, 150D, such that gate structure 180B is disposed between source/drain regions of fins 150C, 150D. Epitaxial source/drain features 190A are disposed over source/drain regions of fins 150A, 150B, and epitaxial source/drain features 190B are disposed over source/drain regions of fins 150C, 150D. The single-fin p-type FinFET includes gate structure 180C disposed over a channel region of fin 150A, such that gate structure 180C is disposed between source/drain regions of fin 150A; and the single-fin n-type FinFET includes gate structure 180C disposed over a channel region of fin 150D, such that gate structure 180C is disposed between source/drain regions of fin 150D. Epitaxial source/drain features 190A are disposed over source/drain regions of fin 150A, and epitaxial source/drain features 190B are disposed over source/drain regions of fin 150D. In the depicted embodiment, IC device 100 is configured such that via 220A and device-level contact 210A are connected to a source node of the single-fin p-type FinFET, via 220B and device-level contact 210B are connected to a drain node of the single-fin p-type FinFET, via 220C and device-level contact 210C are connected to a drain node of the two-fin p-type FinFET, via 220D and device-level contact 210E are connected to a source node of the two-fin p-type FinFET, via 220E and device-level contact 210F are connected to a source node of the single-fin n-type FinFET, via 220F and device-level contact 210G are connected to a drain node of the single-fin n-type FinFET, via 220G and device-level contact 210H are connected to a drain node of the two-fin n-type FinFET, and via 220H and device-level contact 210J are connected to a source node of the two-fin n-type FinFET. In such configuration, the first circuit is disposed directly adjacent to and abuts the second circuit, and gate structure 180F isolates drain nodes of the two-fin FinFETs in the first circuit from drain nodes of the single-fin FinFETs in the second circuit. IC device 100 is further configured with source nodes of the p-type FinFETs in p-type FinFET region 106A electrically connected to a power supply voltage $V_{DD}$ (in some implementations, configured as a positive supply voltage) vias 220A, 220D and device-level contacts 210A, 210E and source nodes of the n-type FinFETs in n-type FinFET region 106B electrically connected to a power supply voltage $V_{SS}$ (in some implementations, configured as ground and/or a negative supply voltage) by vias 220E, 220H and device-level contacts 210F, 210J. Gate structure 180D isolates the two-fin p-type FinFET and the two-fin n-type FinFET in IC region 130A from other adjacent circuits of IC device 100, gate structure 180E isolates the single-fin p-type FinFET and the single-fin n-type FinFET in IC region 130B from other adjacent circuits of IC device 100, and gate structure 180F isolates the two-fin p-type FinFET and the two-fin n-type FinFET in IC region 130A respectively from the single-fin p-type FinFET and the single-fin n-type FinFET in IC region 130B.

In some implementations, contacts to the drain nodes of the two-fin FinFETs are configured differently than contacts to the drain nodes of the single-fin FinFETs. In FIGS. 12A-12F, device-level contacts 210C, 210H to the drain nodes of the two-fin FinFETs and device-level contacts 210B, 210G to the drain nodes of the single-fin FinFETs have rectangular-shaped cross-sections in an x-y plane, such that device-level contacts 210C, 210H to the drain nodes of the two-fin FinFETs and device-level contacts 210B, 210G to the drain nodes of the single-fin FinFETs have a length along the x-direction (and substantially parallel to a gate length direction) and a width along the y-direction (and substantially parallel to a fin length direction). In some implementations, device-level contacts 210C, 210H have a length X1 and a width Y1, and device-level contacts 210B, 210G have a length X2 and a width Y2, where length X1 is greater than length X2. It has been observed that implementing longer contacts for two-fin FinFET devices, which have higher on-current ($I_{on}$), reduces contact resistance, while implementing shorter contacts for single-fin FinFET devices, which have lower on-current ($I_{on}$) and often serve low power and/or low speed circuits, lowers capacitance (for example, contact to gate) that enables power reduction. In some implementations, a ratio of length X1 to length X2 is about 1.1 to about 1.6 (1.1≤X1:X2≤1.6.), and width Y1 is substantially the same as width Y2. In some implementations, the ratio of length X1 to length X2 is about 1.1 to about 1.6 (1.1≤X1:X2≤1.6.), and width Y1 is less than width Y2. In such implementations, a ratio of width Y2 to width Y1 can be about 1.05 to about 1.1 (1.05≤Y2:Y1≤1.1). In some implementations, a maximum width of device-level contacts 210C, 210H is greater than a maximum width of device-level contacts 210B, 210G by at least 10% (in other words, Y2≤0.9*Y1).

In some implementations, the first circuit (IC region 130A) and the second circuit (IC region 130B) are each a standard cell having a predetermined function. For example, the transistors and interconnect (or routing) structures of the IC region 130A and/or IC region 130B can combine to provide a logic function (for example, AND, NAND, OR, NOR, NOT, XOR, and/or XNOR) and/or a storage function (for example, flip flop, latch, and/or buffer). Implementing the fin fabrication methods disclosed herein allows for IC device 100 to have a standard cell structure that arranges standard cells having even number of fins FinFETs (for example, two-fin FinFETs in IC region 130A) directly adjacent to and abutting standard cells having odd number of fins FinFETs (for example, single-fin FinFETs in IC region 130B), along with a standard cell structure that arranges standard cells configured for high speed applications directly adjacent to and abutting standard cells configured for low power consumption applications. Such standard cell structures enable SoC products that can offer high speed performance with low power consumption. In some implementations, the first circuit and the second circuit are a portion of a memory cell for storing a bit of data of a memory array, such as static random access memory (SRAM) array, which often incorporates FinFETs to enhance performance. In some implementations, the first circuit is in a core (logic) region of an IC device, and the second circuit is in an input/output (I/O) region of the IC device.

Figure 13:
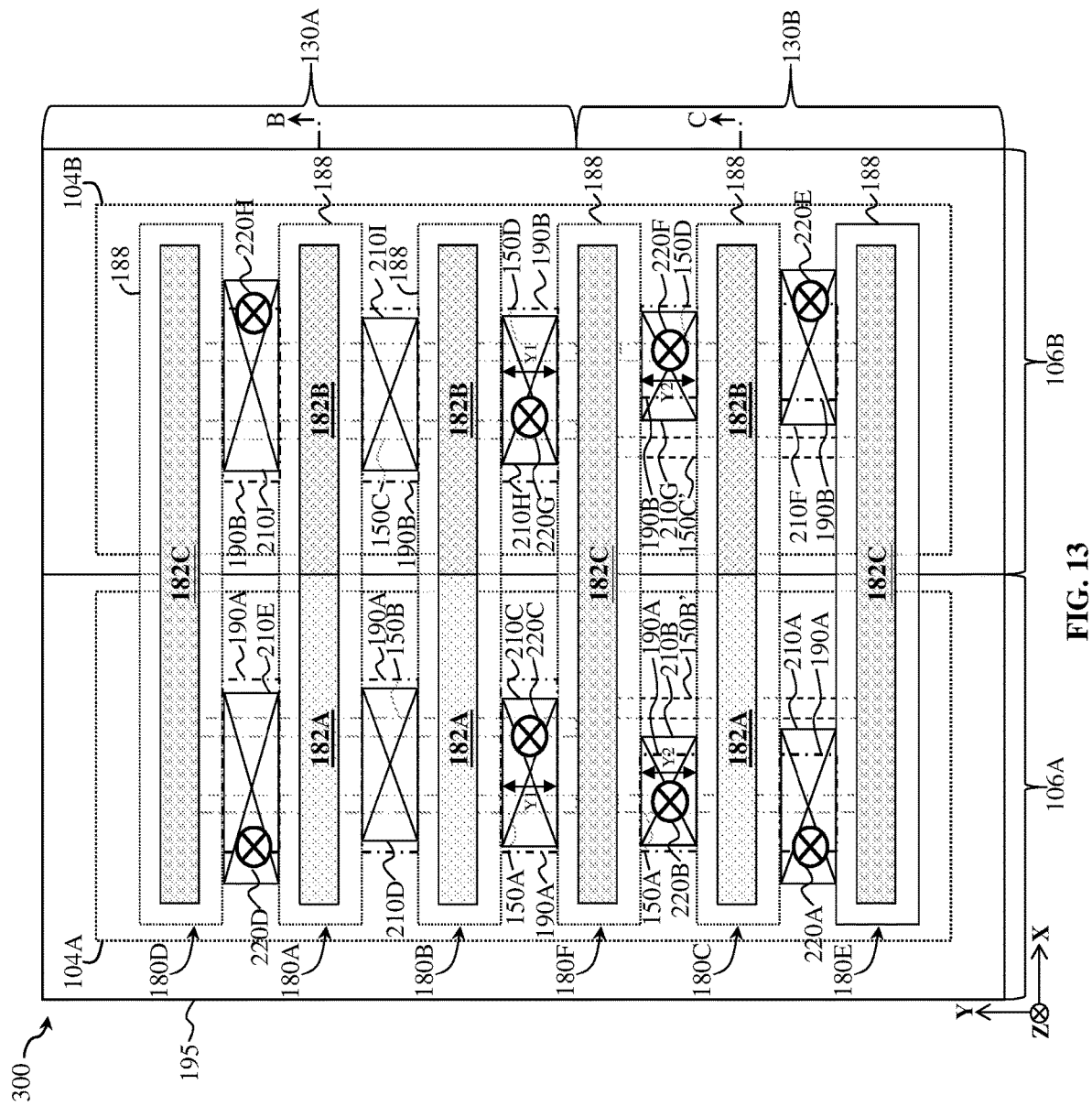
FIG. 13 is a simplified schematic top view of another IC device fabricated using the method of FIG. 1 according to various aspects of the present disclosure.

FIG. 13 is a simplified schematic top view of an IC device 300 (for example, in an x-y plane), in portion or entirety, according to various aspects of the present disclosure. IC device 300 is similar in many respects to IC device 100. Accordingly, similar features in FIG. 13 and FIGS. 12A-12F are identified by the same reference numerals for clarity and simplicity. In FIG. 13, IC device 300 has a different configuration of dummy gate structures than IC device 100. For example, gate structure 180D and gate structure 180E include gate stacks 182C that span p-type FinFET region 106A and n-type FinFET region 106B in IC device 300, instead of gate stacks 182A in p-type FinFET region 106A and n-type FinFET region 106B. Gate structure 180D electrically isolates source/drain regions of the two-fin FinFETs (which include gate structures 180A, 180B) in IC region 130A from other devices and/or regions of IC device 300. Gate structure 180E electrically isolates source/drain region of the single-fin FinFETs (which include gate structure 180C) in IC region 130B from other devices and/or regions of IC device 300. IC device 300 can be fabricated using the fabrication processes described herein with reference to FIG. 1, FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F. FIG. 13 has been simplified for the sake of clarity to better understand the inventive concepts of the present disclosure. Additional features can be added in IC device 300, and some of the features described below can be replaced, modified, or eliminated in other embodiments of IC device 300.

Figure 14:
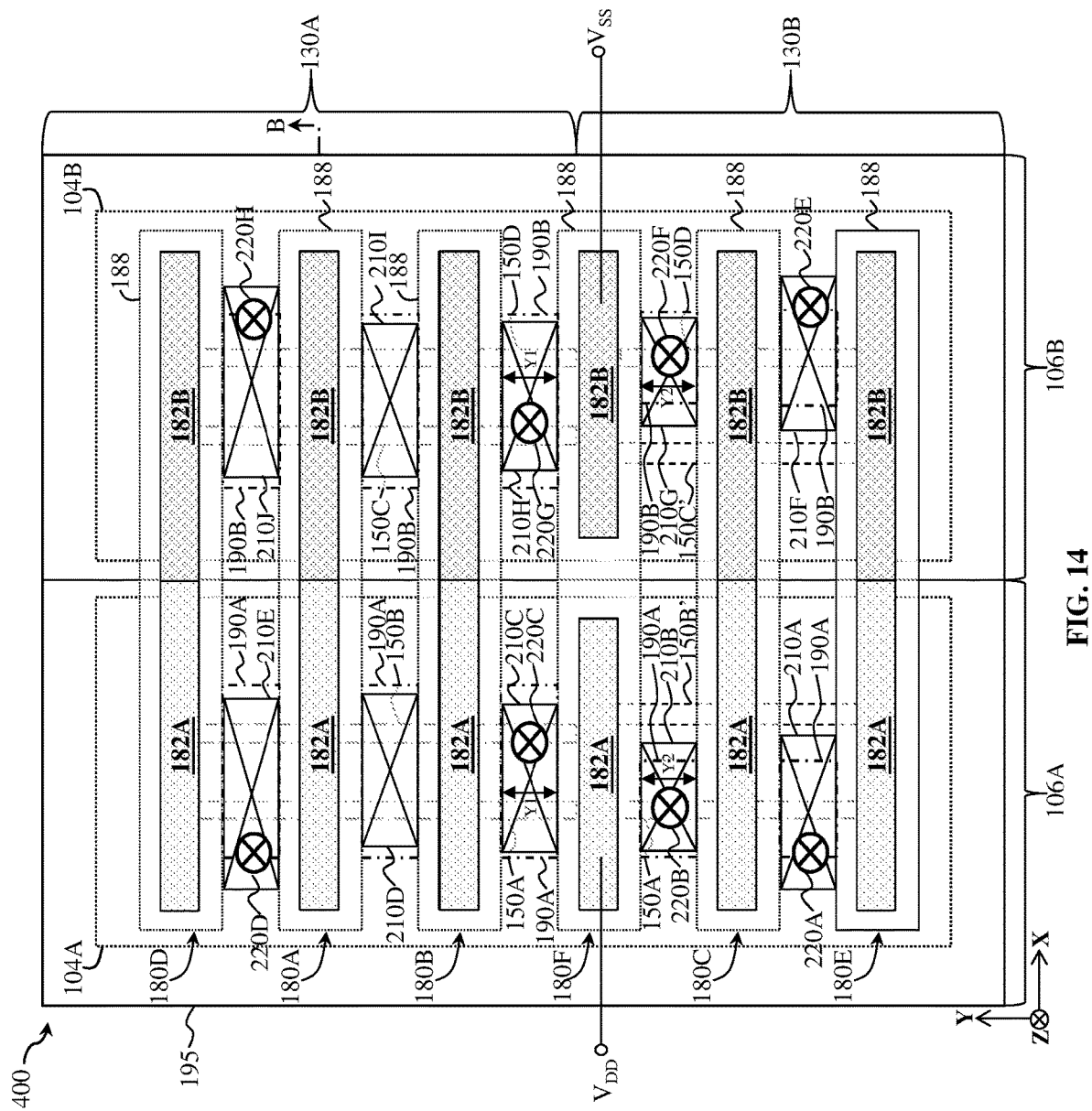
FIG. 14 is a simplified schematic top view of yet another IC device fabricated using the method of FIG. 1 according to various aspects of the present disclosure.

FIG. 14 is a simplified schematic top view of an IC device 400 (for example, in an x-y plane), in portion or entirety, according to various aspects of the present disclosure. IC device 400 is similar in many respects to IC device 100. Accordingly, similar features in FIG. 14 and FIGS. 12A-12F are identified by the same reference numerals for clarity and simplicity. In FIG. 14, IC device 400 has a different configuration of dummy gate structures than IC device 100. For example, dummy gate structure 180F includes gate stack 182A in p-type FinFET region 106A and gate stack 182B in n-type FinFET region 106B, instead of gate stack 182C spanning p-type FinFET region 106A and n-type FinFET region 106B. Gate stack 182A and gate stack 182B are surrounded by gate spacers 188, such that gate stack 182A and gate stack 182B are physically and electrically separated from each other. Gate stack 182A is electrically connected to a power supply voltage $V_{DD}$ (in some implementations, configured as a positive supply voltage), and gate stack 182B is electrically connected to a power supply voltage $V_{SS}$ (in some implementations, configured as ground and/or a negative supply voltage). Gate stack 182 and gate stack 182B are respectively electrically connected to power supply voltage $V_{DD}$ and power supply voltage $V_{SS}$ by device-level contacts (not shown), vias (not shown), and/or metal lines (not shown) of the MLI feature. In such configuration, IC device 400 includes isolation MOSFETs that electrically isolate the first circuit of IC region 130A from the second circuit of IC region 130B. For example, an isolation MOSFET in p-type FinFET region 106A includes a portion of gate structure 180F including gate stack 182A disposed over fins 150A, 150B, such that gate stack 182A is disposed between source/drain regions of fins 150A, 150B in IC region 130A and a source/drain region of fin 150A in IC region 130B. Epitaxial source/drain features 190A are disposed over source/drain regions of fins 150A, 150B in IC regions 130A, 130B. In some implementations, upper fin active region of fin 150A of the two-fin p-type FinFET is not physically isolated or separated from the upper fin active region of fin 150A of the single-fin p-type FinFET, such that that fin 150A extends continuously between IC regions 130A, 130B. In furtherance of the example, an isolation MOSFET in n-type FinFET region 106B includes a portion of gate structure 180F including gate stack 182B disposed over fins 150C, 150D, such that gate stack 182B is disposed between source/drain regions of fins 150C, 150D in IC region 130A and a source/drain region of fin 150D in IC region 130B. Epitaxial source/drain features 190B are disposed over source/drain regions of fins 150C, 150D in IC regions 130A, 130B. In some implementations, upper fin active region of fin 150D of the two-fin n-type FinFET is not physically isolated or separated from the upper fin active region of fin 150D of the single-fin n-type FinFET, such that that fin 150D extends continuously between IC regions 130A, 130B. IC device 400 can be fabricated using the fabrication processes described herein with reference to FIG. 1, FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F. FIG. 14 has been simplified for the sake of clarity to better understand the inventive concepts of the present disclosure. Additional features can be added in IC device 400, and some of the features described below can be replaced, modified, or eliminated in other embodiments of IC device 400.

Figure 15A:
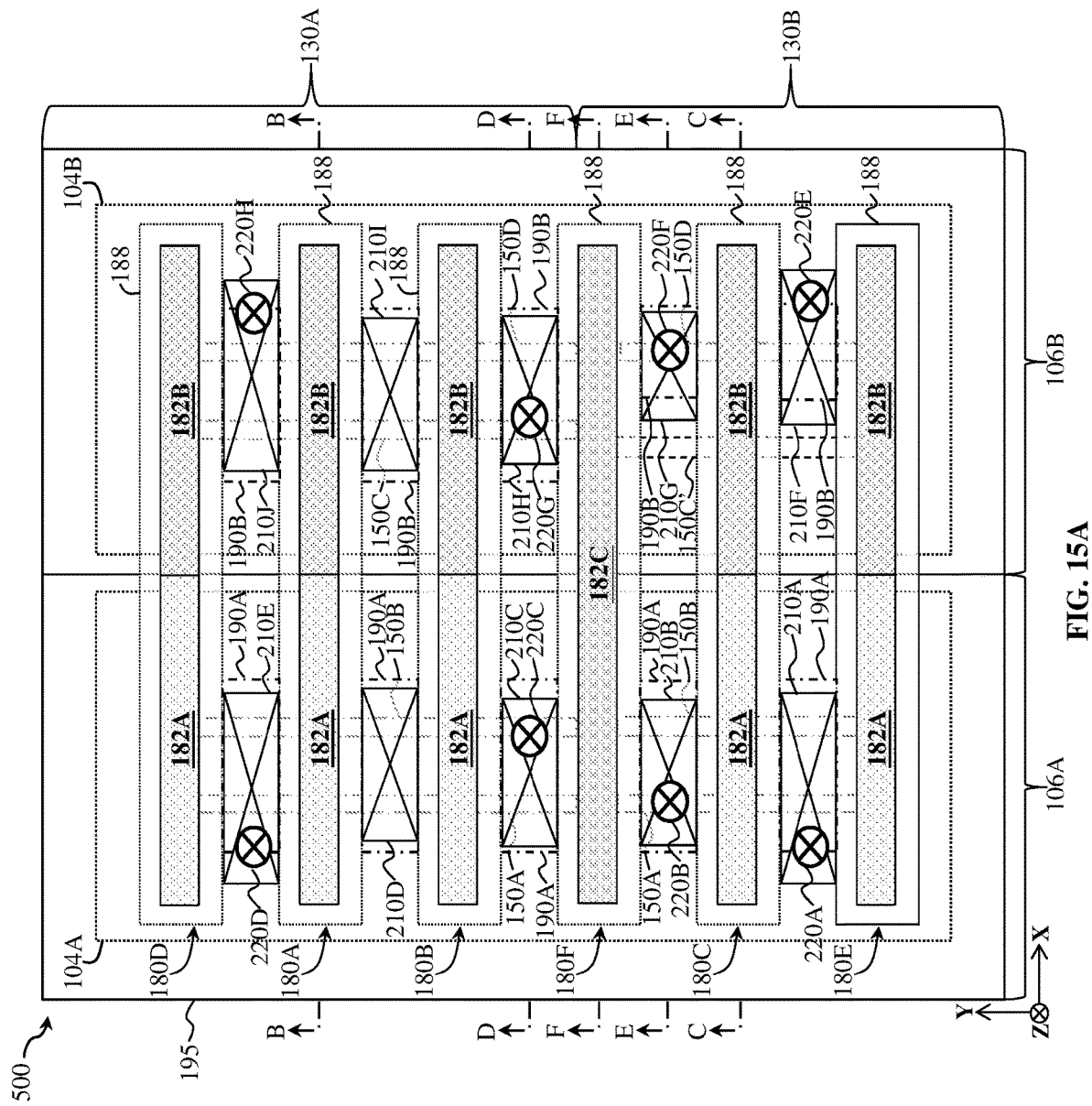
Figure 15B:
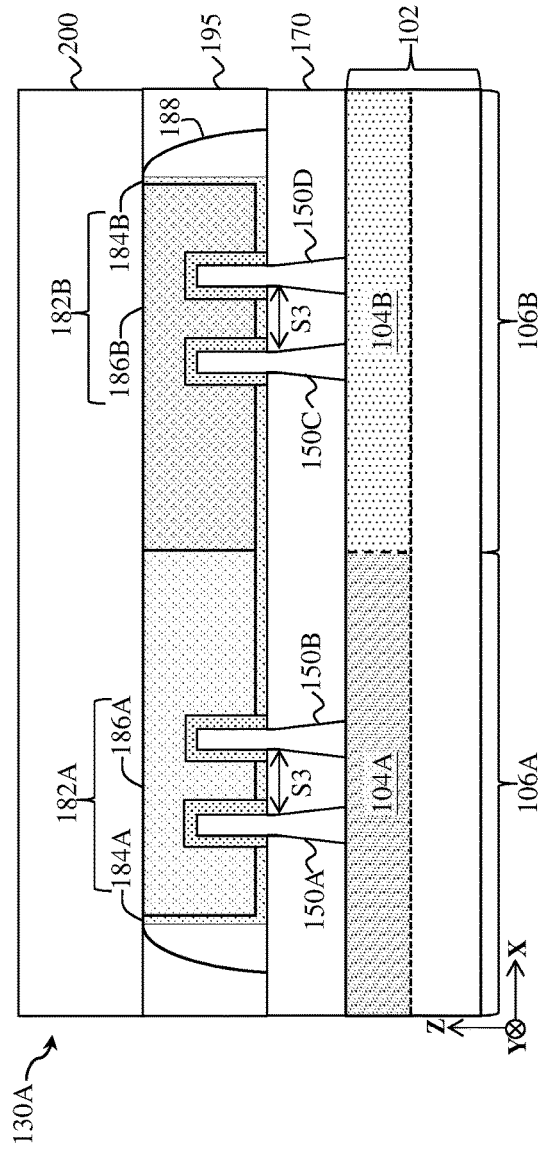
Figure 15C:
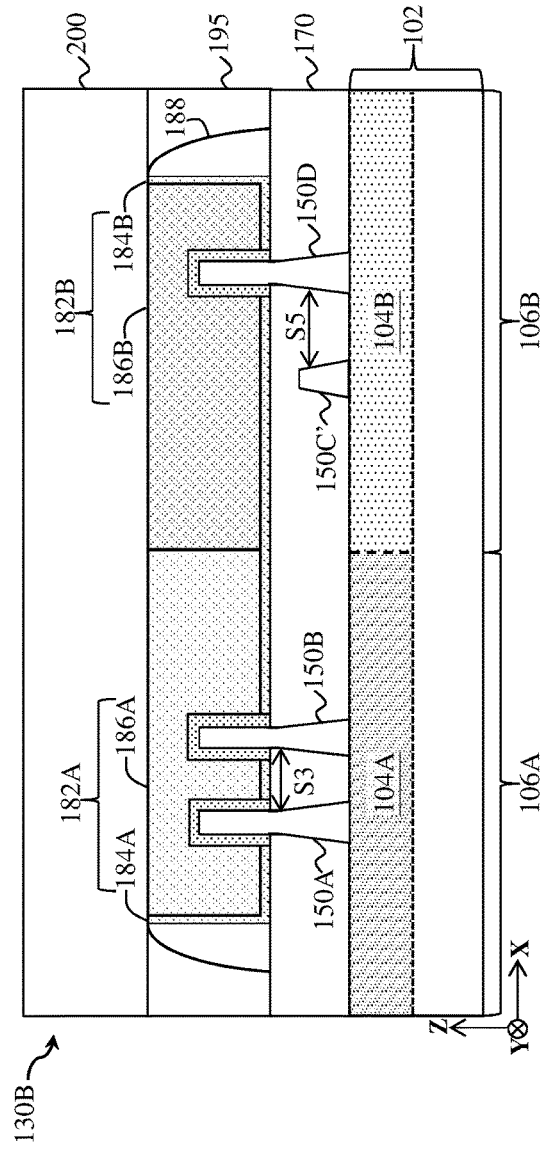
Figure 15F:
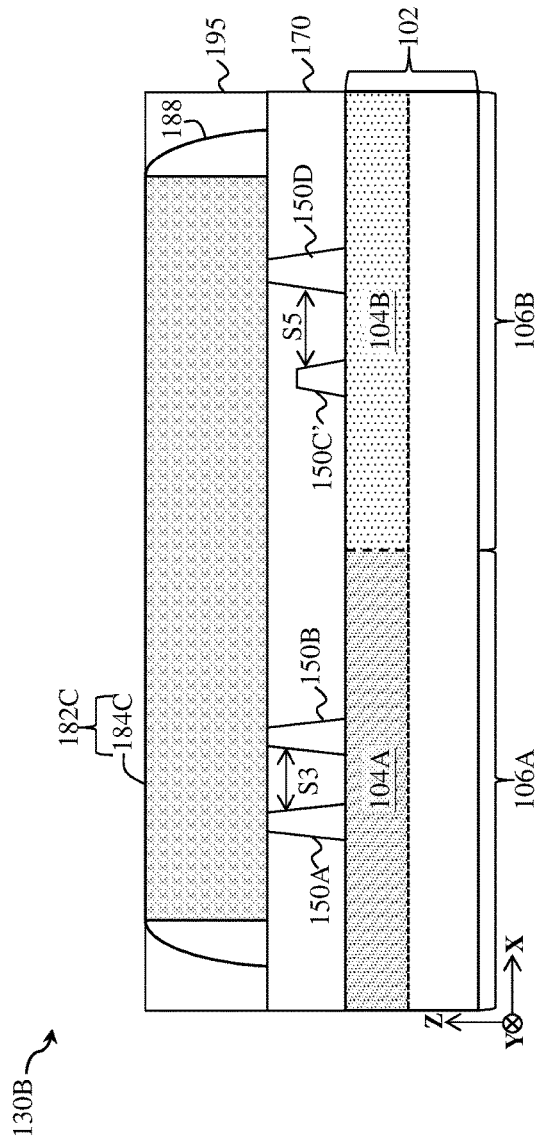

FIGS. 15A-15F are fragmentary diagrammatic views of an IC device 500, in portion or entirety, according to various aspects of the present disclosure. In particular, FIG. 15A is a simplified schematic top view of IC device 500; FIG. 15B is a diagrammatic cross-sectional view of IC device 500 along line B-B of FIG. 15A; FIG. 15C is a diagrammatic cross-sectional view of IC device 500 along line C-C of FIG. 15A; FIG. 15D is a diagrammatic cross-sectional view of IC device 500 along line D-D of FIG. 15A; FIG. 15E is a diagrammatic cross-sectional view of IC device 500 along line E-E of FIG. 15A; and FIG. 15F is a diagrammatic cross-sectional view of IC device 500 along line F-F of FIG. 15A. IC device 500 is similar in many respects to IC device 100. Accordingly, similar features in FIGS. 15A-15F and FIGS. 12A-12F are identified by the same reference numerals for clarity and simplicity. In FIGS. 15A-15F, IC device 500 has a different configuration of FinFETs than IC device 100. For example, in IC device 500, the second circuit of IC region 130B includes a CMOS FET that includes a two-fin p-type FinFET in p-type FinFET region 106A, instead of a single-fin p-type FinFET, and a single-fin n-type FinFET in n-type FinFET region 106B. The two-fin p-type includes gate structure 180C disposed over a channel region of fins 150A, 150B in IC region 130B, such that gate structure 180C is disposed between source/drain regions of fins 150A, 150B in IC region 130B. Epitaxial source/drain features 190A are disposed over the source/drain regions of fins 150A, 150B in IC region 130A. Device-level contacts 210A, 210B are also configured with different dimensions in IC device 500. For example, device-level contact 210A to the source node of the two-fin p-type FinFET in IC region 130B is configured similar as device-level contact 210E to the source node of the two-fin p-type FinFET in IC region 130A, and device-level contact 210B to the drain node of the two-fin p-type FinFET in IC region 130B is configured similar as device-level contact 210C to the drain node of the two-fin p-type FinFET in IC region 130A. For example, device-level contacts 210A, 210B span over and extend beyond fins 150A, 150B in IC region 130B. In some implementations, device-level contact 210B has a length that is substantially equal to length X1 of device-level contact 210C and a width that is substantially equal to width Y1 of device-level contact 210C. IC device 500 can be fabricated using the fabrication processes described herein with reference to FIG. 1, FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F. During fabrication, a width of dummy pattern 122 would be substantially the same between fin 150A and 150B in IC regions 130A, 130B, such that spacing between fins 150A, 150B in IC regions 130A, 130B is the same in p-type FinFET region 106A. For example, in p-type FinFET region 106A, fin 150A and fin 150B have spacing S3 in IC region 130A and IC region 130B. FIGS. 15A-15C have been simplified for the sake of clarity to better understand the inventive concepts of the present disclosure. Additional features can be added in IC device 500, and some of the features described below can be replaced, modified, or eliminated in other embodiments of IC device 500.

Figure 16F:
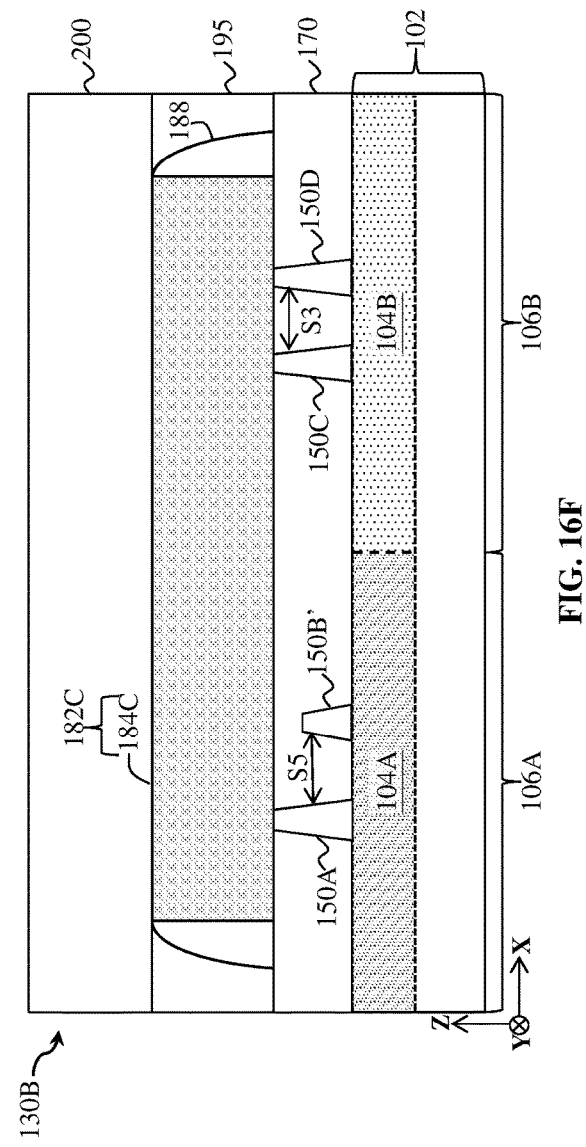
Figure 16A:
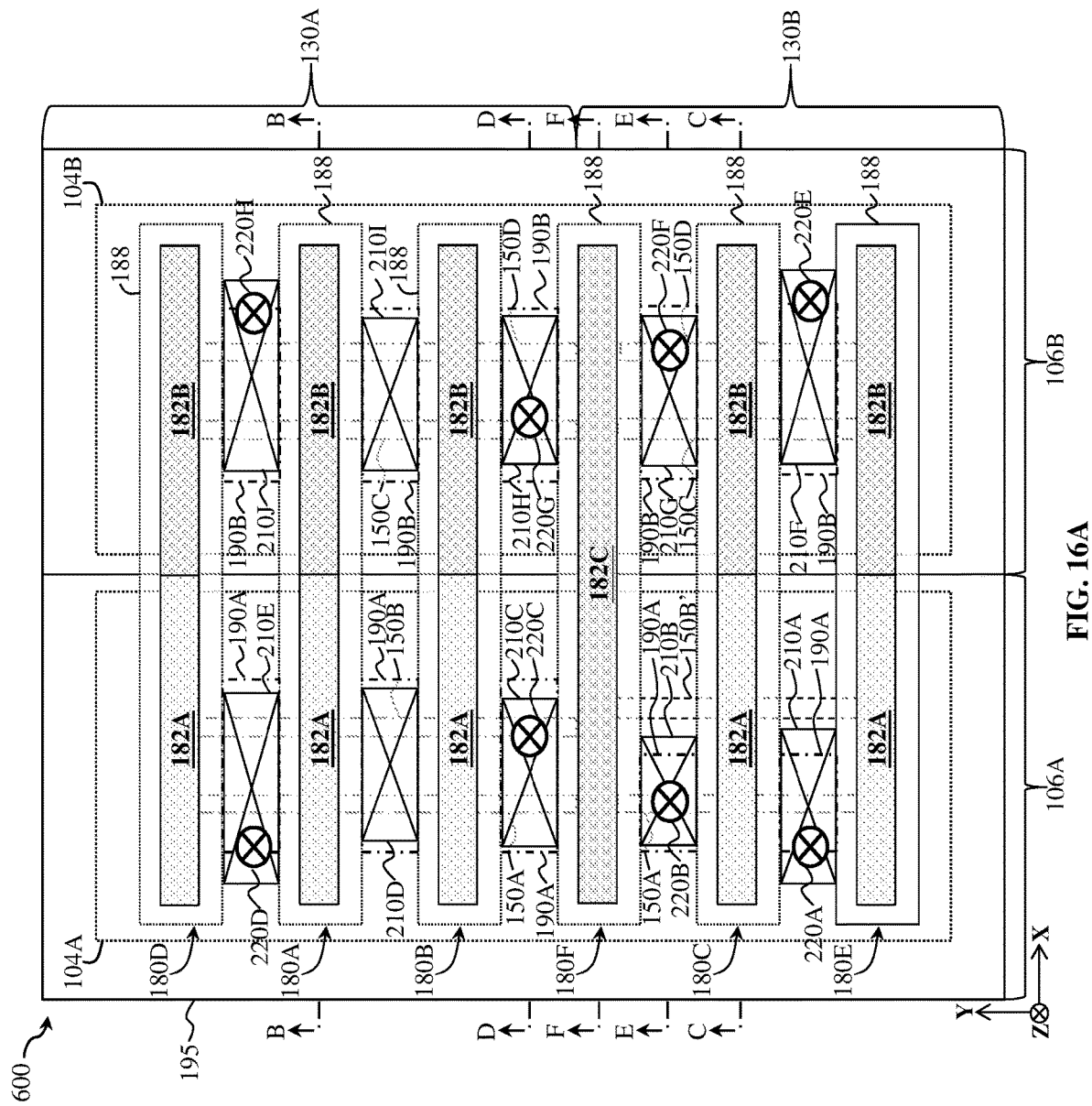
Figure 16B:
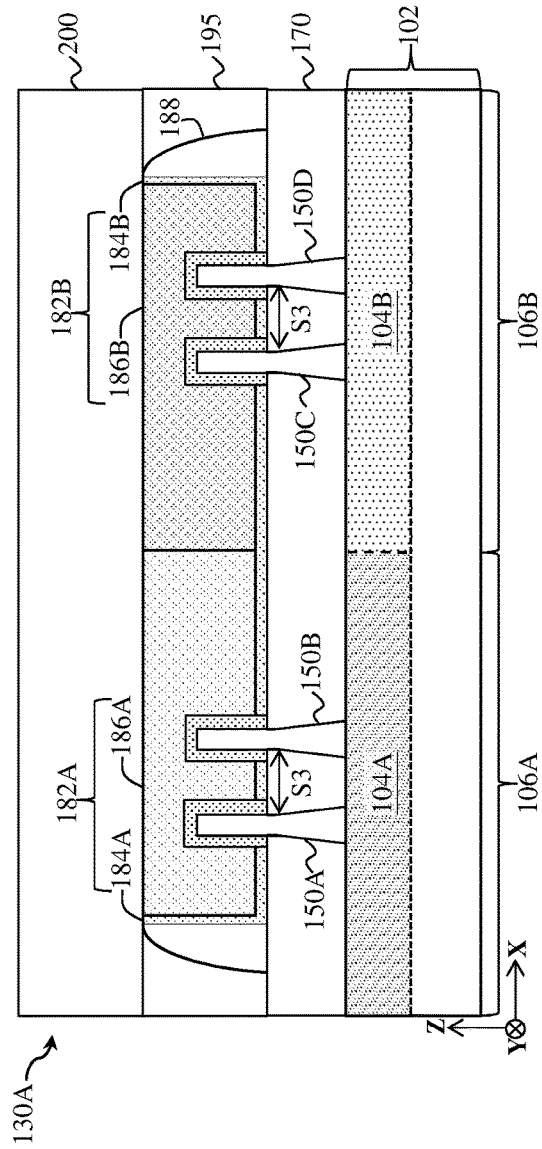
Figure 16C:
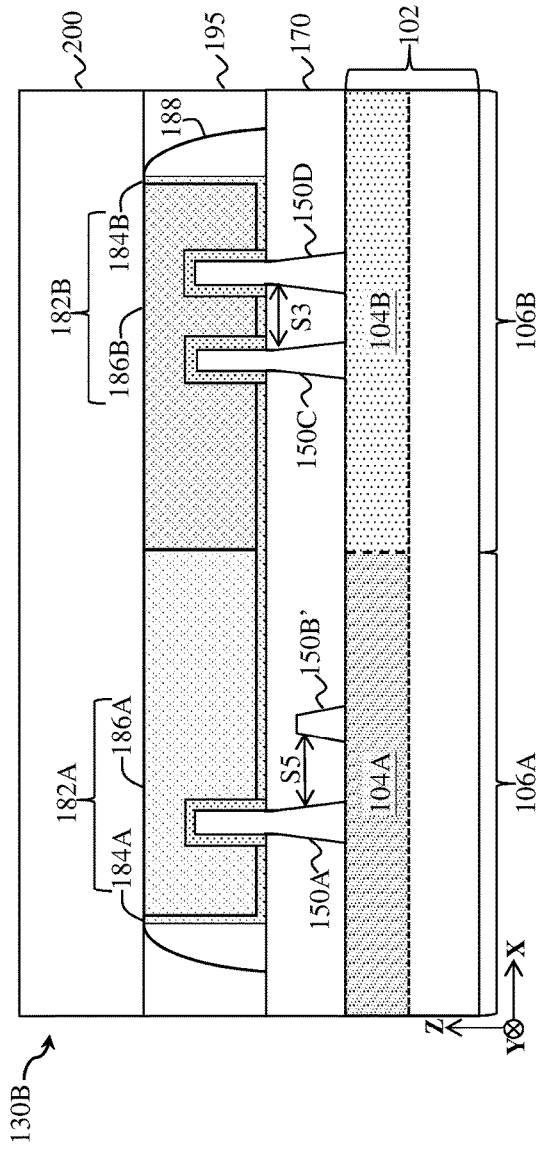

FIGS. 16A-16C are fragmentary diagrammatic views of an IC device 600, in portion or entirety, according to various aspects of the present disclosure. In particular, FIG. 16A is a simplified schematic top view of IC device 600; FIG. 16B is a diagrammatic cross-sectional view of IC device 600 along line B-B of FIG. 16A; FIG. 16C is a diagrammatic cross-sectional view of IC device 600 along line C-C of FIG. 16A; FIG. 16D is a diagrammatic cross-sectional view of IC device 600 along line D-D of FIG. 16A; FIG. 16E is a diagrammatic cross-sectional view of IC device 600 along line E-E of FIG. 16A; and FIG. 16F is a diagrammatic cross-sectional view of IC device 600 along line F-F of FIG. 16A. IC device 600 is similar in many respects to IC device 100. Accordingly, similar features in FIGS. 16A-16F and FIGS. 12A-12F are identified by the same reference numerals for clarity and simplicity. In FIGS. 16A-16F, IC device 600 has a different configuration of FinFETs than IC device 100. For example, in IC device 600, the second circuit of IC region 130B includes a CMOS FET that includes a two-fin n-type FinFET in n-type FinFET region 106B, instead of a single-fin n-type FinFET, and a single-fin p-type FinFET in p-type FinFET region 106A. The two-fin n-type includes gate structure 180C disposed over a channel region of fins 150C, 150D in IC region 130B, such that gate structure 180C is disposed between source/drain regions of fins 150C, 150D in IC region 130B. Epitaxial source/drain features 190B are disposed over the source/drain regions of fins 150C, 150D in IC region 130A. Device-level contacts 210F, 210G are also configured with different dimensions in IC device 600. For example, device-level contact 210F to the source node of the two-fin n-type FinFET in IC region 130B is configured similar as device-level contact 210J to the source node of the two-fin n-type FinFET in IC region 130A, and device-level contact 210G to the drain node of the two-fin n-type FinFET in IC region 130B is configured similar as device-level contact 210H to the drain node of the two-fin n-type FinFET in IC region 130A. For example, device-level contacts 210F, 210G span over and extend beyond fins 150C, 150D in IC region 130B. In some implementations, device-level contact 210G has a length that is substantially equal to length X1 of device-level contact 210H and a width that is substantially equal to width Y1 of device-level contact 210H. IC device 600 can be fabricated using the fabrication processes described herein with reference to FIG. 1, FIGS. 2A-2C, 3A-3C, 4A-4C, 5A-5C, 6A-6C, 7A-7C, 8A-8C, 9A-9C, 10A-10C, FIGS. 11A-11F, and FIGS. 12A-12F. During fabrication, a width of dummy pattern 124 would be substantially the same between fin 150C and 150D in IC regions 130A, 130B, such that spacing between fins 150C, 150D in IC regions 130A, 130B is the same in n-type FinFET region 106B. For example, in n-type FinFET region 106B, fin 150C and fin 150C have spacing S3 in IC region 130A and IC region 130B. FIGS. 16A-16C have been simplified for the sake of clarity to better understand the inventive concepts of the present disclosure. Additional features can be added in IC device 600, and some of the features described below can be replaced, modified, or eliminated in other embodiments of IC device 600.

Figure 17:
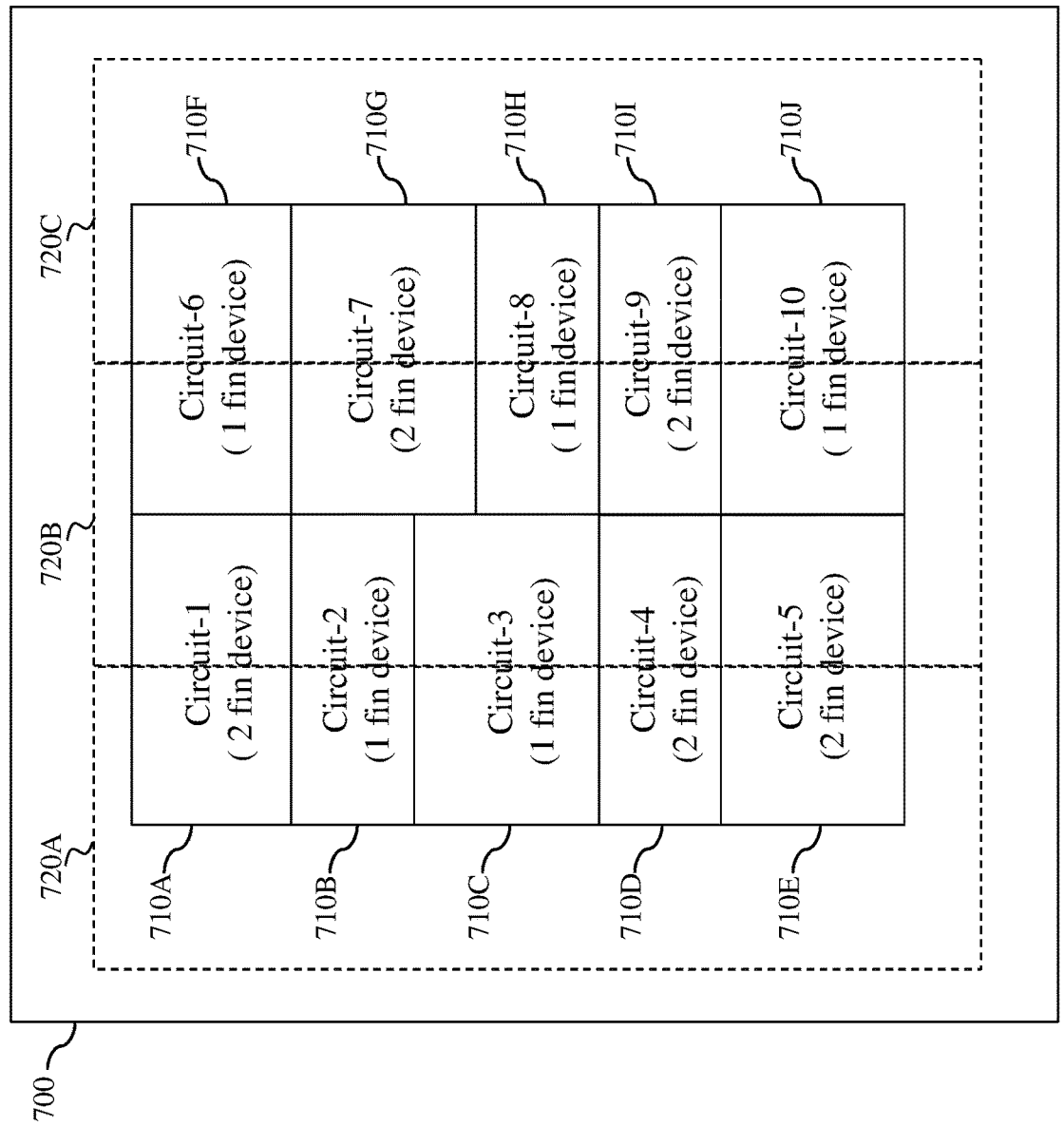
FIG. 17 is a simplified block diagram of an IC design layout, in portion or entirety, according to various aspects of the present disclosure.

FIG. 17 is a simplified block diagram of an IC design layout 700, in portion or entirety, according to various aspects of the present disclosure. IC design layout 700 includes an array of standard cells, such as a standard cell 710A, a standard cell 710B, a standard cell 710C, a standard cell 710D, a standard cell 710E, a standard cell 710F, a standard cell 710G, a standard cell 710H, a standard cell 710I, and a standard cell 710J. Each of standard cells 710A-710J includes transistors and interconnect (or routing) structures that combine to form a circuit that provides a logic function (for example, AND, NAND, OR, NOR, NOT, XOR, and/or XNOR) and/or a storage function (for example, flip flop, latch, and/or buffer). For example, standard cells 710A-710J respectively provide circuits 1-10. In the depicted embodiment, standard cells 710A, 710C, 710F, 710H, and 710J include single-fin FinFETs, and standard cells 710A, 710D, 710D, 710G, and 710I include two-fin FinFETs. The fin patterning methods described herein allow for standard cells configured with multi-fin FinFETs (implemented, for example, for high speed applications) to be arranged directly adjacent to and abutting standard cells configured for single-fin FinFETs (implemented, for example, for low power consumption). For example, standard cell 710H is disposed directly adjacent to and abutting standard cells 710G, 710I, which include two-fin FinFETs, and standard cell 710C, which includes single-fin FinFETs. Standard cells 710A-710J are arranged to overlap an n-type well region 720A, a p-type well region 720B, and/or an n-type well region 720C, such that p-type FinFET regions of standard cells 710A-710J (which include p-type FinFETs) are disposed over n-type well region 720A and/or n-type well region 720C and n-type FinFET regions of standard cells 710A-710J (which include n-type FinFETs) are disposed over p-type well region 720B. FIG. 17 has been simplified for the sake of clarity to better understand the inventive concepts of the present disclosure. Additional features can be added in IC design layout 700, and some of the features described below can be replaced, modified, or eliminated in other embodiments of IC design layout 700.

The present disclosure provides for many different embodiments. Fin patterning methods are disclosed herein for improving FinFET performance and improving FinFET fabrication. An exemplary method includes forming a dummy pattern over a substrate. The dummy pattern has a first width in a first region corresponding with a first FinFET and a second width in a second region corresponding with a second FinFET. The second width is greater than the first width. The method further includes forming spacers along sidewalls of the dummy pattern and removing the dummy pattern, thereby forming a spacer pattern having a first spacing between spacers in the first region and a second spacing between spacers in the second region. The second spacing is greater than the first spacing. The method further includes transferring the spacer pattern to the substrate, thereby forming a first fin and a second fin separated by the first spacing in the first region and separated by the second spacing in the second region. The method further includes partially removing the second fin from the second region to form a dummy fin tip. The first fin and the dummy fin tip are separated by a spacing that is greater than the first spacing, such as the second spacing. In some implementations, a ratio of the second spacing to the first spacing is about 1.05 to about 2.

In some implementations, the method further includes forming an isolation feature over the substrate, wherein the isolation feature is disposed between the first fin and the second fin and the third fin and the dummy feature. In some implementations, forming the isolation feature includes depositing a dielectric material over the substrate and etching back the dielectric material, such that a portion of the first fin, the second fin, and the third fin extend above a top surface of the isolation feature. In some implementations, the method further includes forming a first gate structure that traverses the first fin and the second fin and forming a second gate structure that traverses the third fin. In some implementations, the second gate structure extends over the dummy feature and an isolation feature is disposed between the second gate structure and the dummy feature.

In some implementations, forming the dummy pattern includes depositing a dummy layer over the substrate, performing a lithography process to expose a portion of the dummy layer, and etching the exposed portion the dummy layer. In some implementations, the dummy layer includes a dielectric material. In some implementations, the dummy layer includes oxygen, nitrogen, carbon, or combinations thereof. In some implementations, performing the lithography process includes forming a patterned masking layer over the dummy layer, wherein the patterned masking layer includes a masking line having a width that increases from the first region to the second region. In some implementations, forming the spacers includes depositing a spacer layer over the substrate and etching the spacer layer. In some implementations, forming the spacers further includes performing a lithography process to expose a portion of the spacer layer and etching the exposed portion of the spacer layer. In some implementations, the spacer layer includes a dielectric material. In some implementations, the spacer layer includes oxygen, nitrogen, carbon, or combinations thereof.

In some implementations, removing the dummy pattern includes selectively etching the dummy pattern without substantial etching of the spacers. In some implementations, transferring the spacer pattern to the underlying layer includes etching the underlying layer using the spacer pattern as an etching mask. In some implementations, the method further includes removing any remaining spacer pattern after the etching. In some implementations, partially removing the fourth fin from the second region includes forming a patterned masking layer that exposes the fourth fin while covering the first fin, the second fin, and the third fin and etching the exposed fourth fin.

Another exemplary method includes forming a first mandrel and a second mandrel over a substrate. The first mandrel and the second mandrel have a first spacing therebetween in a first region corresponding with a first FinFET device and a second spacing therebetween in a second region corresponding with a second FinFET device. The second spacing is greater than the first spacing. The method further includes patterning an underlying layer using the first mandrel and the second mandrel, thereby forming a first fin and a second fin. The first fin and the second fin have the first spacing therebetween in the first region and the second spacing therebetween in the second region. The method further includes partially removing the second fin from the second region. The method further includes forming an isolation structure that electrically isolates a portion of the first fin in the first region from a portion of the first fin in the second region. In some implementations, a ratio of the second spacing to the first spacing is about 1.05 to about 2.

An exemplary integrated circuit device includes a first FinFET that includes a first fin structure having a first fin and a second fin separated by a first spacing and a second FinFET that includes a second fin structure having a third fin and a dummy structure separated by a second spacing. The second spacing is greater than the first spacing. An isolation structure is disposed between the first FinFET and the second FinFET, such that the isolation structure isolates the first fin structure from the second fin structure. In some implementations, a ratio of the first spacing to the second spacing is about 1.05 to about 2. In some implementations, a height of the dummy structure is less than a height of the third fin. In some implementations, the height of the dummy structure is at least 70 nm less than the height of the third fin. In some implementations, the height of the dummy structure is less than or equal to about 30 nm. In some implementations, a length of the dummy structure is about the same as a length of the third fin. In some implementations, the isolation structure is a dummy gate structure that physically separates the first fin from the third fin. In some implementations, the isolation structure is a gate structure that electrically separates source/drain features of the first fin from source/drain features of the third fin.

In some implementations, the first FinFET includes a first gate structure that traverses the first fin structure, such that the first gate structure is disposed between first source/drain features of the first fin and the second fin, and the second FinFET includes a second gate structure that traverses the second fin structure, such that the second gate structure is disposed between second source/drain features of the third fin and disposed over the dummy structure. In some implementations, the first fin, the second fin, the third fin, and the dummy structure extend along a first direction, and the first gate structure and the second gate structure extend along a second direction that is substantially perpendicular to the first direction.

In some implementations, the first fin, the second fin, the third fin, and the dummy structure extend along a first direction. In such implementation, the integrated circuit device can further include a first contact to source/drain features of the first fin and the second fin and a second contact to source/drain features of the third fin. The first contact has a first dimension along the first direction and a second dimension along a second direction, wherein the second direction is substantially parallel to the first direction. The second contact has a third dimension along the first direction and a fourth dimension along the second direction. The second dimension is greater than the fourth dimension. In some implementations, a ratio of the second dimension to the fourth dimension is about 1.1 to about 1.6. In some implementations, the first dimension is substantially the same as the third dimension. In some implementations, the first contact overlaps the first fin and the second fin. In some implementations, the second contact does not overlap the dummy structure.

Another exemplary method includes generating a dummy pattern layout for use in fabricating a first FinFET device and a second FinFET device. The dummy pattern includes a dummy line that spans a first region corresponding with the first FinFET device and a second region corresponding with the second FinFET device. The dummy line has a width that is substantially equal to a desired pitch between fins of the first FinFET device. The method further includes inserting a jog pattern into the dummy pattern layout, thereby modifying the dummy pattern layout. The jog pattern includes a jog line disposed adjacent to the dummy line in the second region, such that a sum of the width of the dummy line and a width of the jog line is greater than the width of the dummy line. The method further includes fabricating a mask using the modified dummy pattern layout. In some implementations, the method further includes generating a cut pattern layout for use in fabricating the first FinFET device and the second FinFET device. The cut pattern layout is generated based on the modified dummy pattern layout. The cut pattern layout includes a cut pattern having an opening that overlaps the jog line. In such implementations, the method further includes fabricating a cut mask using the cut pattern layout. In some implementations, the first region corresponds with an area of an IC device that includes FinFET devices having an even number of fins, and the second region corresponds with an area of the IC device that includes FinFET devices having an odd number of fins. In some implementations, the second region corresponds with a fin removal area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy pattern over a substrate, wherein the dummy pattern has a first width in a first region corresponding with a first FinFET and a second width in a second region corresponding with a second FinFET, the second width being greater than the first width;
   forming spacers along sidewalls of the dummy pattern;
   removing the dummy pattern, thereby forming a spacer pattern having a first spacing between spacers in the first region and a second spacing between spacers in the second region, wherein the second spacing is greater than the first spacing;
   transferring the spacer pattern to the substrate, thereby forming a first fin and a second fin separated by the first spacing in the first region and separated by the second spacing in the second region; and
   partially removing the second fin from the second region to form a dummy fin tip.

2. The method of claim 1, wherein a ratio of the second spacing to the first spacing is about 1.05 to about 2.

3. The method of claim 1, further comprising forming an isolation feature over the substrate, wherein the isolation feature is disposed between the first fin and the second fin in the first region and the first fin and the dummy fin tip in the second region.

4. The method of claim 1, further comprising forming a first gate structure and a second gate structure, wherein the first gate structure traverses the first fin and the second fin in the first region and the second gate structure traverses the first fin in the second region.

5. The method of claim 1, wherein the forming the dummy pattern includes:
   depositing a dummy layer over the substrate;
   performing a lithography process to expose a portion of the dummy layer; and
   etching the exposed portion the dummy layer.

6. The method of claim 5, wherein the performing the lithography process includes using a mask having a mask feature, wherein the mask feature has the first width in a first mask region corresponding with the first region and the second width in a second mask region corresponding with the second region, and further wherein the second width in the second mask region is achieved by inserting a jog pattern into a mask layout used for fabricating the mask.

7. The method of claim 1, wherein:
   the removing the dummy pattern includes selectively etching the dummy pattern without substantial etching of the spacers; and
   the transferring the spacer pattern to the substrate includes selectively etching the substrate without substantial etching of the spacers.

8. The method of claim 1, wherein the partially removing the second fin from the second region includes:
   covering the first fin while partially exposing the second fin, such that a portion of the second fin in the second region is exposed and a portion of the second fin in the first region is covered; and
   etching the exposed portion of the second fin in the second region.

9. A method comprising:
forming a first spacer and a second spacer over a substrate, wherein the first spacer and the second spacer are each disposed over the substrate in a first region corresponding with a first FinFET and in a second region corresponding with a second FinFET, wherein the first spacer and the second spacer each extend without interruption from the first region corresponding with the first FinFET to the second region corresponding with the second FinFET, wherein the first spacer and the second spacer have a first spacing therebetween in the first region corresponding with the first FinFET and a second spacing therebetween in the second region corresponding with the second FinFET, and wherein the second spacing is greater than the first spacing;
patterning the substrate using the first spacer and the second spacer, thereby forming a first fin and a second fin, wherein the first fin and the second fin have the first spacing therebetween in the first region and the second spacing therebetween in the second region; and
partially removing the second fin from the second region.

10. The method of claim 9, wherein a ratio of the second spacing to the first spacing is about 1.05 to about 2.

11. The method of claim 9, wherein the forming the first spacer and the second spacer over the substrate includes:
forming a mandrel over the substrate, wherein the mandrel has a first width in the first region and a second width in the second region;
depositing a spacer layer over the substrate and the mandrel;
etching the spacer layer to form the first spacer and the second spacer disposed along sidewalls of the mandrel; and
removing the mandrel.

12. The method of claim 11, wherein the mandrel includes a first material and the spacer layer includes a second material, wherein the first material and the second material have different etch sensitivities.

13. The method of claim 9, wherein the partially removing the second fin from the second region includes etching the second fin in the second region to form a dummy fin tip having a height less than or equal to about 30 nm.

14. The method of claim 9, further comprising forming a first gate structure and a second gate structure, wherein the first gate structure traverses the first fin and the second fin in the first region and the second gate structure traverses the first fin in the second region.

15. The method of claim 14, further comprising forming a third gate structure between the first gate structure and the second gate structure, wherein the third gate structure extends over the first fin and the second fin.

16. The method of claim 9, wherein the first FinFET includes an even number of fins and the second FinFET includes an odd number of fins.

17. A method comprising:
forming a patterning layer including a first material over a substrate;
forming a dummy pattern over the patterning layer, wherein the dummy pattern includes a second material that is different than the first material, the dummy pattern has a first width in a first FinFET region and a second width in a second FinFET region, and the second width is greater than the first width;
performing a deposition process and a first etching process to form a first spacer along a first sidewall of the dummy pattern and a second spacer along a second sidewall of the dummy pattern, wherein the first spacer and the second spacer each include a third material that is different than the first material and the second material;
performing a second etching process to remove the dummy pattern to define a first spacing between the first spacer and the second spacer in the first FinFET region and a second spacing between the first spacer and the second spacer in the second FinFET region, wherein the second spacing is greater than the first spacing;
performing a third etching process on the substrate using the first spacer and the second spacer as an etch mask, thereby forming a first fin and a second fin extending from the substrate, wherein the first fin and the second fin are separated by the first spacing in the first FinFET region and separated by the second spacing in the second FinFET region; and
performing a fourth etching process on the second fin in the second FinFET region, thereby leaving a residual second fin in the second FinFET region.

18. The method of claim 17, further comprising:
forming a first gate structure over the first fin and the second fin in the first FinFET region, wherein the first gate structure spans the first spacing; and
forming a second gate structure over the first fin and the residual second fin in the second FinFET region, wherein the second gate structure spans the second spacing.

19. The method of claim 17, further comprising forming an isolation feature over the substrate, wherein the first fin extends from the isolation feature in the first FinFET region, the second fin extends from the isolation feature in the first FinFET region, the first fin extends from the isolation feature in the second FinFET region, and the residual second fin does not extend from the isolation feature in the second FinFET region.

20. The method of claim 17, wherein a ratio of the second spacing to the first spacing is about 1.05 to about 2.

* * * * *